United States Patent
Newdoll et al.

(10) Patent No.: US 9,200,818 B2
(45) Date of Patent: Dec. 1, 2015

(54) ENHANCED SOLAR PANELS, LIQUID DELIVERY SYSTEMS AND ASSOCIATED PROCESSES FOR SOLAR ENERGY SYSTEMS

(75) Inventors: Ronald M. Newdoll, Woodside, CA (US); Argil E. Shaver, II, Menlo Park, CA (US)

(73) Assignee: Newdoll Enterprises LLC, Menlo Park, CA (US)

( * ) Notice: Subject to any disclaimer, the term of this patent is extended or adjusted under 35 U.S.C. 154(b) by 16 days.

(21) Appl. No.: 13/389,951

(22) PCT Filed: Aug. 12, 2010

(86) PCT No.: PCT/US2010/045352
§ 371 (c)(1),
(2), (4) Date: Feb. 10, 2012

(87) PCT Pub. No.: WO2011/019936
PCT Pub. Date: Feb. 17, 2011

(65) Prior Publication Data
US 2012/0138123 A1    Jun. 7, 2012

Related U.S. Application Data

(63) Continuation-in-part of application No. 12/842,864, filed on Jul. 23, 2010, now Pat. No. 8,035,249.

(60) Provisional application No. 61/234,181, filed on Aug. 14, 2009.

(51) Int. Cl.
*B08B 7/04* (2006.01)
*F24J 2/46* (2006.01)
(Continued)

(52) U.S. Cl.
CPC ........... *F24J 2/461* (2013.01); *H01L 31/02021* (2013.01); *H02S 40/10* (2014.12);
(Continued)

(58) Field of Classification Search
CPC ............ B08B 3/00; B08B 3/02; B08B 3/024; B08B 3/04; B08B 7/0064; B08B 7/0092; B08B 1/00; H01L 31/052; H01L 31/042; F03B 15/00; H02S 40/10
USPC .......................................... 134/18, 34, 36, 42
See application file for complete search history.

(56) References Cited

U.S. PATENT DOCUMENTS 3,958,171 A    5/1976 Sekino
4,488,791 A    12/1984 Hinchliffe
(Continued)

FOREIGN PATENT DOCUMENTS

AU    2010101396    2/2011
CN    201141544    10/2008
(Continued)

OTHER PUBLICATIONS

"Long Island Power Authority Requirements for Interconnection of New Distributed Generation Units with Capacity of 300kVA", Radial Distribution Lines, (Date Unknown-before Jun. 19, 2006), pp. 1-12.
(Continued)

*Primary Examiner* — Bibi Carrillo
(74) *Attorney, Agent, or Firm* — Michael A. Glenn; Glenn Patent Group

(57) ABSTRACT

Fluid delivery systems and related structures and processes are provided, such as for use with water, treated water, and/or a cleaning solution, for any of cleaning, cooling or any combination thereof, for one or more solar panels in a power generation environment. Enhanced coatings are provided for the incident surface of solar panels, such as to avoid build up of dirt, scale, or other contaminants, and/or to improve cleaning performance. Reclamation, filtration, and reuse structures are preferably provided for the delivered fluid, and seal structures may preferably be implemented between adjoining panels, to minimize loss of the delivered water or cleaning solution. The fluid delivery system may preferably be linked to an automated control system, such as but not limited to integrated DMPPT modules and related systems.

5 Claims, 37 Drawing Sheets

(51) Int. Cl.

| | | |
|---|---|---|
| *H01L 31/02* | (2006.01) | |
| *G01R 31/40* | (2014.01) | |
| *H02S 40/10* | (2014.01) | |
| *B08B 3/00* | (2006.01) | |
| *H01L 31/042* | (2014.01) | |
| *B08B 7/00* | (2006.01) | |
| *B08B 3/04* | (2006.01) | |
| *H01L 31/052* | (2014.01) | |
| *B08B 3/02* | (2006.01) | |
| *F03B 15/00* | (2006.01) | |
| *B08B 1/00* | (2006.01) | |

(52) U.S. Cl.
CPC ............ *H02S 50/00* (2013.01); *B08B 1/003* (2013.01); *B08B 3/00* (2013.01); *B08B 3/02* (2013.01); *B08B 3/024* (2013.01); *B08B 3/04* (2013.01); *B08B 7/0064* (2013.01); *B08B 7/0092* (2013.01); *F03B 15/00* (2013.01); *H01L 31/042* (2013.01); *H01L 31/052* (2013.01); *Y02E 10/40* (2013.01); *Y02E 10/50* (2013.01)

(56) References Cited

U.S. PATENT DOCUMENTS

| | | | |
|---|---|---|---|
| 4,599,685 A | 7/1986 | Hader et al. | |
| 5,706,798 A | 1/1998 | Steinorth | |
| 5,742,495 A | 4/1998 | Barone | |
| 5,982,253 A | 11/1999 | Perrin et al. | |
| 6,153,823 A | 11/2000 | Shiozake | |
| 6,201,180 B1 | 3/2001 | Meyer et al. | |
| 6,285,572 B1 | 9/2001 | Onizuka et al. | |
| 6,291,762 B1 | 9/2001 | Jan et al. | |
| 6,750,391 B2 | 6/2004 | Bower et al. | |
| 6,810,339 B2 | 10/2004 | Wills | |
| 7,104,064 B2 | 9/2006 | Hon | |
| 7,443,052 B2 | 10/2008 | Wendt et al. | |
| 7,444,816 B2 | 11/2008 | Hon | |
| 7,731,383 B2 | 6/2010 | Myer | |
| 7,772,716 B2 | 8/2010 | Shaver | |
| 7,866,927 B1 | 1/2011 | Wong | |
| 7,994,657 B2 | 8/2011 | Kimball et al. | |
| 8,035,249 B2 | 10/2011 | Shaver et al. | |
| 2002/0066473 A1 | 6/2002 | Levy et al. | |
| 2002/0074034 A1* | 6/2002 | Fujisaki et al. | 136/246 |
| 2003/0111103 A1 | 6/2003 | Bower et al. | |
| 2003/0177706 A1 | 9/2003 | Ullman | |
| 2004/0207366 A1 | 10/2004 | Sung | |
| 2004/0261334 A1 | 12/2004 | Liebendorfer et al. | |
| 2005/0076563 A1 | 4/2005 | Faris | |
| 2006/0185727 A1 | 8/2006 | Matan | |
| 2006/0266408 A1 | 11/2006 | Horne et al. | |
| 2007/0089778 A1 | 4/2007 | Horne et al. | |
| 2007/0090653 A1 | 4/2007 | Martelon | |
| 2007/0113881 A1* | 5/2007 | Mellott et al. | 136/243 |
| 2007/0221267 A1 | 9/2007 | Fornage | |
| 2007/0271006 A1 | 11/2007 | Golden et al. | |
| 2008/0149786 A1 | 6/2008 | Bradley | |
| 2008/0149791 A1 | 6/2008 | Bradley | |
| 2008/0150484 A1 | 6/2008 | Kimball et al. | |
| 2008/0169652 A1 | 7/2008 | Green | |
| 2008/0238195 A1 | 10/2008 | Shaver, II et al. | |
| 2009/0030605 A1 | 1/2009 | Breed | |
| 2009/0040750 A1 | 2/2009 | Myer | |
| 2009/0078299 A1 | 3/2009 | Cinnamon et al. | |
| 2009/0090895 A1 | 4/2009 | Hogan, Jr. | |
| 2009/0146501 A1 | 6/2009 | Cyrus | |
| 2009/0150005 A1 | 6/2009 | Hadar et al. | |
| 2009/0194669 A1 | 8/2009 | Noble et al. | |
| 2009/0199846 A1 | 8/2009 | Collins et al. | |
| 2009/0266353 A1* | 10/2009 | Lee | 126/593 |
| 2009/0283129 A1 | 11/2009 | Foss | |
| 2010/0043851 A1* | 2/2010 | Levy et al. | 134/56 R |
| 2010/0205870 A1 | 8/2010 | Cobb | |
| 2010/0237305 A1 | 9/2010 | Miller | |
| 2010/0270808 A1 | 10/2010 | Bates et al. | |
| 2010/0284737 A1 | 11/2010 | McPheeters | |
| 2010/0296285 A1 | 11/2010 | Chemel et al. | |
| 2010/0328931 A1 | 12/2010 | Fogerlie | |
| 2010/0328932 A1 | 12/2010 | Fogerlie | |
| 2011/0005583 A1 | 1/2011 | Thomas | |
| 2011/0017256 A1 | 1/2011 | Stevens | |
| 2011/0041834 A1 | 2/2011 | Liao | |
| 2011/0058664 A1 | 3/2011 | Prax et al. | |
| 2011/0073161 A1 | 3/2011 | Scanlon | |
| 2011/0085322 A1 | 4/2011 | Myer | |
| 2011/0120523 A1 | 5/2011 | Silver | |
| 2011/0163222 A1 | 7/2011 | Moser | |
| 2011/0192460 A1 | 8/2011 | Tan | |
| 2011/0265840 A1* | 11/2011 | Sela | 136/244 |
| 2012/0187222 A1* | 7/2012 | Galili | 239/751 |

FOREIGN PATENT DOCUMENTS

| | | | |
|---|---|---|---|
| CN | 202362621 | * | 8/2012 |
| DE | 103 20 347 | | 12/2004 |
| EP | 033706 | | 9/1989 |
| JP | S59 79579 | | 5/1984 |
| JP | 59150484 | * | 8/1984 |
| JP | S62 13084 | | 1/1987 |
| JP | 9182459 | | 7/1997 |
| JP | H10 308523 | | 11/1998 |
| JP | 3405035 | | 5/2003 |
| JP | 2003-197945 | | 7/2003 |
| JP | 2003-199377 | | 7/2003 |
| KR | 2009010561 | | 1/2009 |
| WO | WO-2005076444 | | 8/2005 |
| WO | WO-2006022590 | | 3/2006 |
| WO | WO-2006/078685 | | 7/2006 |
| WO | WO-2006071436 | | 7/2006 |
| WO | WO-2006130520 | | 12/2006 |
| WO | WO-2007/106519 | | 9/2007 |
| WO | WO-2008045335 | | 4/2008 |
| WO | WO-2008080088 | | 7/2008 |
| WO | WO-2008088311 | | 7/2008 |
| WO | WO-2008/125915 | | 10/2008 |
| WO | WO 2008/129089 | | 10/2008 |
| WO | WO-2008/144540 | | 11/2008 |
| WO | WO-2009038810 | | 3/2009 |
| WO | WO2009/044982 | * | 4/2009 |
| WO | WO-2009114730 | | 9/2009 |
| WO | WO-2010008927 | | 1/2010 |
| WO | WO-2010050993 | | 5/2010 |
| WO | WO-2010068706 | | 6/2010 |
| WO | WO-2010102256 | | 9/2010 |
| WO | WO-2010118236 | | 10/2010 |
| WO | WO-2010118503 | | 10/2010 |
| WO | WO-2010123538 | | 10/2010 |
| WO | WO-2011044641 | | 4/2011 |

OTHER PUBLICATIONS

"Solar Tracking System", Solazone, solar tracker, retrieved online on Aug. 19, 2011 from url: http://www.solazone.com.au/tracker.htm, 7 pages.
"Welcome to the next phase of solar", enphase ENERGY Brochure System Overview; retrieved Sep. 13, 2012 online from url: http://enphase.com/products/microinverters ; copyright 2012, 3 pages.
Clark, et al., "Plug-n-Play, Reliable Power Systems for Nanosatellites", 20th Annual AIAAIUSU Conference on Small Satellites retrieved on May 21, 2008 from website http://ssdl.stanford.edu/ssdl/images/storiesIAA236/A06Fall/ARFC/ssc06-vi-2.pdf, Retrieved on May 21, 2008 from website: http://ssdl.stanford.edu/ssdl/images/storiesIAA236/A06Fall/ARFC/ssc06-vi-2.pdf, Aug. 2006, pp. 1-6.
Santos, J.L. et al, "Maximum Power Point Tracker for PV Systems", RIO 3—World Climate & Energy Event, Rio de Janiero, Brazil, Dec. 2003, pp. 75-80.
Ton, D. et al., "Summary Report of the DOE High-Tech Inverter Workshop", Jan. 2005, 124 pages.
Walker, G.R et al., "PV String Per-Module Maximum Power Point Enabling Converters;", Proceedings of the Australasian Universities

(56) References Cited

OTHER PUBLICATIONS

Power Engineering Conference, Christchurch, New Zealand, Oct. 2003, Total of 6 pages.

Xantrex Technology, Inc., , "PV Series Grid Tie Solar Inverters—Three Phase—North America", Accessed at: xantrex.comlweb/id/11/p/1/ptl23/product.asp, Feb. 3, 2010, 1 page.

* cited by examiner

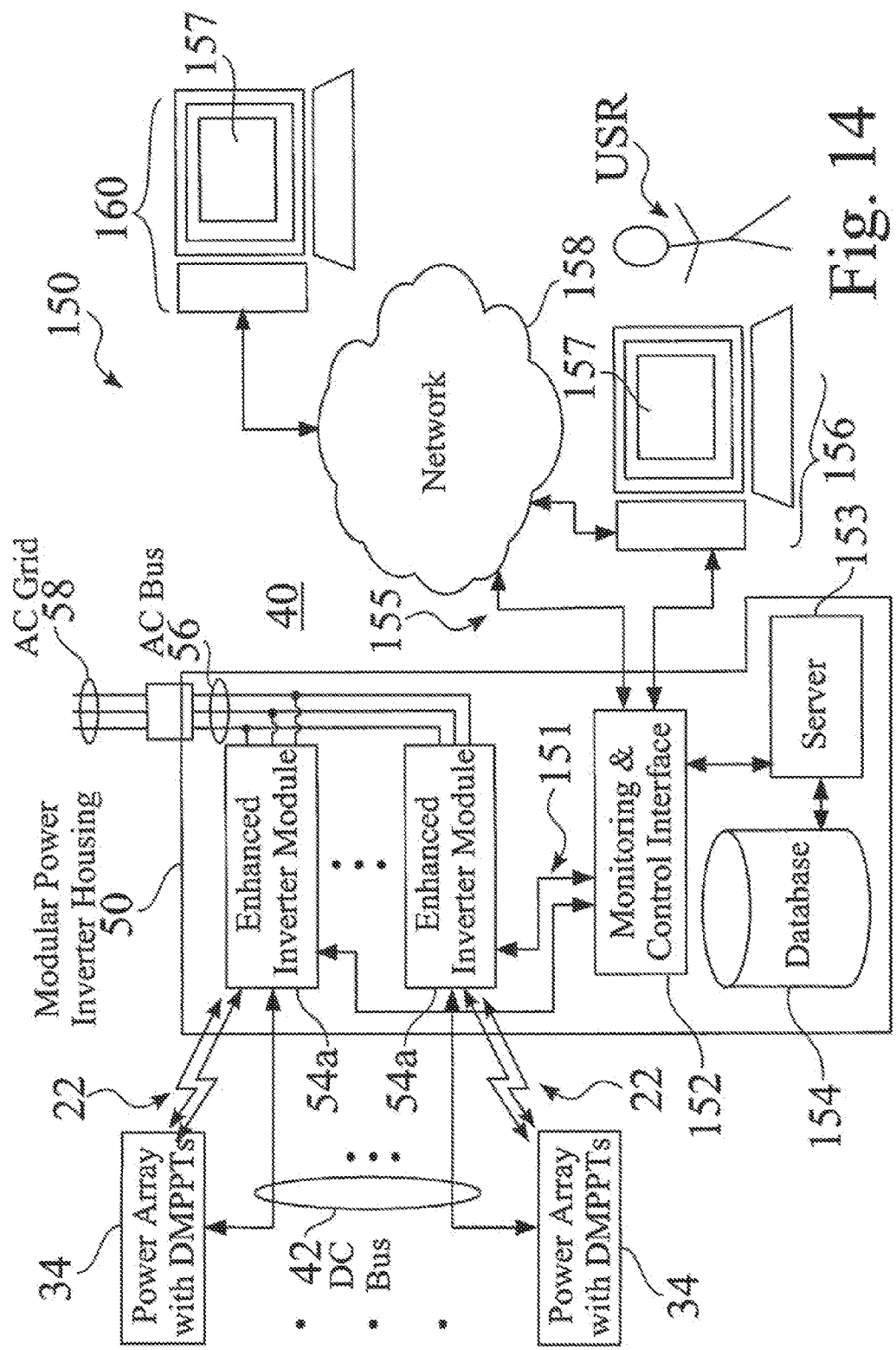

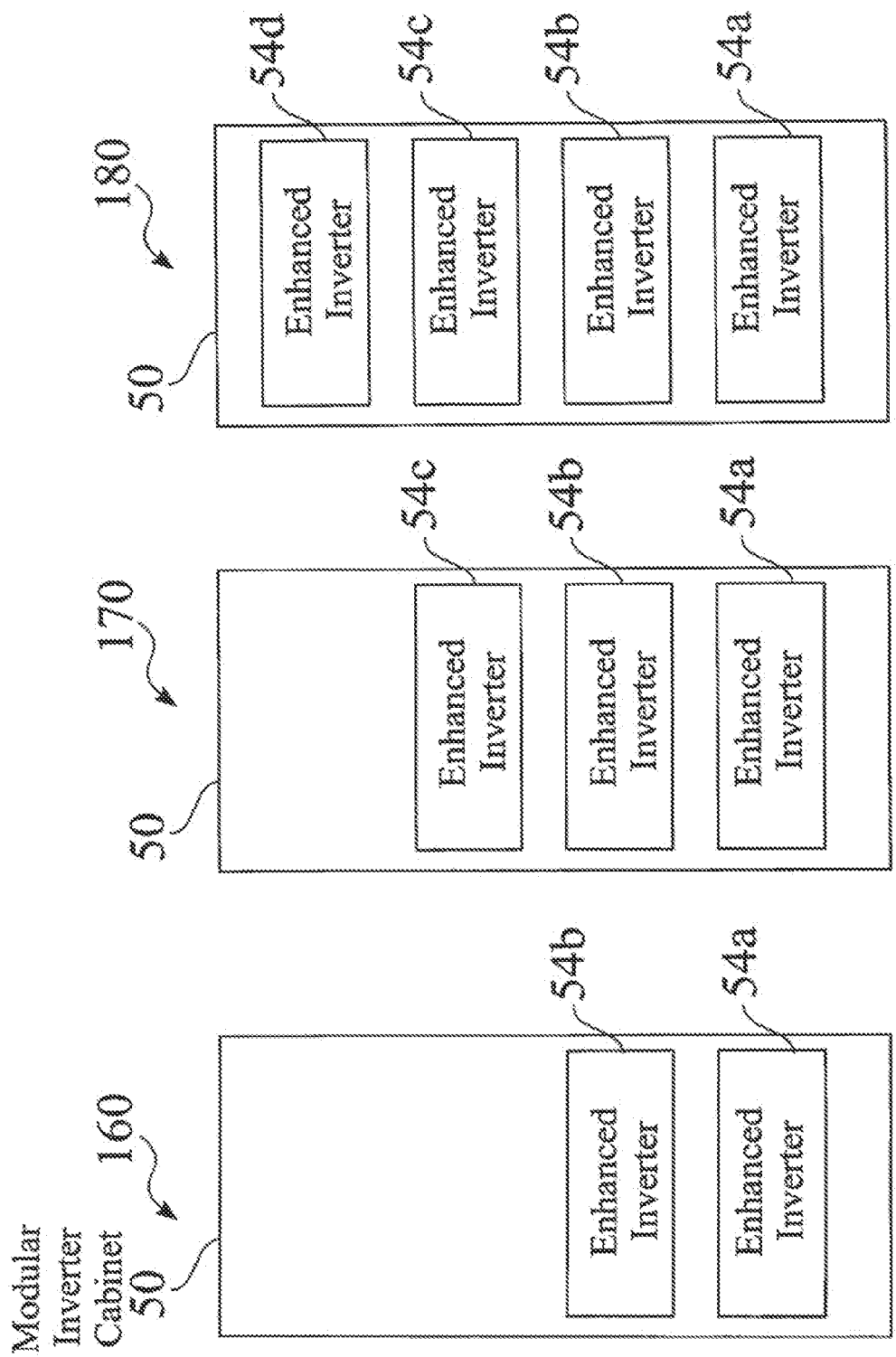

ENHANCED SOLAR PANELS, LIQUID DELIVERY SYSTEMS AND ASSOCIATED PROCESSES FOR SOLAR ENERGY SYSTEMS

CROSS-REFERENCE TO RELATED APPLICATIONS

This application is a U.S. national entry to PCT Patent Application No. PCT/US2010/45352 filed 12 Aug. 2010, and claims priority to U.S. Provisional Application No. 61/234,181, filed 14 Aug. 2009, and is a continuation-in part of U.S. patent application Ser. No. 12/842,864 filed 23 Jul. 2010, all of which are incorporated herein in their entirety by this reference thereto.

FIELD OF THE INVENTION

The present invention relates generally to the field of power inverter systems. More particularly, the present invention relates to distributed power system structures, operation and control, and enhanced inverter systems, structures, and processes.

BACKGROUND OF THE INVENTION

Solar power is a clean renewable energy resource, and is becoming increasingly important for the future of this planet. Energy from the Sun is converted to electrical energy via the photoelectric effect using many photovoltaic cells in a photovoltaic (PV) panel. Power from a PV panel is direct current (DC), while modern utility grids require alternating current (AC) power. The DC power from the PV panel must be converted to AC power, of a suitable quality, and injected into the grid. A solar inverter accomplishes this task.

It would be advantageous to provide a structure, system and process to improve the efficiency of power inverters, such as for a solar panel system. Such a development would provide a significant technical advance.

To maximize the amount of power harvested, most solar inverters perform a maximum power point tracking (MPPT) algorithm. These algorithms treat an entire array of PV panels as a single entity, averaging all of the PV panels together, with a preference towards the weakest link.

It would therefore also be advantageous to provide a structure, system and process, to maximize efficiency and harvest capabilities of any solar PV system, to capitalize on profit and maximum return for the owner of the system.

Three specific examples of DC energy sources that currently have a role in distributed generation and sustainable energy systems are photovoltaic (PV) panels, fuel cell stacks, and batteries of various chemistries. These DC energy sources are all series and parallel connections of basic "cells". These cells all operate at a low DC voltage, ranging from less than a volt (for a PV cell) to three or four volts (for a Li-Ion cell). These low voltages do not interface well to existing higher power systems, so the cells are series connected, to create modules with higher terminal voltages. Paralleled modules then supply increased power levels to an inverter, for conversion to AC power.

These long strings of cells bring with them many complications. While the current exemplary discussion is focused on PV Panels, other power systems and devices are often similarly implemented for other sources of DC power.

A problem occurs when even a single cell in a PV array is shaded or obscured. The photocurrent generated in a shaded cell may drop to around 23.2% of the other cells. The shaded cell is reverse biased by the remaining cells in the string, while current continues to flow through the shaded cell, causing large localized power dissipation. This power is converted to heat, which in turn lowers the panel's output power capability. Bypass diodes, generally placed in parallel around each 24 cells (which may vary between manufacturers), limit the reverse bias voltage and hence the power dissipation in the shaded cell, to that generated by the surrounding half panel. However, all the power from that sub-string is lost, while current flows in the bypass diode. As well, the bypass diode wastes power from the entire string current, which flows through the panel. The output voltage of the entire string is also negatively affected, causing an even larger imbalance in the system.

Conventional module MPP currents may become unbalanced for other reasons. PV panels in a string are never identical. Because each PV panel in a series string is constrained to conduct the same current as the other PV panels in the string, the least efficient module sets the maximum string current, thereby reducing the overall efficiency of the array to the efficiency of this PV panel. For similar reasons, PV panels in a string are conventionally required to be mounted in the same orientation, and to be of identical size. This is not always possible or desirable, such as for aesthetic or other architectural reasons.

In standard solar array wiring, several series strings of solar panels are wired in parallel to each other to increase power. If there is an imbalance between these paralleled strings, current flows from the higher potential strings to the lower potential strings, instead of flowing to the inverter. Just as it is important to match the cells within a panel, it is also necessary to match the panels in a string, and then to match the strings, for maximum harvest from the solar array. If small fluctuations in environmental conditions occur, it can have a large impact on the system as a whole.

Solar inverters also "average" the entire array when they perform a conventional MPPT function. However, it is not a true average, since there is a preference that leans towards the weakest link in the system. This means that, even though some panels may be capable of supplying 100 percent of their rated power, the system will only harvest a fraction of that power, due to the averaging effect of the algorithm, and the current following through the weaker string, panel, and/or cells.

It would therefore be advantageous to provide a means for applying an algorithm that maximizes the harvest of power from a string, panel, and/or cells. Such an improvement would provide a significant advance to the efficiency and cost effectiveness of power cells structures, processes, and systems.

While solar panels often provide a cost effective and sustainable source of electricity, solar panels need frequent cleaning, up to four times a year, depending on their location and environment. Dirt and dust build-up on the panels prevents sunlight from reaching the silicon, reducing electrical output by up to twenty five percent.

For one prior installation, after a six-month period with no cleaning, a 25 percent increase in electrical output was achieved after washing for one group of solar panels, as compared to a similar neighboring group of panels without cleaning.

While thorough cleaning can increase the output of many solar panel installations, many prior methods and systems do not yield adequate results, or require costly and/or labor intensive operations. High-pressure wash systems often prove to be very ineffective and leave much of the panel dirty, as well as requiring lots of water. Low-pressure water systems, with soft bristle brushes, require thorough manual scrubbing. While a low-pressure system may be very effective, they are typically labor intensive.

SUMMARY OF THE INVENTION

Fluid delivery systems and related structures and processes are provided, such as for use with water, treated water, and/or a cleaning solution, for any of cleaning, cooling or any combination thereof, for one or more solar panels in a power generation environment. Enhanced coatings are provided for the incident surface of solar panels, such as to avoid build up of dirt, scale, or other contaminants, and/or to improve cleaning performance. Reclamation, filtration, and reuse structures are preferably provided for the delivered fluid, and seal structures may preferably be implemented between adjoining panels, to minimize loss of the delivered water or cleaning solution. The fluid delivery system may preferably be linked to an automated control system, such as but not limited to integrated DMPPT modules and related systems.

BRIEF DESCRIPTION OF THE DRAWINGS

FIG. 14 is a block diagram of a modular power module housing having one or more enhanced inverter modules, a central interface, and connectable to one or more local or remote monitoring or control devices;

FIG. 15 is a block diagram of a modular power module housing having two sub-modules installed;

FIG. 16 is a block diagram of a modular power module housing having three sub-modules installed;

FIG. 17 is a block diagram of a modular power module housing having a four sub-module installed;

DETAILED DESCRIPTION OF PREFERRED EMBODIMENTS

Figure 1:
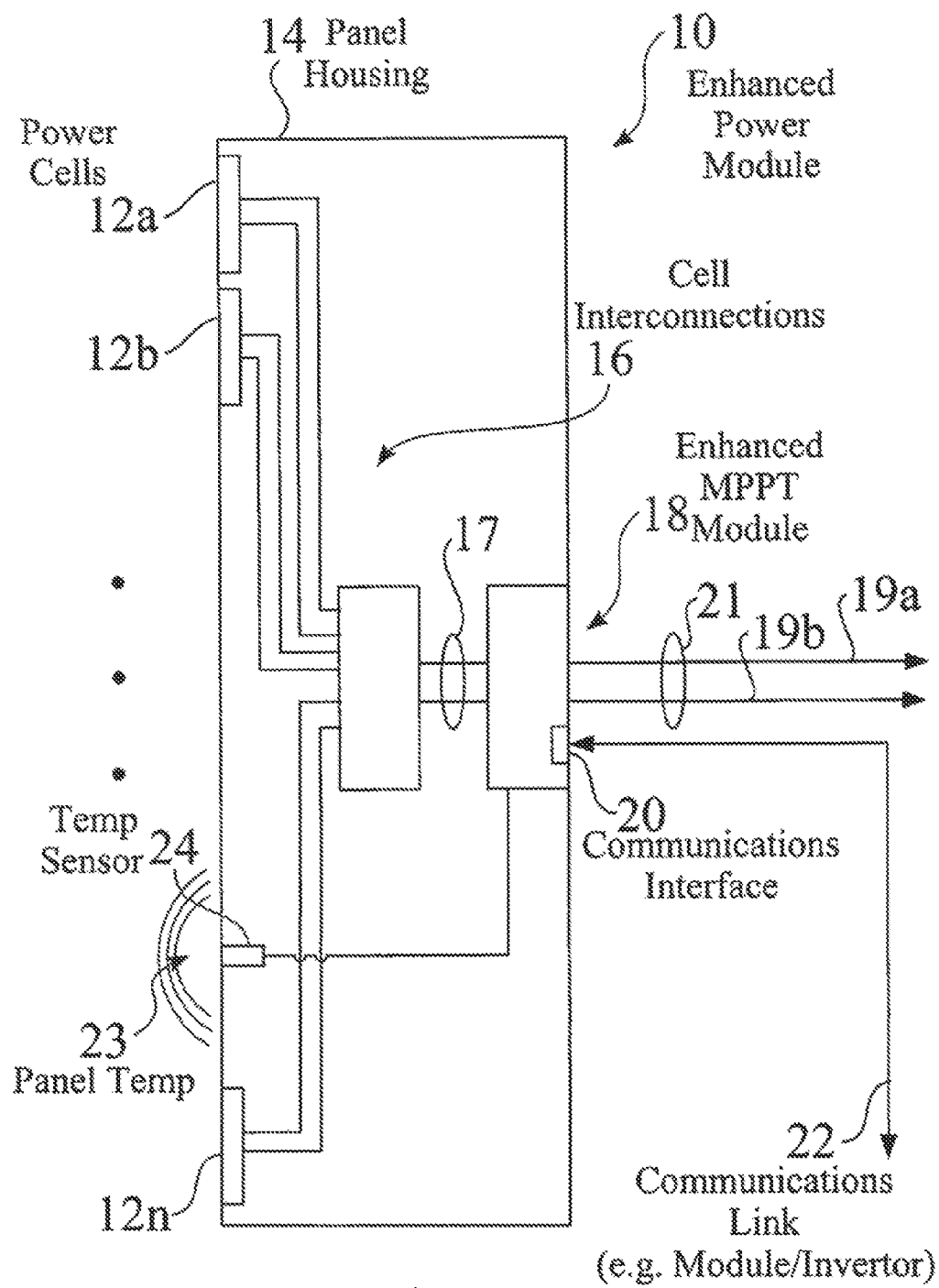
FIG. 1 is a schematic view of an exemplary enhanced power module comprising a plurality of power cells connected to a distributed maximum power point tracking module.
Figure 2:
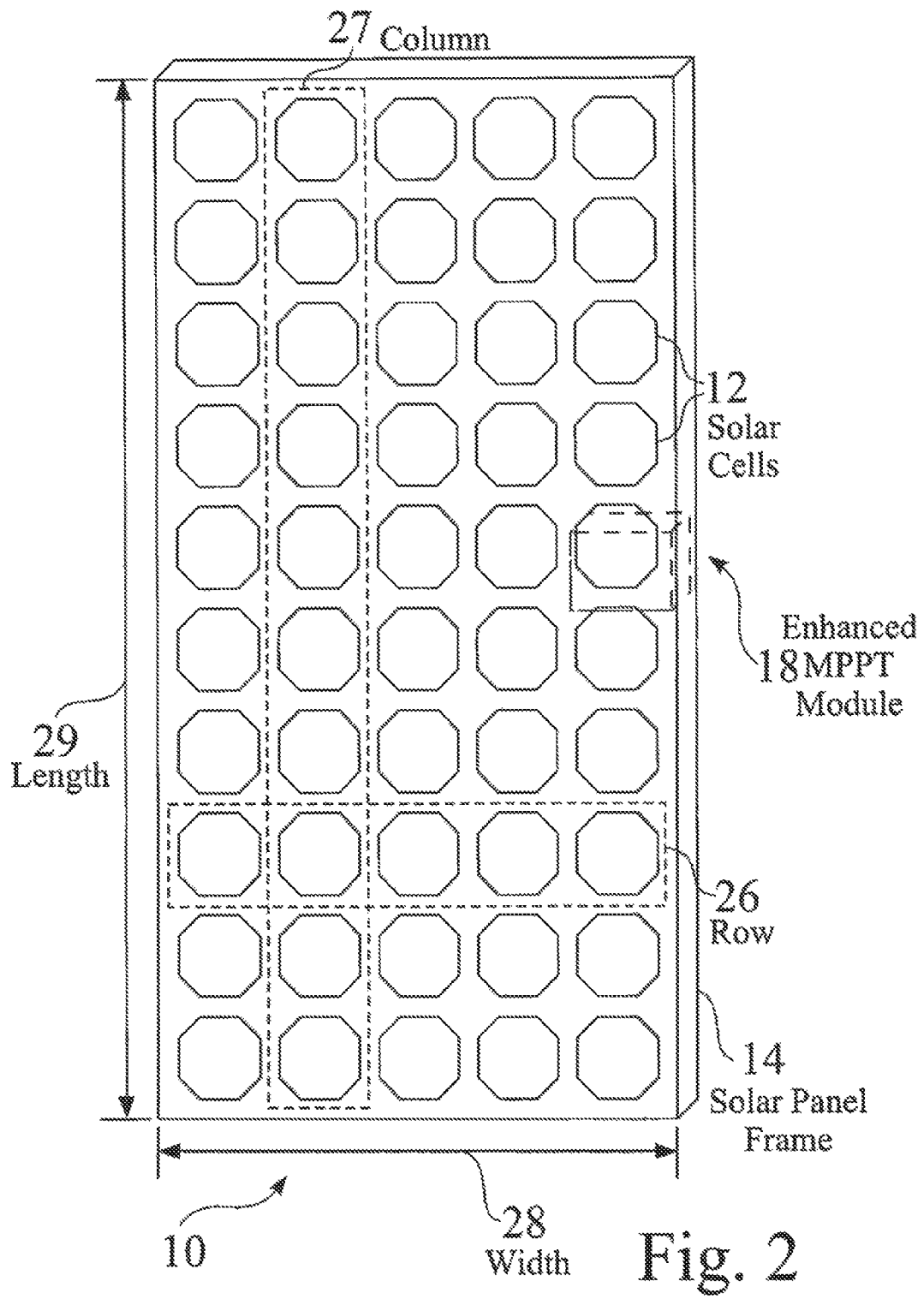
FIG. 2 is a schematic view of an exemplary enhanced solar panel comprising a plurality of solar cells and a distributed maximum power point tracking module.
Figure 3:
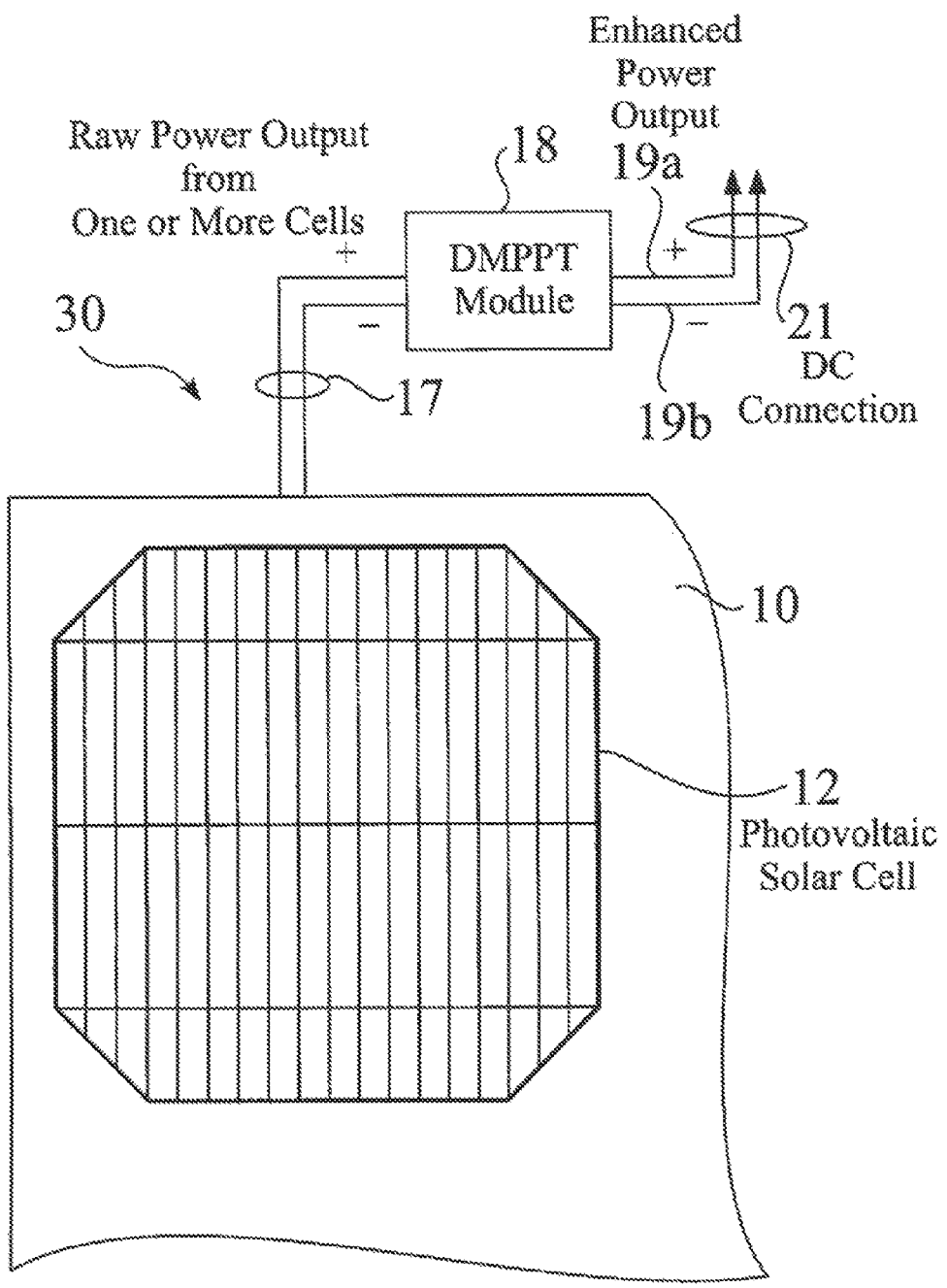
FIG. 3 is a schematic view of an exemplary photovoltaic solar cell having DC output power connections to a DMPPT module.
Figure 4:
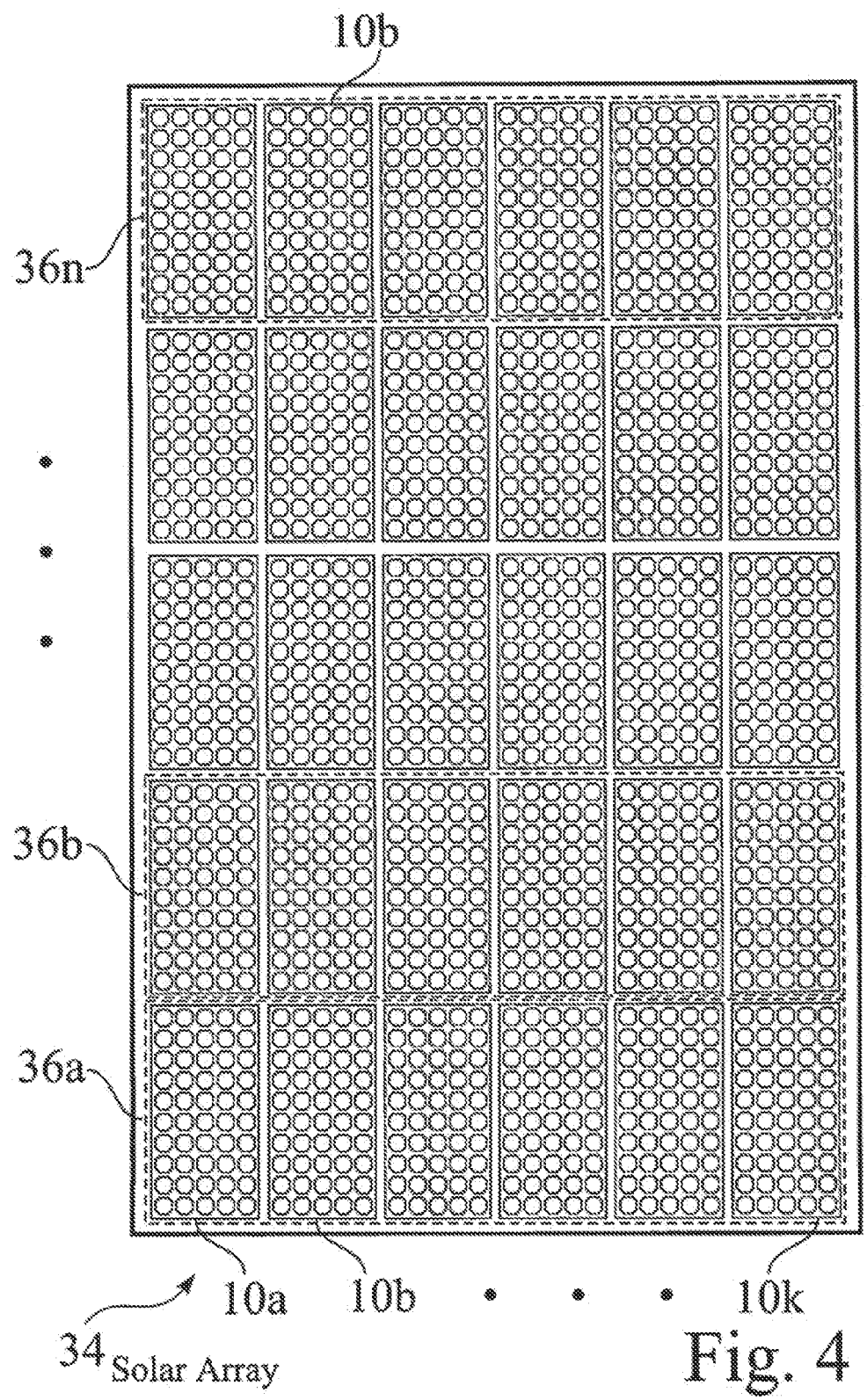
FIG. 4 is a schematic view of an exemplary solar array comprising a plurality of enhanced solar panels.

FIG. 1 is a schematic view of an exemplary enhanced power module 10 comprising a plurality of power cells 12, e.g. 12a-12n, such as but not limited to photovoltaic solar cells, fuel cells, and battery cells, connected 16,17 to a distributed maximum power point tracking (DMPPT) module 18. FIG. 2 is a schematic view of an exemplary enhanced power structure 10, e.g. an enhanced solar panel 10, comprising a plurality of solar cells 12 and a distributed maximum power point tracking module 18. FIG. 3 is a schematic view 30 of an exemplary photovoltaic solar cell having DC output power connections 17 to a DMPPT module 18. FIG. 4 is a schematic view of an exemplary solar array 34 comprising a plurality of enhanced solar panels 10, e.g. 10a-10k, arranged in a plurality of strings 36, e.g. 36a-36n.

The exemplary DMPPT module 18 seen in FIG. 1 has DC inputs 17, and a DC output 21, such as comprising a positive lead 19a and a negative lead 19b. The exemplary DMPPT module 18 also comprises a communications interface 20, and means for connection to a temperature sensor 24, such as responsive to a local panel temperature 23.

DMPPT modules 18, such as seen in FIG. 1, are preferably locally powered from the solar panel 10 that they are attached to, wherein each DMPPT module 18 draws its operating power from it's respective panel 10 that it is connected to, such as to reduce wiring and to improve efficiency.

DMPPT modules 18 are currently implemented for both new panels 10, i.e. at the point of manufacture, and for existing systems, wherein the DMPPT modules 18 may be retrofitted to existing panels 10. As also seen in FIG. 1, the external DC connection 21, comprising leads 19a,19b, is similar to the input DC connection 17, such as provided by an existing conventional panel. Therefore, wiring for the DMPPT modules is similar to conventional solar panels, which minimizes the learning curve for installation personnel.

The communications link 22 shown in FIG. 1 may be a wired connection or a wireless connection, such as to provide flexibility in design and installation. For example, the DMPPT module 18 can communicate via a wireless network, or through a wired connection, e.g. single twisted pair standard RS485 cable.

Some embodiments of either the wired or wireless style DMPPT modules feature a self-discovery function, such that when a new DMPPT module 18 is added to a system 40 (FIGS. 5, 6, 14), the system server 153 (FIG. 14) discovers the new module 18 over the communications link 22, and adds the new module 18 and associated panel 10 to the system 40.

As well, some embodiments of wireless style DMPPT modules 18 feature a self-healing function, wherein a DMPPT module 18 having a wireless communication link 22 also has the ability to bypass non-functioning devices or branches.

For example, if a DMPPT Module 18 is broken or removed, such as by a thief, in a wireless system 40, everything continues to function. The system 40 sees the "broken" device 18, and continues normal communications with the other DMPPT modules 18. This ensures continuous communications with the other active DMPPT modules 18 in the system 40. In a wired system, this may typically cause the loss of communications with several modules 18, as the communications line 22 could be damaged, broken, or cut. In addition to the DMPPT modules 18 and inverters 54, other devices may preferably be connected to the wireless network 22. If something should happen to one of these, it will not affect the system 40 as a whole. Therefore, some system embodiments 40 comprise a self-discovery module, such as provided through the server 153, built into the software. As well, the system 40 can be expanded to include utility monitoring and other applications.

In a conventional solar panel system, solar cells 12 are typically matched to make efficient solar panels, and solar panels are typically matched to make efficient solar arrays. In a conventional solar system, the output of a solar array having a plurality of conventional solar panels, i.e. without DMPPT modules 18, can never match the sum of the maximum power of the conventional solar panels, and the conventional panels can never match the sum of the maximum power of the solar cells 12. In additional to such inherit losses of power, environmental conditions, e.g. such as but not limited to the time of day, season, weather, location, panel positioning, panel age, and/or panel condition, further degrade the short-term and/or long term efficiency of such systems.

Figure 5:
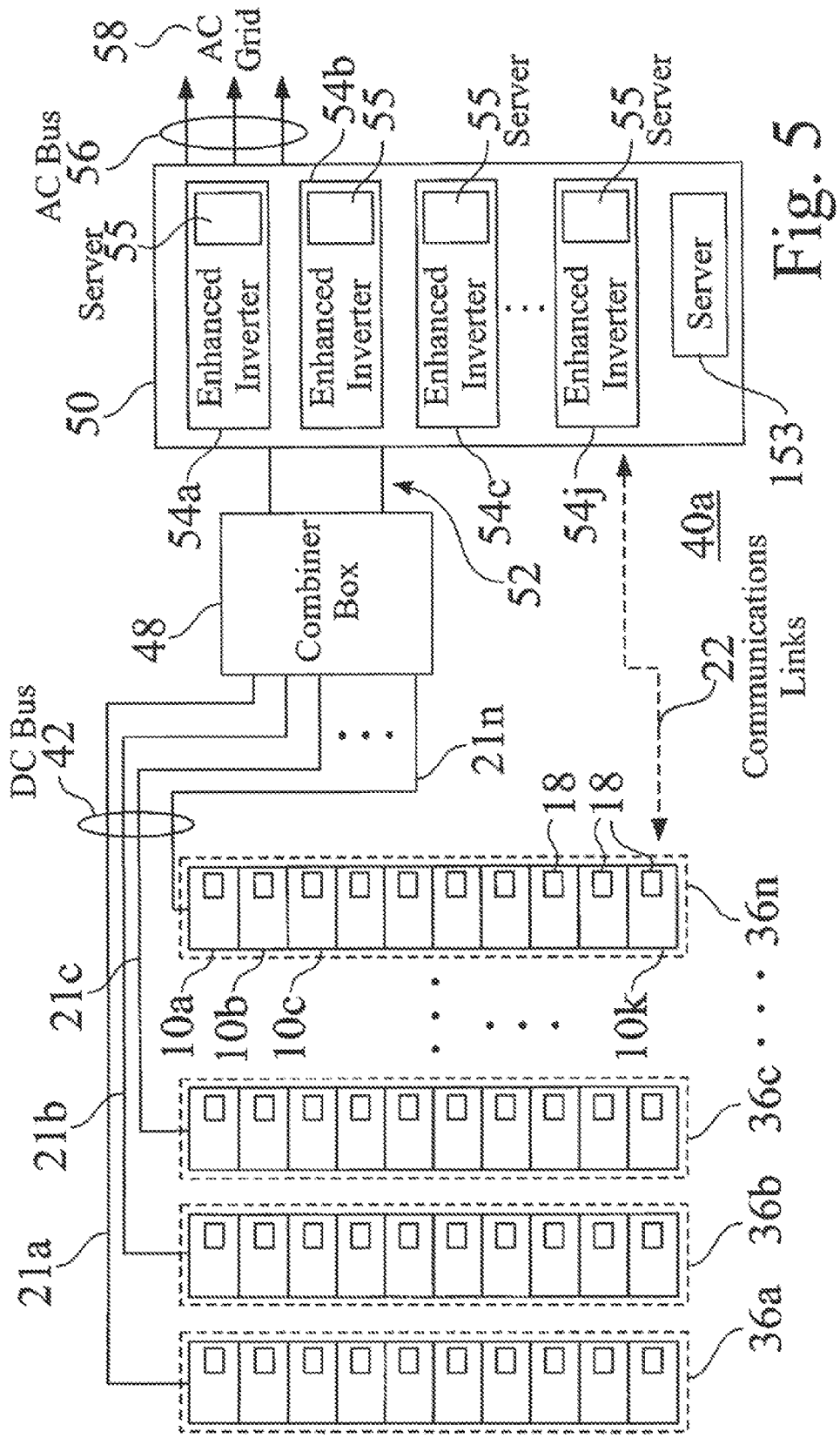
FIG. 5 is a schematic block diagram of an exemplary solar panel system having a plurality of strings of enhanced solar panels routed through a combiner box and controlled through a modular power module housing having one or more enhanced inverter modules.
Figure 6:
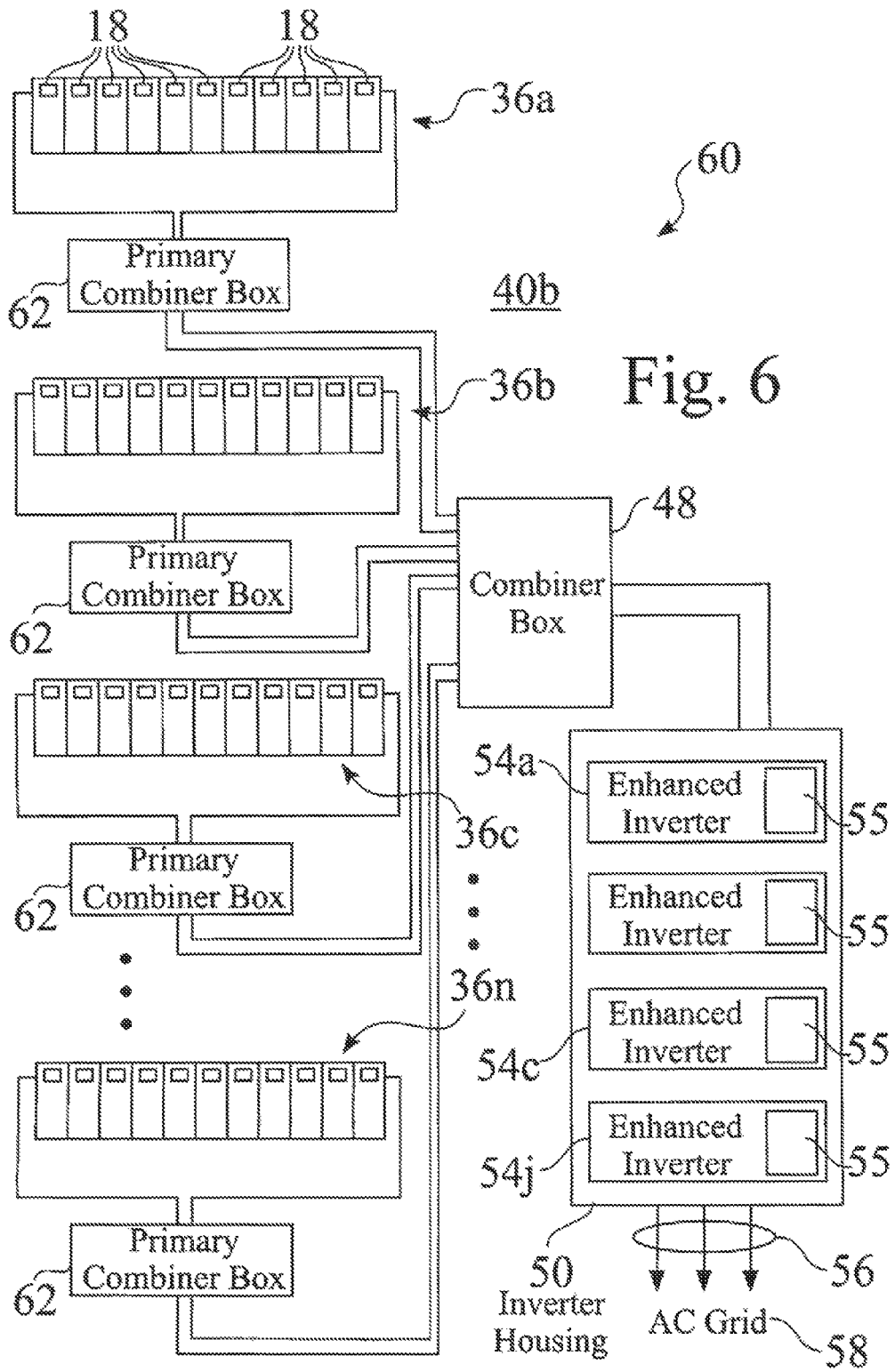
FIG. 6 is a schematic block diagram of an alternate exemplary solar panel system having a plurality of strings of enhanced solar panels having string-level combiner modules and routed through a combiner box and controlled through a modular power module housing having one or more enhanced inverter modules.

FIG. 5 is a schematic block diagram of an exemplary solar panel system 40, e.g. 40a, having a plurality of strings 36, e.g. 36a-36n, of enhanced solar panels 10, e.g. 10a-10k, routed through a combiner box 48 and controlled through a modular power module housing 50 having one or more enhanced inverter power modules 54, e.g. 54a-54j. FIG. 6 is a schematic block diagram 60 of an alternate exemplary solar panel system 40b having a plurality of strings 36, e.g. 36a-36n of enhanced solar panels 10 having string-level combiner modules 62, routed through a combiner box 48, and controlled through a modular power module housing 50 having one or more enhanced inverter power modules 54, e.g. 54a-54j.

Figure 7:
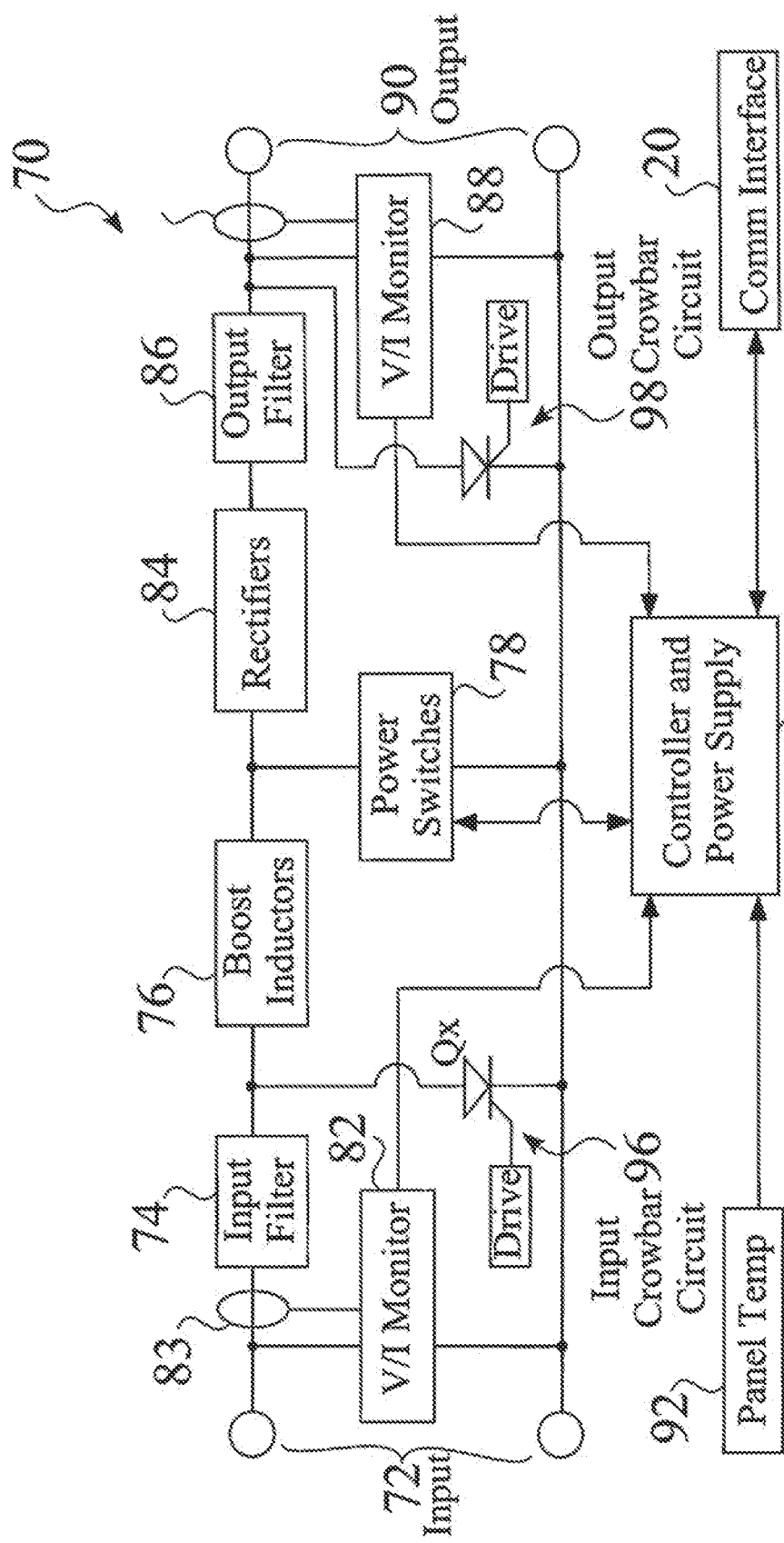
FIG. 7 is a block diagram of an exemplary distributed MPPT circuit.

FIG. 7 is a block diagram of an exemplary distributed MPPT circuit 70 for a distributed maximum power point tracker (DMPPT) module 18, which typically comprises an integrated or retrofitted module 18 for each enhanced solar panel 18. DMPPT modules 18 associated with the enhanced solar panels 10 overcome several problems inherent with conventional solar panels and the harvesting of power.

An input filter 74 is preferably attached to the input 72 of the DMPPT module 18, to help reduce EMI/RFI, as well as to supply protection from surges, etc. on the input side. This also helps in impedance matching between the solar panel 10 and the DMPPT module 18, such as to improve MPPT tracking.

The exemplary DMPPT module 18 shown in FIG. 7 preferably comprises one or more boost inductors 76, such as a dual inductively-coupled link inductor 76 to boost the efficiency of the DC-DC conversion stage. This has the added benefit of splitting the power path, which provides an increase in efficiency. At the present time, small inductor units 76 cost less and weigh less than a single inductor design, and there is less chance for core saturation. Another benefit of this design is the increased compensation factor. This allows a more stable distributed DC Bus 42,52 to be produced, with less requirements for DC-ripple and output filtering 86.

Some DMPPT embodiments 18 use a multi-phase approach, wherein the controller 80 can reduce the current flow through the power switch 78, thus increasing efficiency and reducing the heat dissipation load. This also allows the DMPPT 18 to improve power harvesting of the solar panels 10. The controller 80 controls the switching of these power devices 78 in a modified spread-spectrum switching scheme, to minimize EMI/RFI radiation of the modules 18. Low loss switching devices 78 are used to improve overall efficiency. In some embodiments 18, these switching devices 78 comprise transistors, FETs, MOSFETs, IGBTs, or any other power-switching device 78 that meets the design criteria.

Two diodes typically provide rectification 84 for the DMPPT modules 18, thus reducing the power dissipation and providing a plurality of paths for the power flow. The rectification diodes 84 also effectively isolate each DMPPT module 18 and associated solar panel 18 from the system array 30, in case of total panel failure. Even if a DMPPT module 18 fails, this isolation still exists, if it was not the diodes 84 or the output filter 86 that failed. This increases the reliability of the system 40 as a whole.

As seen in FIG. 7, a filter 86 is preferably attached to the output of the DMPPT modules 18, to help reduce EMI/RFI, and to provide protection, e.g. from surges, on the output side 90. The output filter 86 also helps to stabilize the distributed DC bus 42,52 that feeds the solar inverter(s) 54.

The controlled production of DC output voltage at the DMPPT modules 18, having a higher voltage than the incoming voltage from the panels 10, reduces power transmission losses from the array 36 to the inverter(s) 54. For example, for a higher voltage DC output that is also stabilized, to get the same amount of power from the array 36 to an inverter 54 requires less current, since the power loss in the conductors is given as $I^2R$, where I is the current over the conductors, and R is the resistance. Therefore, the lower current due to the higher voltage results in less line drop losses, and more power to the inverter(s) 54.

In addition, the inverters 54 run at better efficiency with a stable DC Distributed Bus 42,52. While other conventional inverters experience better efficiency with a higher DC Bus input, as long as it is within the design specifications, the DMPPT module 18 may preferably boost the distributed DC voltage from the array 36, to maximize this benefit.

Figure 8:
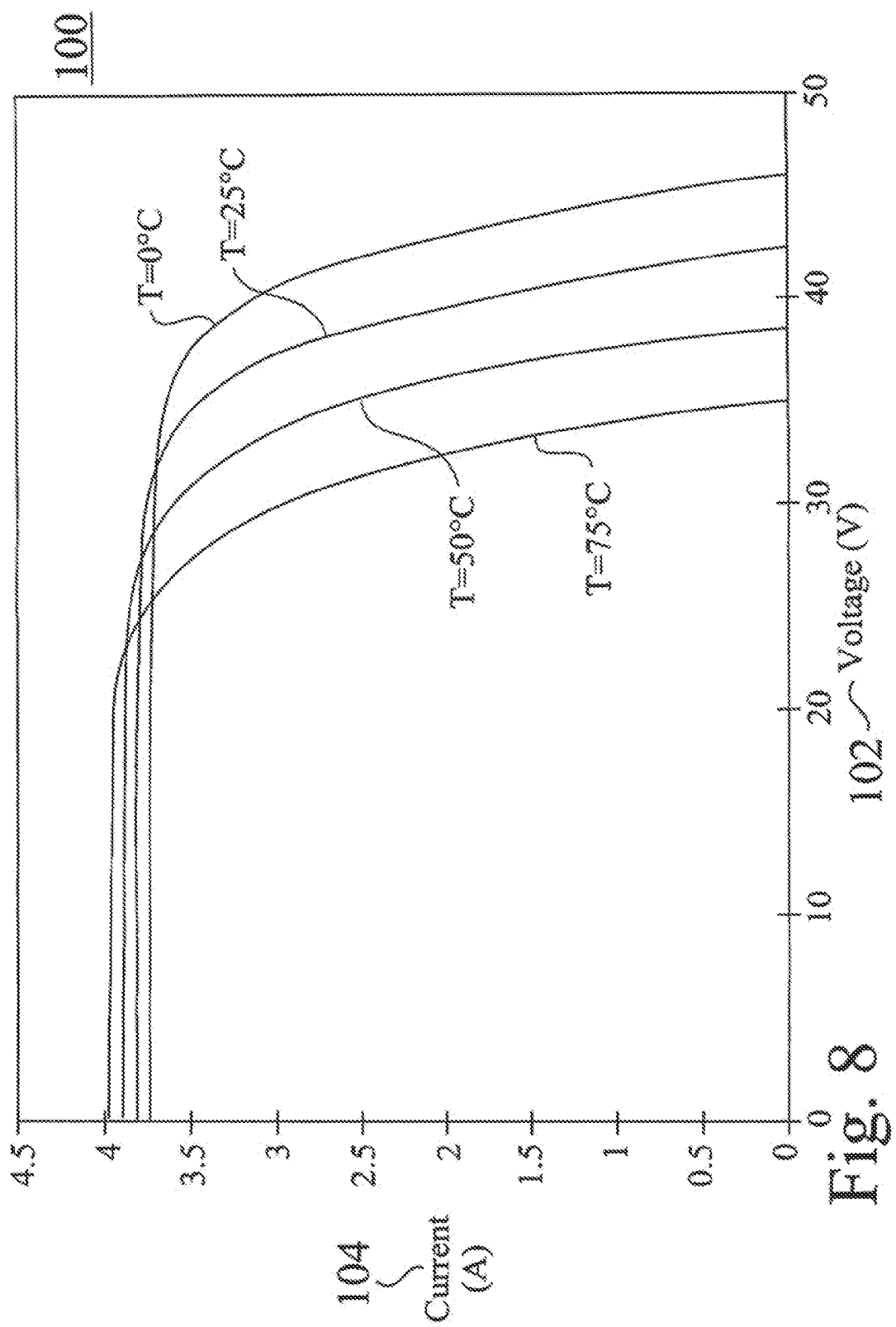
FIG. 8 is a first graph showing exemplary current-voltage (IV) curves of photovoltaic solar panels over a range of temperatures.
Figure 9:
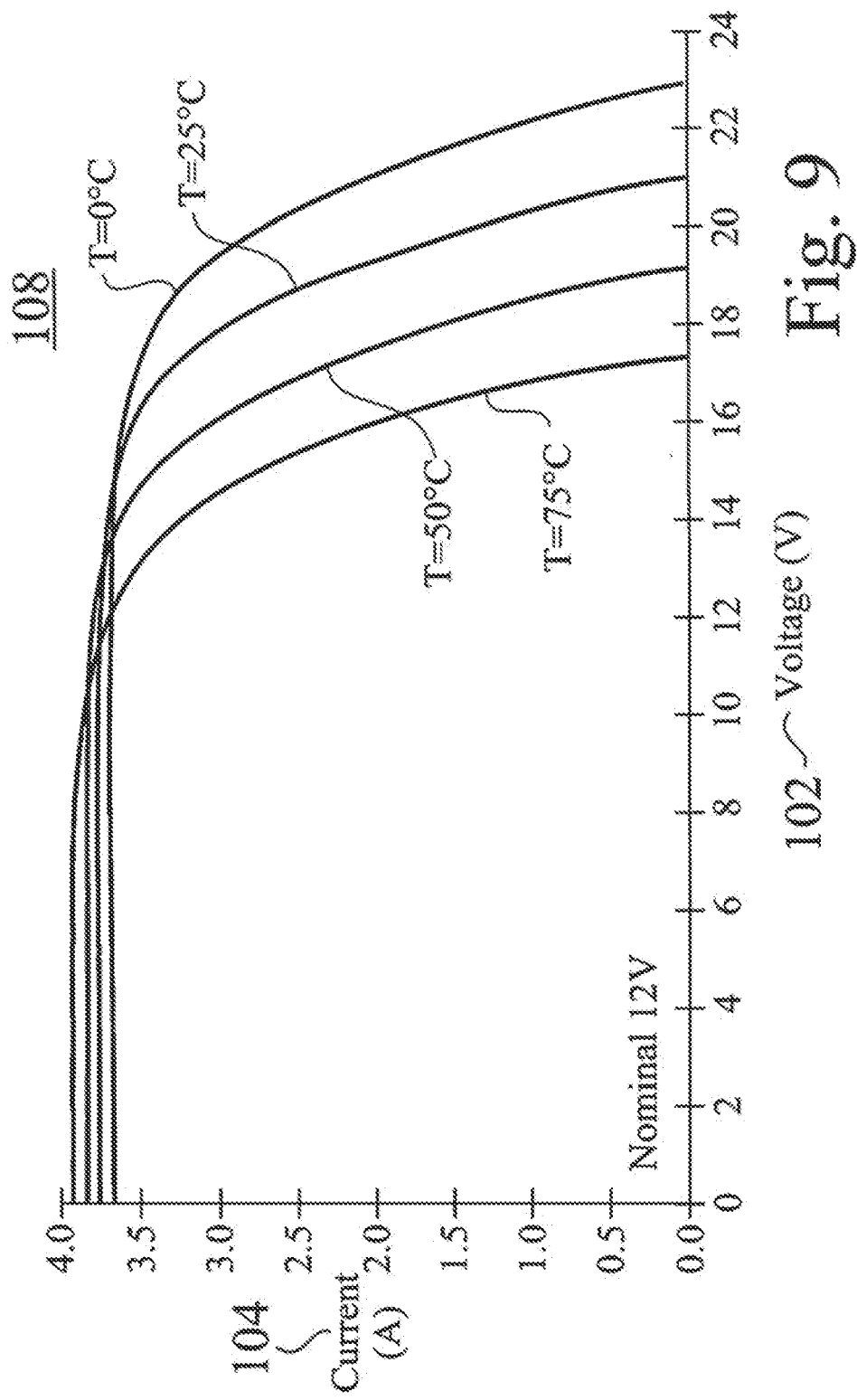
FIG. 9 is a second graph showing exemplary current-voltage (IV) curves of photovoltaic solar panels over a range of temperatures.

FIG. 8 and FIG. 9 show typical Current-Voltage (IV) curves of photovoltaic solar panels. These demonstrate how the voltage moves over a wider range than the current with temperature and solar radiation. The maximum power point for one or more panels moves during the day, and each panel experiences different environmental conditions, even within the same system. The distributed maximum power point tracking modules 18 and associated inverter system 40 provide several means to maximize the power output over a wide range of such conditions.

The panel temperature 23 (FIG. 1) is monitored and reported back to a server, such as an embedded server 153 associated with the inverter housing 50, or to a server 55 associated with a particular inverter 54. This temperature value is also used as an input to the multi-level MPPT controller 80 (FIG. 7). An op-amp may preferably be used to scale this value to be read by the controller 80, and is used as another control input to the controller 80 of the DMPPT module 18. In some embodiments of the DMPPT modules 18, a lead wire and temperature sensor 24 exit from the DMPPT Module 18 and attach to the panel 18. In alternate embodiments, a temperature sensor 124 is collocated with the DMPPT module 18, such as inside a panel junction box.

The embedded server 153 may preferably supply an ambient temperature, such as taken outside of the inverter cabinet 54, or outside a web server box, such as if another inverter is used at the site.

Figure 10:
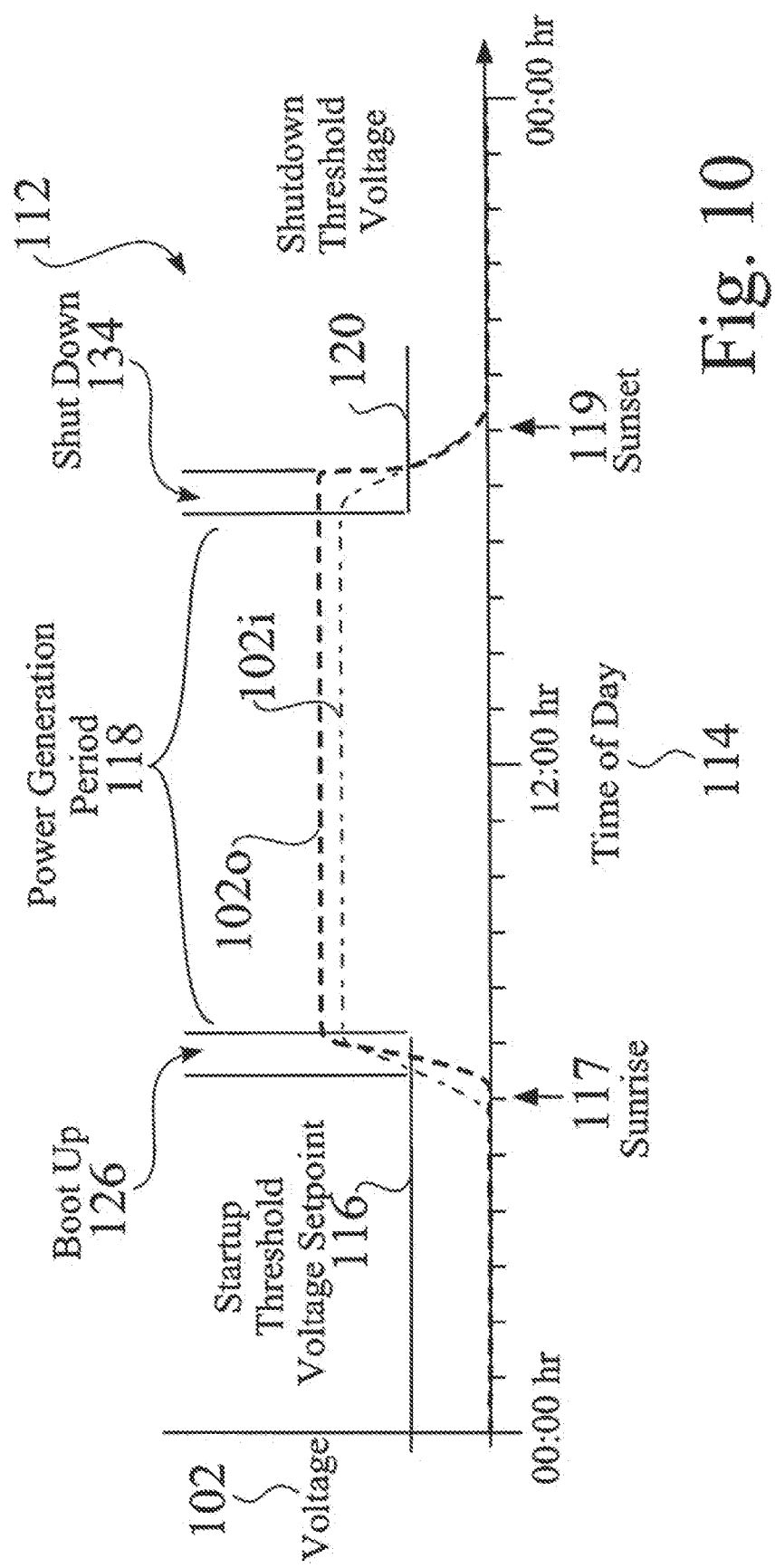
FIG. 10 is time chart of voltage output for an enhanced power module having DMPPT module.
Figure 11:
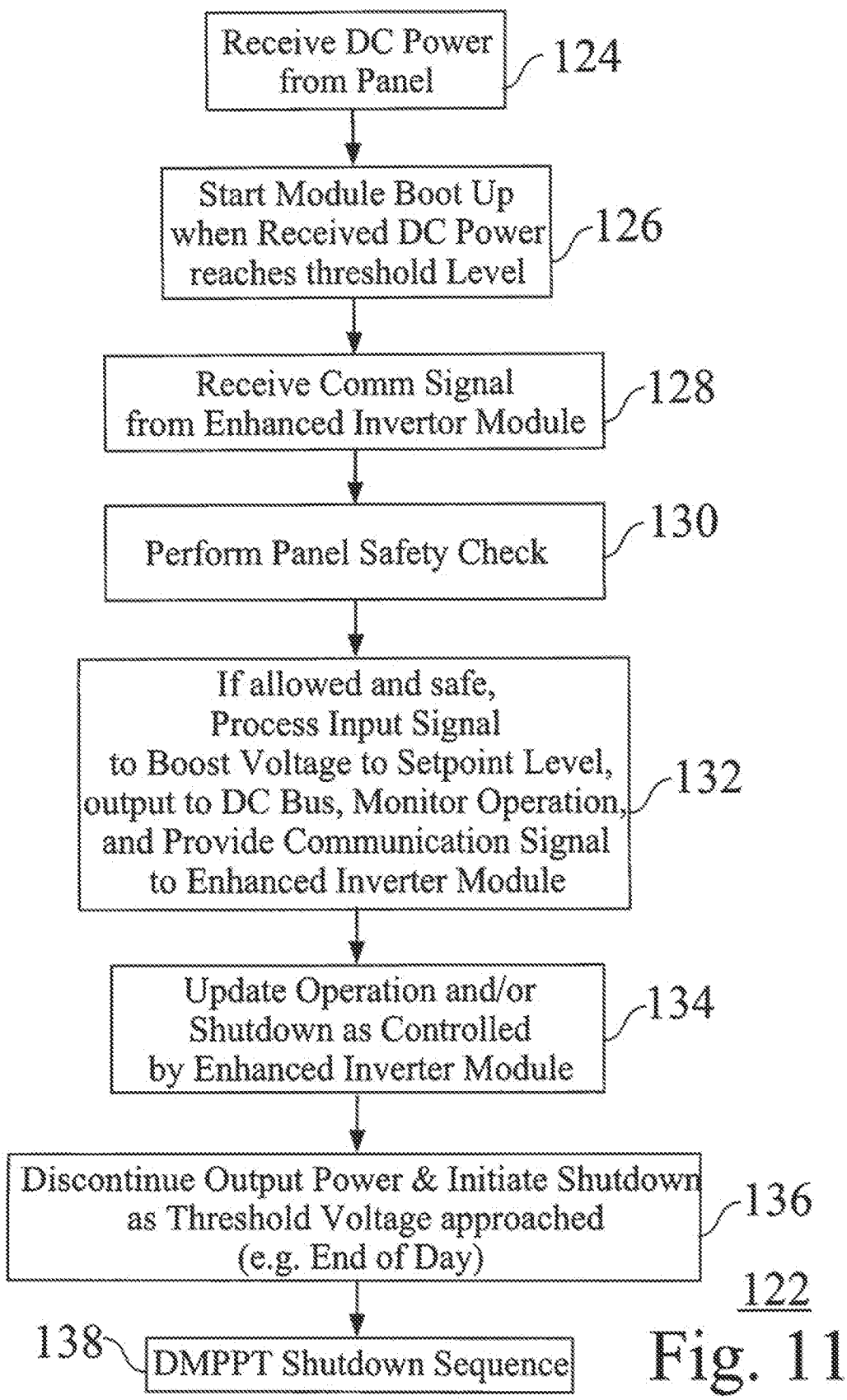
FIG. 11 is a flowchart of an exemplary operation of an enhanced power module having a DMPPT module.

Operation of Distributed Maximum Power Point Tracking Modules. FIG. 10 is time chart 112 showing operation states of the DMPPT 18, indicating DMPPT input voltage 102*i*, and output voltage 102*o* for an enhanced power module 10 having a DMPPT module 18. FIG. 11 is a flowchart of an exemplary process 122 for operation of an enhanced power module having a DMPPT module 18.

Figure 21:
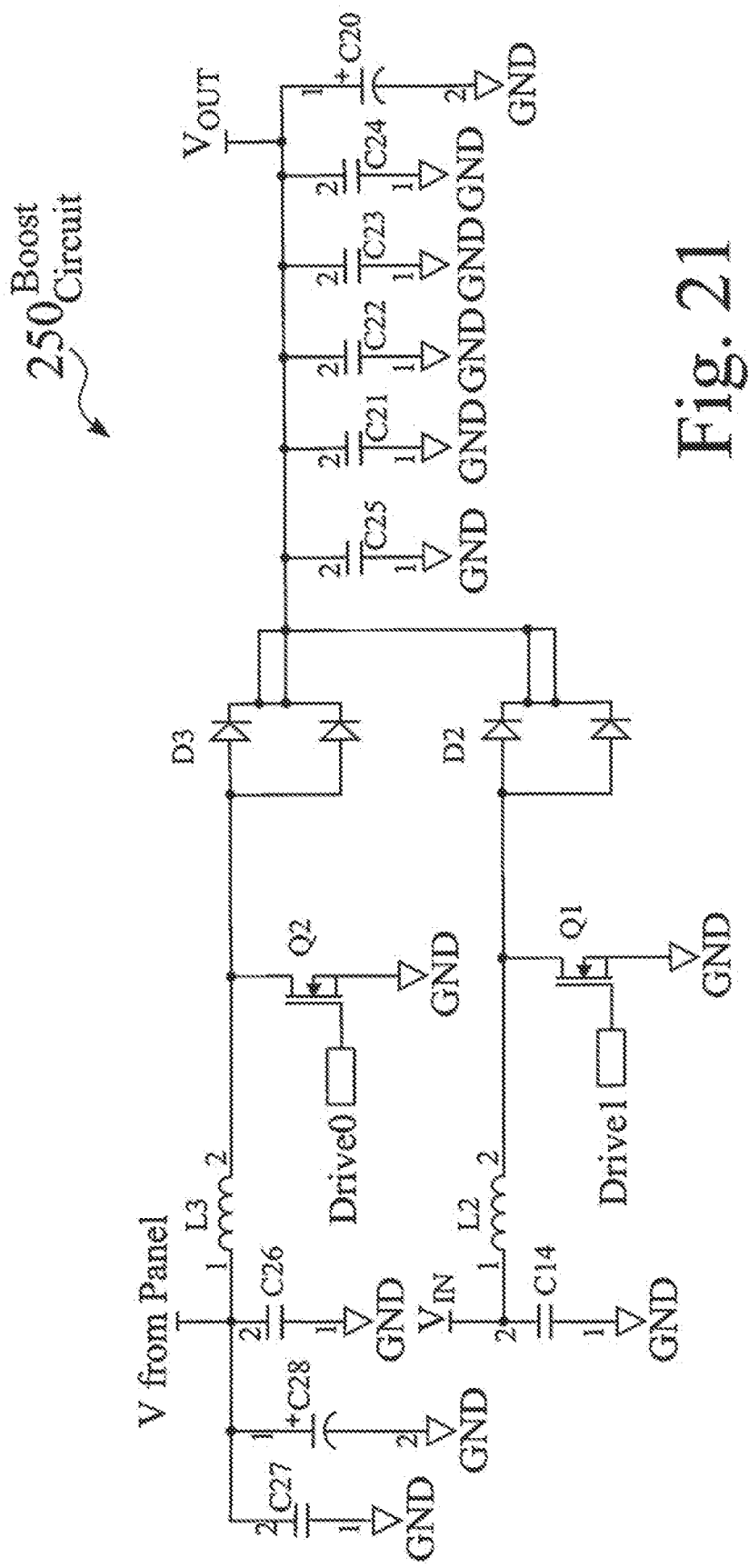
FIG. 21 is a schematic circuit diagram of an exemplary boost circuit for a DMPPT module.

As a solar panel 10 starts producing a voltage 102 and current 104 when light is shining on it, this power is transferred to the distributed bus 42 (FIG. 5) when it exceeds the voltage 102 to overcome the component drops and the forward voltage drop of the diode(s), such as shown in the diode circuits D2 and D3 seen in FIG. 21. In this regard, the system behaves like a conventional solar panel array structure. In some embodiments of solar panels 10 having DMPPTs 18, once the voltage on the solar panel 18 reaches a threshold voltage 116 (FIG. 10), e.g. approximately 4.5 to 6.5 Volts DC, the DMPPT Module 18 automatically wakes up 126 (FIG. 11), and starts performing the necessary checks 128,130, before switching over to RUN Mode 132.

As the voltage 102 of the solar panel 18 increases, the DMPPT 18 starts boosting the voltage 102 from the panel 18 to the common distribution bus 52 feeding the solar inverters 54. This wait is necessary to prevent the loss of control power from the controller circuit 70 (FIG. 7) when switching begins. By using control inputs, the system tracks the maximum power point of the solar panel 18, and boosts the voltage out to the distributed DC Bus 52 feeding the solar inverter(s) 54.

Since the voltage 102*i* is boosted 102*o*, the system as a whole reaches striking voltage for the solar Inverter 54 in a shorter period than a conventional array of panels 10 would without DMPPT Modules 18.

Furthermore, the system 40 as a whole operates longer before shutting down at the end of a power generation period 118, e.g. such as at sunset, dusk or evening 119 for externally mounted solar panels 18. Since the function of maximum power point tracking (MPPT) is performed at the panel level, several other issues associated with solar panels 10 are addressed as well.

Figure 29:
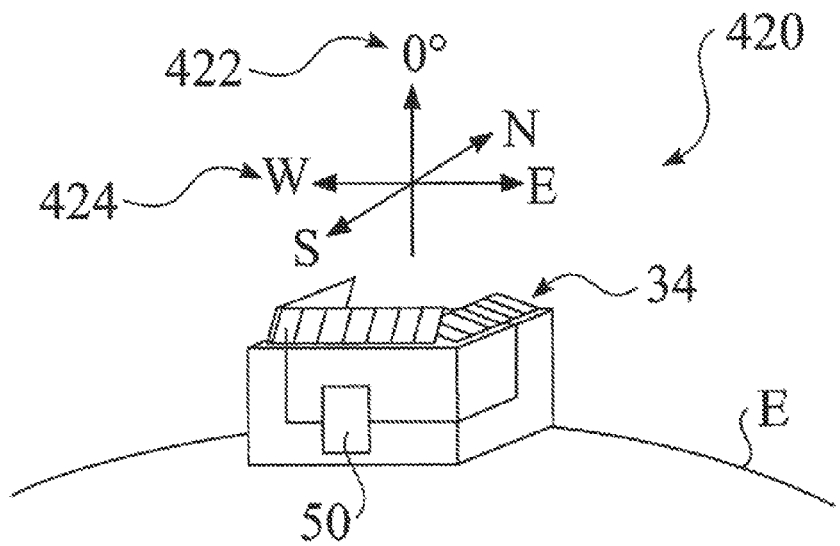
FIG. 29 shows an enhanced power harvesting system located on the Earth, wherein one or more panels within a string have different angles and/or orientations.

For example, problems with mismatched or different manufacturers can be eliminated with the DMPPT units 18. As seen in FIG. 29, solar panels 10 on different planes and orientations can be combined into the same system, without any de-rating or loss of harvest from the array 34. The overall efficiency of the array is increased, because the MPPT is done on a per panel basis, and not on the average of the entire system. In contrast to conventional solar systems, string mismatches are not an issue, due to the active nature of the DMPPT Modules 18. Conduction losses are reduced, thus allowing more energy to be harvested and transmitted to the inverter 54 for grid conversion. The overall efficiency of the array 34 is increased, because the panel output is processed, monitored, and controlled on a per panel basis, and not based upon the average of the entire string 36 or array 34. Safety features are built into the design for fire safety, monitoring, and several other future applications.

Overall, the DMPPT Module 18 addresses many of the current limitations of solar power, such as by providing longer harvest times with panel-level DMPPT modules 18, by providing "Early-On" and "Late-Off" for extended harvest times. Since the output from the solar panels 10 is boosted, the usable power is converted by the inverter 54, because the striking voltage is reached sooner and can be held longer, thereby resulting in an increase in harvestable power from each of the solar panels 10.

As well, some embodiments of the DMPPT modules 18 may preferably be reprogrammable or updatable, such as over the communications link 22, wherein different algorithms may be sent and stored within the DMPPT controllers 80, such as for modifying start up, operation, safety and shutdown operations.

DMPPT modules 18 also help to reduce the effects of partial shading on solar arrays 34. In conventional solar panels, partial shading of a single cell 12 causes the entire panel and string in which it is connected to reduce power output, and also increases loses due to string mismatch, by lowering the MPPT point for an entire solar array. In contrast to conventional panels, the DMPPT modules 18 can controllably compensate for partial shading at the panel level, to boost the DC output signal 102o.

Test Platform.

Figure 12:
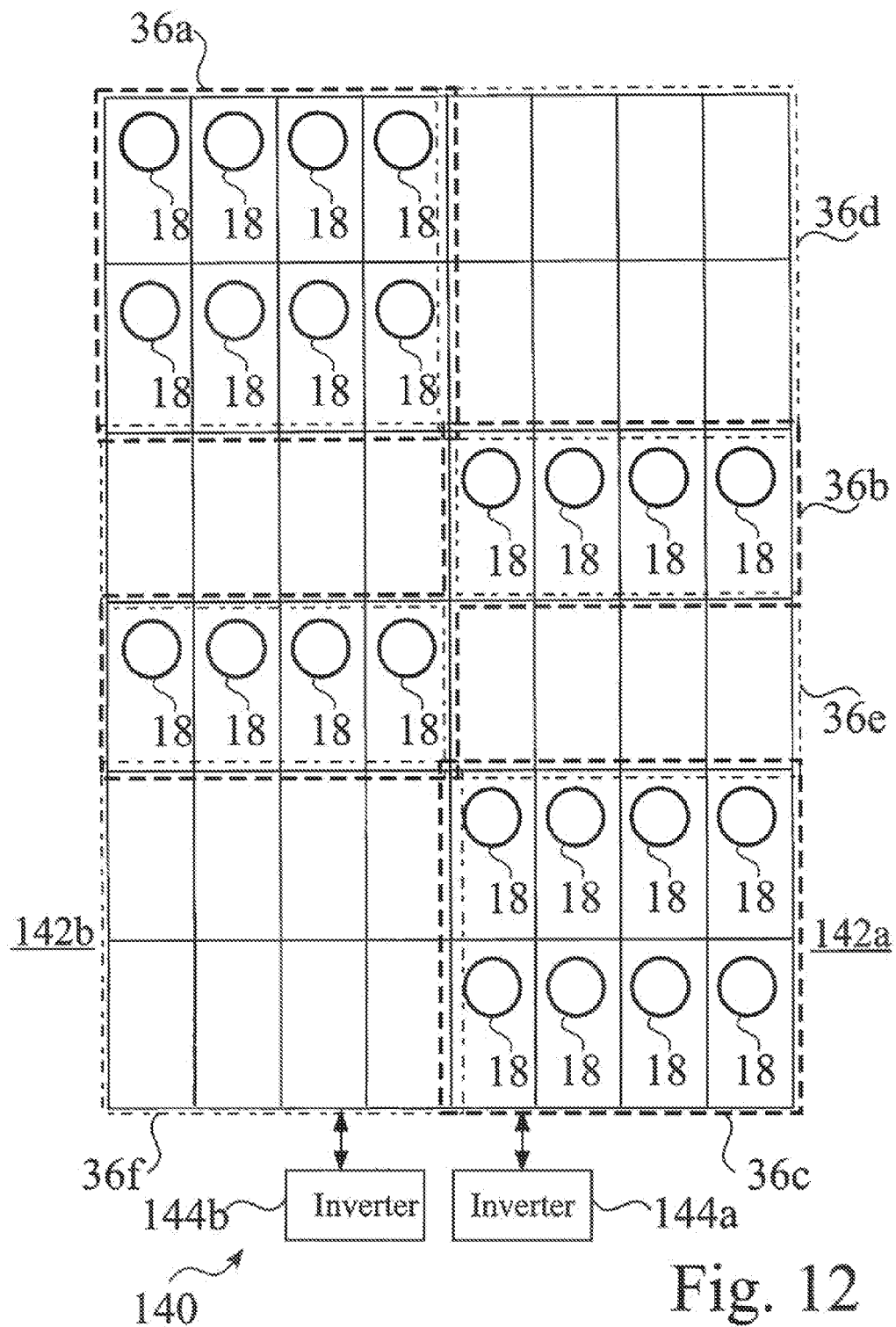
FIG. 12 is a schematic view of an exemplary solar array comprising a plurality of solar panels, wherein a portion of the panels in one or more strings further comprise DMPPT modules.

A test platform was installed to test the benefits and operation of the DMPPT modules 18. The test bed utilized forty-eight solar panels 10, rated at 170 watts, connected in six strings of eight 170-watt panels each. FIG. 12 is a schematic layout view 140 of the exemplary test bed solar array 34 comprising a plurality of solar panels 10, wherein a portion of the panels in one or more strings further comprise DMPPT modules 18. A first group 142a comprising three strings 36a, 36b and 36c having different sample orientations across the array 34 included DMPPT modules 18, while a second group 142b comprising three strings 36d,36e and 36f having different sample orientations across the array 34, did not include DMPPT modules 18.

The system was connected to two identical conventional solar inverters 144, e.g. 144a,144b for connection to a public AC grid, wherein the first string group 142b was fed into the first conventional inverter 144a, and the second string group 142b was fed into the second conventional inverter 144b. In the test platform 140, each of the conventional solar inverters 144a,144b was rated at 4,080 Watts Peak DC.

Figure 13:
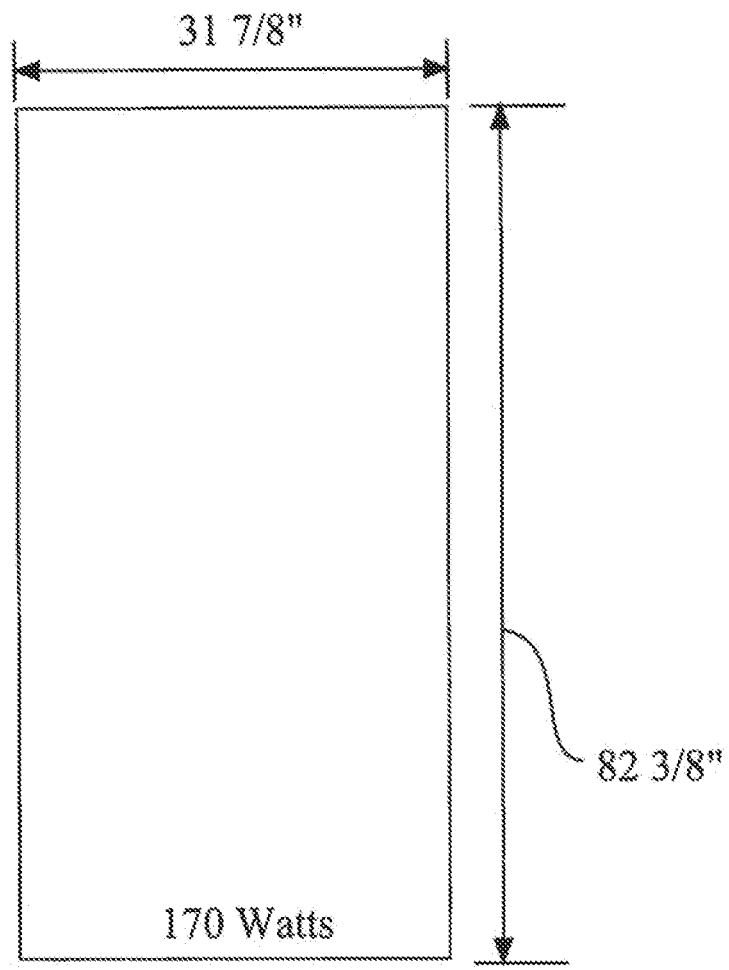
FIG. 13 shows the relative proportion and size of an exemplary solar array having a capacity of approximately 170 W, comprising a plurality of enhanced solar panels, wherein a portion of the panels in one or more strings further comprise DMPPT modules.

FIG. 13 shows the relative proportion and size of an exemplary solar array having a capacity of approximately 170 W, comprising a plurality of enhanced solar panels, wherein a portion of the panels in one or more strings further comprise DMPPT modules 18.

The panels on the test bed are laid out to give a fair representation of solar illumination. One half of the panels are modified with the DMPPT modules 18, while the other half of the panels are left unmodified, i.e. standard solar panels. Each set feeds into a similar sized solar inverter from the same manufacturer. Data is to be gathered over a period of time to evaluate specific design parameters for the DMPPT modules 18. Since the strings 36 are set adjacent to each other, shading can be introduced upon the system, such as by using cardboard cutouts and sliding them over the top the solar panels 10.

Enhanced Inverter System Operation and Monitoring.

FIG. 14 is a block diagram of an exemplary system 40 comprising a modular power inverter housing 50 housing having one or more enhanced inverter modules 54, e.g. 54a-54j, a central interface 152, a database 154, and connectable 155 to one or more local or remote monitoring or control devices 156,160, such as for interaction with a user USR.

In some system embodiments, the modular power inverter housing 50 is powered by the AC bus 56, e.g. such as by the AC grid 58, wherein the housing 50 may be powered by a public AC grid 58 even when the power array(s) 34 are down. In other system embodiments 40, the modular power inverter housing 50 is powered by the DC bus 42, 52 e.g. such as by the solar arrays(s) 34, wherein the housing 50 may be powered off-grid, even when the AC grid 58 is down. In some alternate system embodiments, the modular power inverter housing 50 is powered either off-grid 42,52 or on-grid 58, such as depending on available power.

As seen in FIG. 14, a central monitoring and control interface 152 interacts with each of the inverters 154, e.g. the enhanced inverters 54a-54j. Each of the enhanced inverters 54 preferably comprise a dedicated server 55 (FIG. 5, FIG. 6), e.g. an embedded web server 55, or may communicate with a system server 153, e.g. an embedded system server 153, associated with the inverter housing 50.

The data collected from the power panels 10, e.g. the solar panels 10, the enhanced inverters 54, e.g. solar inverters 54, and other equipment with the system 40, can be displayed in near real-time, such as through a local device 156 or remote device 160, e.g. over a network 158, such as but not limited to a local area network (LAN) a wide area network (WAN), or the Internet. This collected data can also be sent, such as through a server 153, and logged into a database 154. The exemplary system 40 seen in FIG. 14 may therefore preferably provide detailed trending analysis and/or performance tracking over the lifetime of the system. The system server 153, e.g. an embedded web server 153, typically gathers information and provides presetting of controls for the entire system 40, right down to the individual panels 10, through communication links 22 to panel DMPPT modules 18.

The DMPPT module controller 80 (FIG. 7), e.g. such as comprising a digital signal processor 80, typically outputs data in a slave mode, such as by reporting data back to an associated embedded server 54 when requested, through one of several means, e.g. such as but, not limited to wired or wireless transmission 22. The controller 80 also typically accepts measured parameters from the embedded controller 54 pertaining to the local ambient temperature 25 (FIG. 1) and the solar isolation, i.e. the intensity of incident solar radiation. These parameters, along with the data collected at the panel 10, provide control inputs to the program performing the MPPT function on a distributed, i.e. local panel, level.

In some system embodiments 40, the communication links 22 between the DMPPTs 18 and the embedded server(s) 153,55 comprise either a multi-drop single twisted pair RS-485 communications line 22, or a wireless radio link 22. In some system embodiments, the use of wireless communication links 22 may be preferred, such as to reduce the wiring cost, thereby reducing the overall cost of the system 40.

In some embodiments, the protocol used for the communication links is ModBus, such as RTU RS485 for the wired system, or a wireless tree mesh system with self-healing/discovery capabilities for wireless communication links 22. Such ModBus protocols are preferably designed for harsh environments, minimizing or eliminating lost packets of data.

All distributed data is gathered and passed 22, e.g. via the RS-485 ModBus links 22, and then the embedded server 54 at the inverter cabinet 50 formats this into a viewable web page 157 (FIG. 14) for the user USR. This collected data can also be streamed out to another server, e.g. 156,160 for data logging and trending applications.

The heartbeat signal rides on the universal broadcast address, and this synchronizes all of the panels 10 within a few microseconds of each other for their operation. Another defined address broadcasts the ambient temperature and solar insulation from the server 153 to each of the DMPPT Modules 18. If communications are lost, or if a "Fire" signal is broadcasted, then the DMPPT Modules 18 automatically shut down, to remove high voltage from their input 72 and output 90.

Modular Design of Solar Inverter Units. FIG. 15 is a block diagram of a modular inverter housing 50, such as a Model No. ASPM-2-70KW, available through Accurate Solar Systems, Inc. of Menlo Park Calif., having two 35 KW enhanced inverters 54 installed, such as a Model No. ASPM-1-35KW, available through Accurate Solar Systems, Inc. of Menlo Park Calif., having a total rating of 70 KW. FIG. 16 is a block diagram of a modular inverter housing 50 having three 35 KW enhanced inverters 54 installed, e.g. Model No. ASPM-1-35KW, rated for 105 KW. FIG. 17 is a block diagram of a modular inverter housing 50 housing having four 35 KW enhanced inverters 54 installed, e.g. Model No. ASPM-1-35KW, rated for 140 KW. While the exemplary enhanced inverters 54 described above are rated at 35 KW each, some alternate embodiments of the enhanced inverters are rated 4 kilowatts each, wherein the system 40 can operate even closer throughout the day.

The modular inverter housing 50 may preferably house a plurality of inverters 54, to reduce cost, increase efficiency, and improve performance of the system 40. As well, the use of a modular enhanced inverter 54, such as but not limited to a 35 kW inverter 54, is readily combined or stacked to provide a wide variety of capacities for a system 40, such as for a 35 kW system, a 70 kW system 40, a 105 kW system 40, or a 140 kW system 40, which may be housed in one or more types of modular inverter housings 50.

Each cabinet 50 typically comprises associated transformers, output circuitry, input circuitry, and communications 151 with the embedded web server 153. The smallest current cabinet 50 houses a single 35 kW module 54. The next step is a larger cabinet 50 that houses between two and four of 35 kW enhanced inverter modules, depending on the power required.

In the modular inverter housing systems 50, such as seen in FIG. 15, FIG. 16 and FIG. 17, if an enhanced inverter 54 goes down, the others continue to deliver power to the AC bus 58. Therefore, a single fault will not bring the entire system 40 down. The enhanced inverter units 54 communicate with each other, such as through the embedded web server 153.

In some system embodiments 40, one of the enhanced inverters 54 initially comes on as the system 40 starts up, such as to increase efficiency. As the available power increases, the next enhanced inverter unit 54 is signaled to come online, and so on, such that the system 40 operates at near peak efficiency for as much time as possible, thereby providing more system up time in larger systems. Therefore, in some system embodiments 40, the use of multiple enhanced modules 54 wastes less energy, as the system 40 only turns on inverters 54 that can be supported by the array 34.

In the modular inverter housing systems 50, such as seen in FIG. 15, FIG. 16 and FIG. 17, each of the enhanced inverter modules 54, e.g. such as but not limited to being rated at 4 kW or 35 kW apiece, may preferably be hot swappable.

Advanced Diagnostics and Monitoring of Enhanced Power Systems.

Since embedded web servers 153,55 communicate with the solar inverters 54, the solar panels 10, and any other associated equipment, the system 40 may preferably provide a near real-time view of the current status of the system 40 as a whole. If a problem occurs, then the operator USR is notified by various means, e.g. such as through the user interface 157.

Most conventional solar power inverter systems typically provide a single DC input voltage and a single current measurement at the inverter level, which is based upon the sum of an entire array. In contrast, while the enhanced power inverter system 40 provides the current, voltage, and power of each of the arrays 34, the enhanced power inverter system 40 may preferably provide the status and performance for each individual panel 10 and string 36, such that troubleshooting and maintenance is readily performed.

Smart Switching Technology.

Figure 18:
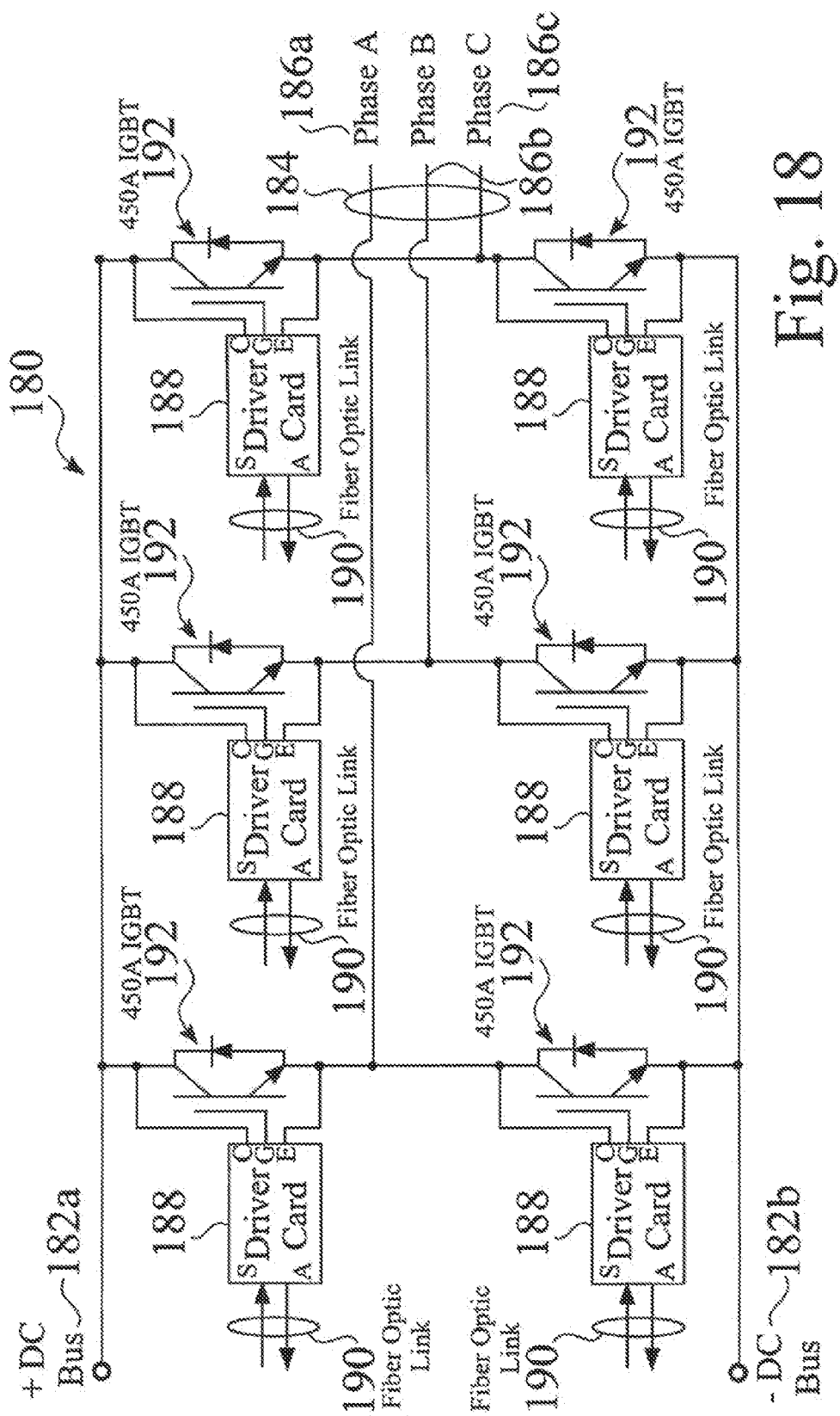
FIG. 18 is a simplified schematic circuit diagram of an exemplary power section for an enhanced inverter module.

FIG. 18 is a simplified schematic circuit diagram of an exemplary power section 180 for an enhanced inverter module 54, wherein the enhanced inverter 54 uses a three-phase half bridge IGBT driven power stage, such as provided with IGBTs 192, driver cards 188, and fiber optic links 190.

Most conventional inverter systems use a standard high frequency pulse width modulation (PWM) method that, while it performs basic signal inversion, has many inherent disadvantages.

Figure 19:
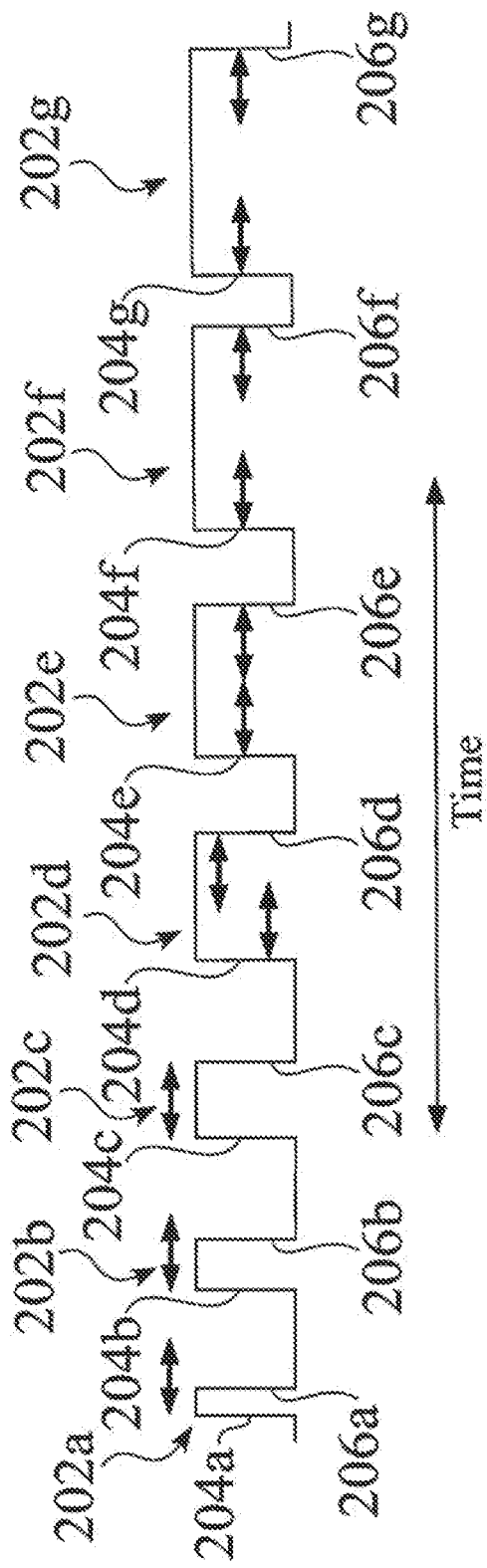
FIG. 19 shows resultant output power signal properties for active elimination of harmonics by inverter signal modification using sine-weighted pulses.

FIG. 19 shows a resultant output power signal pulse train 200, based upon active elimination of harmonics by an enhanced inverter module 54, wherein the power signal is processed using sine weighted pulses. In the enhanced pulse width modulation (PWM) provided by the enhanced inverter system 54, some of the edges, e.g. 204,206, are dynamically linked to other edges in the firing sequence. This has the benefit of simplifying the overall inverter 54, as well as actively eliminating all third harmonics. The enhanced inverter system 54 reduces or eliminates harmonics, by controlling where the rising edges 204 and falling edges 206 of the pulse train 200 occur.

Combining these two features, it is possible to generate a modified smart switching PWM signal 200 that has very low harmonic content, a lower carrier switching speed, and improved efficiency. This switching scheme 200 allows a relatively simple filter 356 (FIG. 26) to be used, which reduces weight and cost, and improves efficiency. The cutoff point for the filter 356 is preferably designed for the nineteenth harmonic, thus improving vastly over conventional pulse width modulation methods. For example, for an enhanced 35 kW inverter design, the power savings from switching alone ranges from about 650 Watts to 1 kW of power.

For example, the following equation provides the third harmonics of a seven pulse modified PWM waveform, as shown:

$$H03 = (\cos(p1s*3*pi/180) - \cos(p1e*3*pi/180) + \cos(p2s*3*pi/180) - \cos(p2e*3*pi/180) + \cos(p3s*3*pi/180) - \cos(p3e*3*pi/180) + \cos(p4s*3*pi/180) - \cos(p4e*3*pi/180) + \cos(p5s*3*pi/180) - \cos(p5e*3*pi/180) + \cos(p6s*3*pi/180) - \cos(p6e*3*pi/180) + \cos(p7s*3*pi/180) - \cos(p7e*3*pi/180) + 0)/(a01*3);$$

where "a01" is the power of the fundamental waveform, p stands for pulse, the number next to p indicates the number of the pulse, s stands for the start of the pulse, and e stands for the end of the pulse, e.g. p1s indicates the start of the first pulse, and p1e indicates the end of the first pulse. Also, the first three pulses and the ending fifth pulse are linked to the others, to eliminate the third harmonics.

Figure 26:
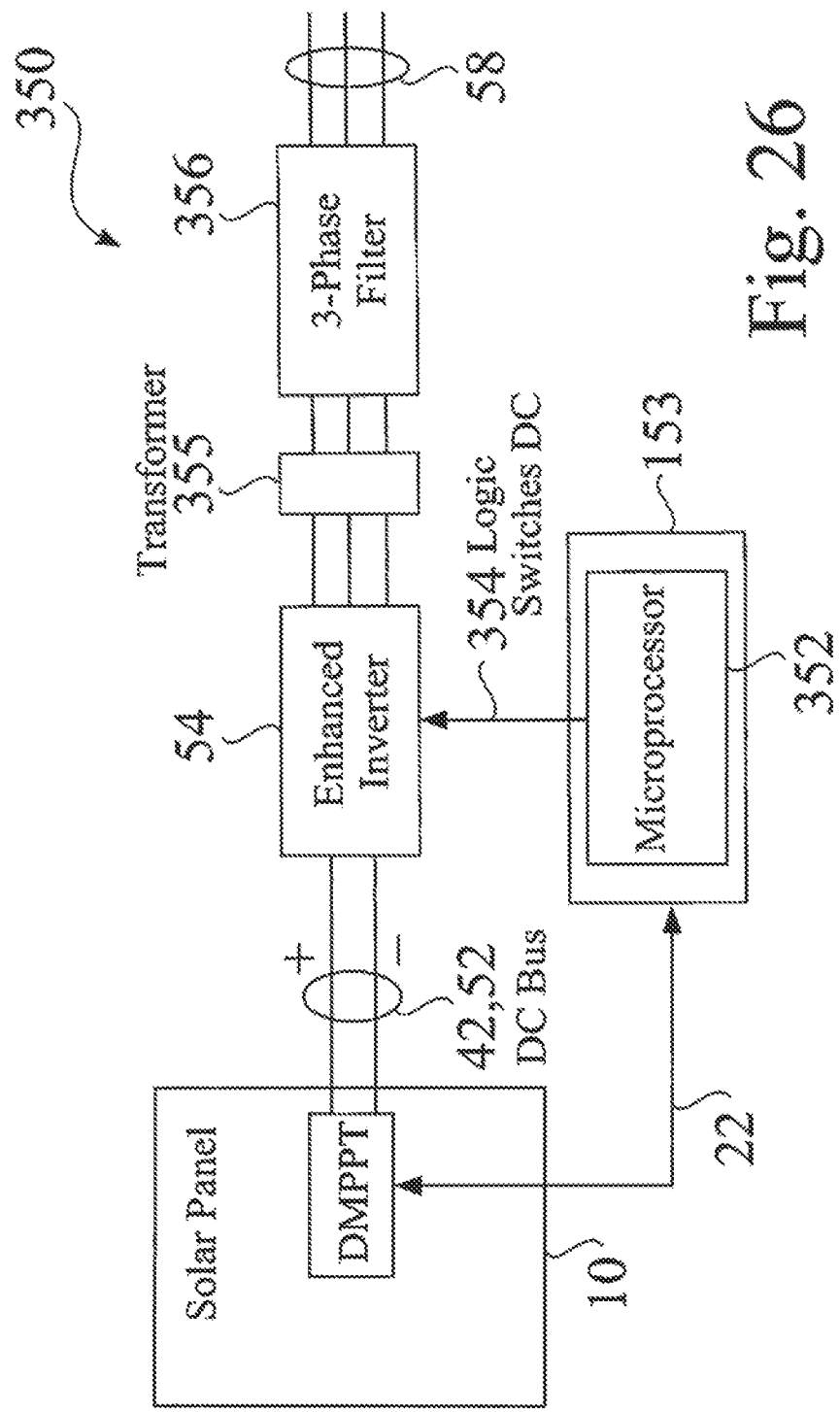
FIG. 26 is a schematic block diagram showing microprocessor-based enhancement of an inverter, such as to eliminate one or more levels of harmonics.

A microprocessor 352 (FIG. 26), such as located at a server 153 embedded within the inverter housing 50, generates a calculated smart switching pulse train signal 200, such as shown above. The calculated smart switching pulse train signal 200 is then passed 366 (FIG. 27) to the driver cards or boards 188, such as through fiber optic links 190 or via copper wire 190. The driver boards 188 then convert these digital pulses 202 (FIG. 19), e.g. 202a-202g, into power driving signals for the IGBTs 192. The IGBTs 192 controllably follow the turn-on pulses 204 and turn-off pulses 206 of the original smart switching pulse train signal 200, thus switching the high DC Bus voltage. This switching power is then transformed to the AC grid voltage 58 by a transformer 355 (FIG. 26) and a relatively small filter 356 (FIG. 26). The resultant output sine wave is very low in distortion. The use of smart switching 200 inputs to the enhanced inverters 54 therefore reduces power loss, reduces harmonics, reduces filter requirements, and reduces cost.

Controller and Power Supply.

Figure 20:
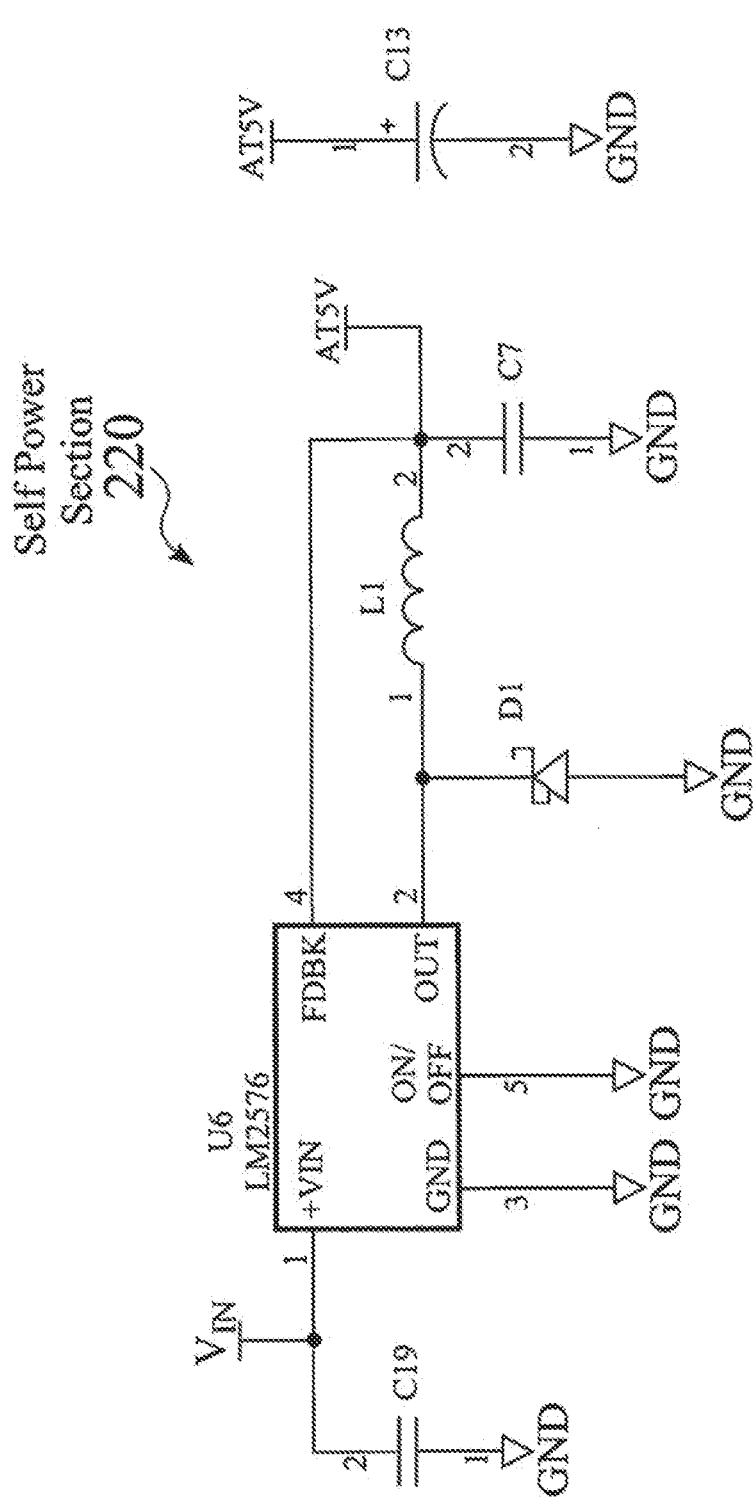
FIG. 20 is a schematic circuit diagram of an exemplary self-power section of a DMPPT module.

As described above, each of the DMPPT modules 18 are typically powered from their respective solar panels 10, such as to reduce the wiring requirements and improve the overall efficiency of the system 40. FIG. 20 is a schematic circuit diagram of an exemplary self-power section 220 of a DMPPT module 18, which generates local control voltage for the DMPPT module 18 from the solar panel 10.

In some embodiments, when the solar panel 10 begins generating about 4.5 to 6.5 volts DC, there is enough power to start the DMPPT module 18. One of the benefits realized by this configuration is that the system 40 as a whole can wake up automatically, off the external AC grid 58. For a system 40 configured with externally mounted solar panels 10 that are externally mounted on the surface of the Earth E, e.g. such as but not limited to stand-alone panels 10 or building-mounted panels 10, the user USR is able to observe this wake up phenomena as the sun S rises in the morning, and as it sets in the evening, when the DMPPT modules 18 shut down for the night.

Boost Circuits for DMPPT Modules.

FIG. 21 is a schematic circuit diagram of an exemplary boost circuit 250 for a DMPPT module 10.

Voltage and Current Monitoring for Distributed Multi-Point Power Point Tracking Modules.

Figure 22:
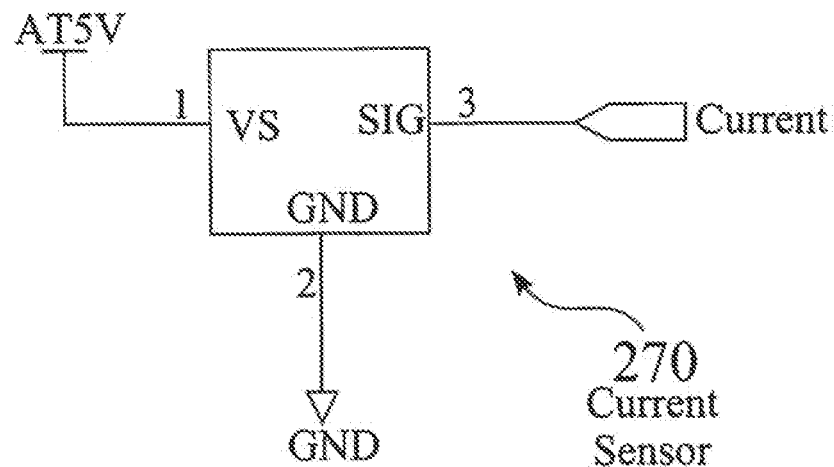
FIG. 22 is a schematic circuit diagram of an exemplary current sensor for a DMPPT module.
Figure 23:
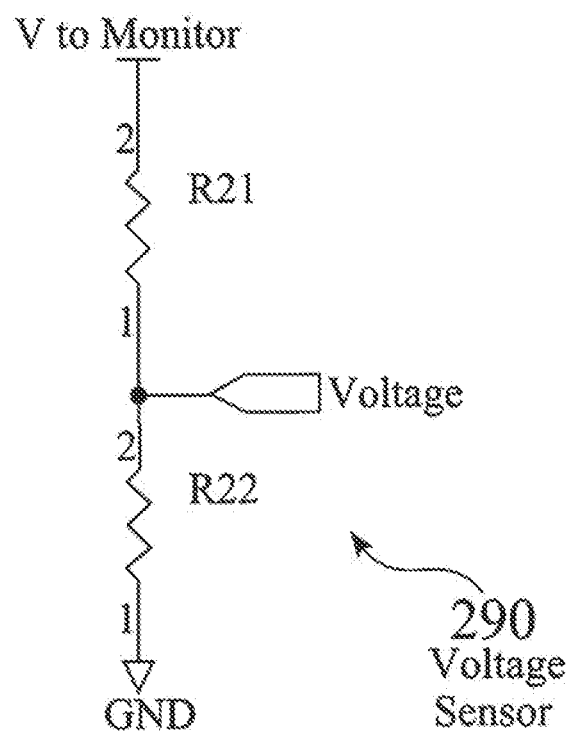
FIG. 23 is a schematic circuit diagram of an exemplary voltage sensor for a DMPPT module.

FIG. 22 is a schematic circuit diagram of an exemplary current sensor 270 for a DMPPT module 18, such as implemented by a V/I monitor 82 (FIG. 7) and associated hardware, e.g. a current loop 83 (FIG. 7). FIG. 23 is a schematic circuit diagram of an exemplary voltage sensor 290 for a DMPPT module 18. The output voltage and current are reported back to the embedded server 153 at the inverter cabinet 50, while used locally by the DMPPT controller 80 (FIG. 7) to provide stable regulated output 90 for the DC distribution bus 42,52 (FIG. 5, FIG. 6). The input voltage and current are used by the on-board controller 80, e.g. DSP, as part of the multi-level MPPT program.

The output voltage also plays into this control loop. A Hall-effect DC/AC current module and a 10M ohm voltage dividing resistor network transforms these signals to an op-amp for scaling, and are then processed by the controller 80, e.g. DSP 80. This forms the basis of a per panel monitoring system.

System Safety and Use of Crowbar Circuits.

Figure 24:
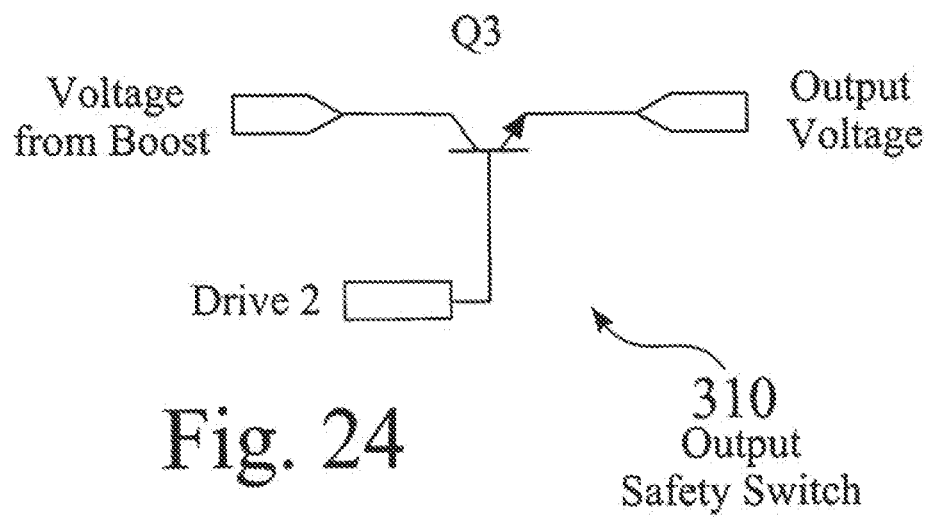
FIG. 24 is a schematic circuit diagram of an exemplary output safety switch for a DMPPT module.
Figure 25:
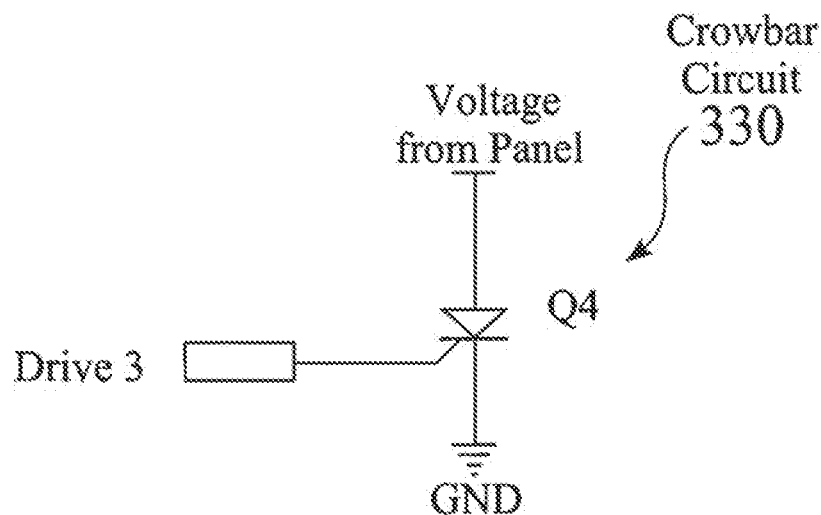
FIG. 25 is a schematic circuit diagram of an exemplary crowbar circuit for a DMPPT module.

FIG. 24 is a schematic circuit diagram of an exemplary output safety switch 310 for a DMPPT module 18. FIG. 25 is a schematic circuit diagram of an exemplary crowbar circuit 330 for a DMPPT module 18. The enhanced solar panel 10, such as seen in FIG. 1, preferably provides survivability from an output short circuit. As seen in FIG. 7, an input crowbar circuit 96, triggered by the microprocessor 80, is placed across the incoming power leads from the panel 10. In case of a fire, or any other maintenance procedure that requires the system to be de-energized, the input crowbar circuit 96 is triggered, thereby shorting out the solar panel 18. An output crowbar circuit 98 may also preferably be provided, such as to charge down capacitors when the unit is shut down.

The crowbar circuits 96,98 may be activated for a wide variety of reasons, such as for emergencies, installation, or maintenance. For example, during installation of the enhanced panels 10, the associated DMMPT modules 18 prevent high voltage from being transmitted to the output terminals 19a,19b (FIG. 1), until the panel is fully installed into the system 40. As well, if maintenance functions need to be performed near or on one or more panels 10, one or more of the solar panels 10 can be turned off, such as by triggering the crowbar circuits 96,98 through the DMPPT controllers 80.

The crowbar circuits 96,98 conduct and hold the solar panel 18 in a short-circuit condition until the voltage or current falls below the device's threshold level. To re-activate the solar panel 10, the current is typically required to be interrupted. This can typically be done either by manually breaking the circuit, or by waiting until the sunlight fades in late evening. This means that the system automatically resets its DMPPTs 18 during a period of darkness, e.g. the night.

Currently, one of the most cost effective crowbar circuits comprises a silicon controlled rectifier (SCR) 330. This allows the crowbars 96,98 to continue to function, even though the main circuits control power has been shorted. This removes the danger of high voltage DC power from the personnel, e.g. on a roof of a building where solar panels 10 are installed. The DMPPT system 18 automatically resets itself during the night, thus allowing for the completion of the work. If it is necessary for another day, the system 40 can operate in one of two modes. In a first mode, such as when communications 22 are present with the host 50, the host 50 can instruct the DMPPT devices 18 to shut down, thus allowing another period of safe work, e.g. on the roof. In a second mode, such as when there are no communications 22 with the host 50, the DMPPT module 18 may preferably fire, i.e. activate, the crowbar device(s) 96,98. To prevent unnecessary shutdowns, this non-communication method may preferably only occur if a status bit has been saved, e.g. in EEPROM memory at the module 18, indicating a fire or maintenance shutdown.

The current crowbar circuit 330 implemented for the DMPPT Module 18 is an SCR with its associated firing circuitry. The main control software, e.g. within the system server 153, preferably allows for a maintenance or fire shut down of the solar array system. This operates on a panel per panel basis, thus providing a safe solar array shutdown. The host system housing 50 can display the current array DC voltage, to indicate when it is safe to enter the roof area. The host system housing 50 may preferably be tied into the fire alarm system of the building, or may be controlled by a manual safety switch located by the host system itself. This addition to the DMPPT Modules 18 therefore enhances overall system performance, and improves safety for personnel.

Enhanced Inverter Power Circuit Operation.

Figure 27:
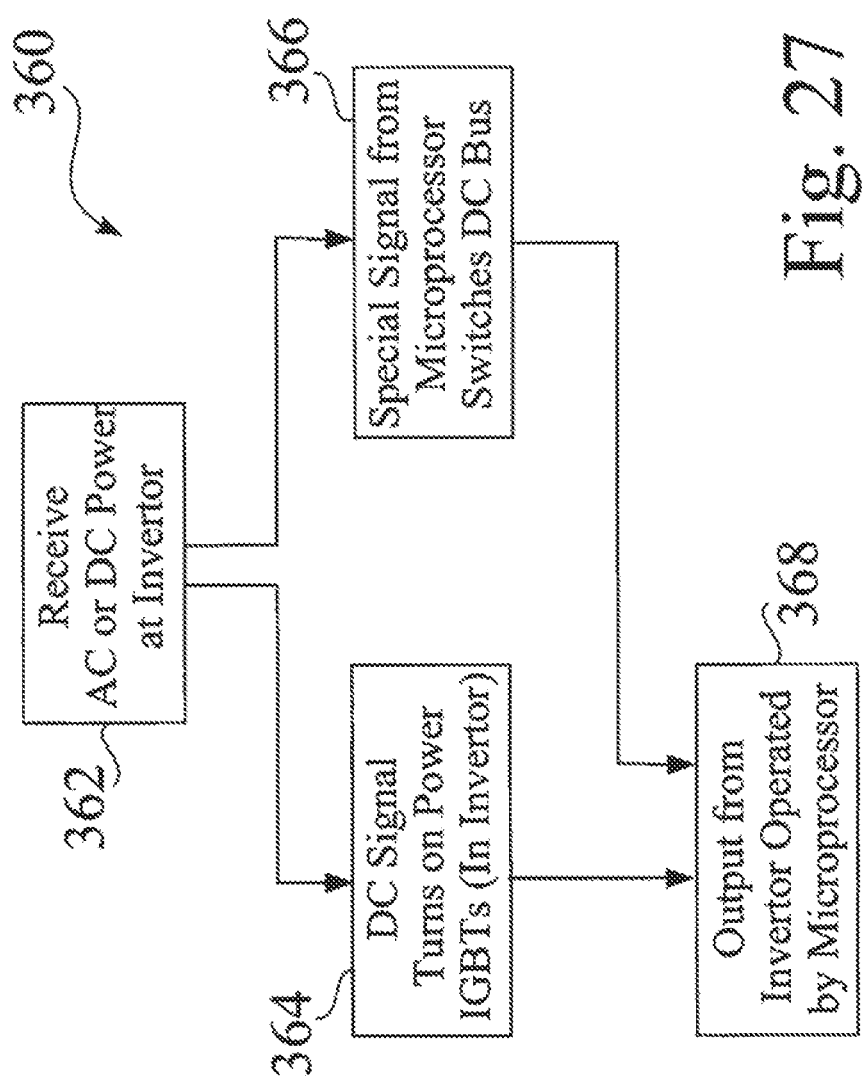
FIG. 27 is flowchart of exemplary operation of an enhanced inverter.

FIG. 26 is a schematic block diagram 350 showing microprocessor-based pulse width modulation 354 of an enhanced inverter 54, such as to eliminate one or more levels of harmonics. FIG. 27 is flowchart of an exemplary PWM harmonic reduction process 360 for an enhanced inverter 54. As seen in FIG. 26, a microprocessor 352 may preferably be used to provide a driving signal 354 to each of the enhanced inverters 54. For example, as seen in FIG. 27, for a DC signal received 362 at the enhanced inverter 54, either the DC power 42,52 from the panels 10, or the AC bus power 58, may be used to turn on 364 the power to the inverter transistors 192 (FIG. 18), which may preferably comprise insulated gate bipolar transistors (IGBTs) 192. A special signal 354 (FIG. 26), which may preferably comprise a smart switching pulse train 200 (FIG. 19), e.g. such as but not limited to switching at 1.68 KHz, is sent from the microprocessor 352 at the embedded server 153 (FIG. 14), to switch the DC bus through the driver cards 188 (FIG. 18) and provide active elimination of one or more harmonics, such as to controllably reduce or eliminate the harmonics from the DC signal, e.g. third harmonics 3, 9, 15, etc. The AC signal output 368 from the enhanced inverter 54 provides increased power over conventional inverter systems.

Since the inverter 50 is built in module blocks 54, for a larger system 40 each inverter block 54 may preferably turn on when needed to increase system efficiency. Solid-state inverters 54 presently run better once they have more than about 45 percent load. Therefore, for a 140 kW system 40, as power increases through the day, a first module 54 will turn on to provide power until there is enough power for the second module 54. The second module 54 will come on and the two modules 54, e.g. 54a and 54b will share the load (and still above the 45% point) until a third module 54 is needed. The same is true until all four modular inverters 54 are on. Later in the day, when power from the solar array 34 begins dropping off, each modular inverter 54 will drop off as necessary, until the system 40 shuts down for the night. This keeps the system 40 running at peak efficiency longer than a single large inverter, thus generating more power for the AC grid 58.

The use of smart switching of the inverters 54, as described above, delivers more power to the grid, since less solar power is converted into heat from the switching of the transistors. Furthermore, since a smaller filter is required (due to harmonic cancellation), there is more power available for pumping to the grid.

Another benefit of the modular system 40 is redundancy. For example, in a system having more than one enhanced inverter 54, if one enhanced inverter 54 fails for some reason, the entire system 40 does not come down. The system can continue to pump power out to the AC grid 58 with what capacity is left in the system 40.

Figure 28:
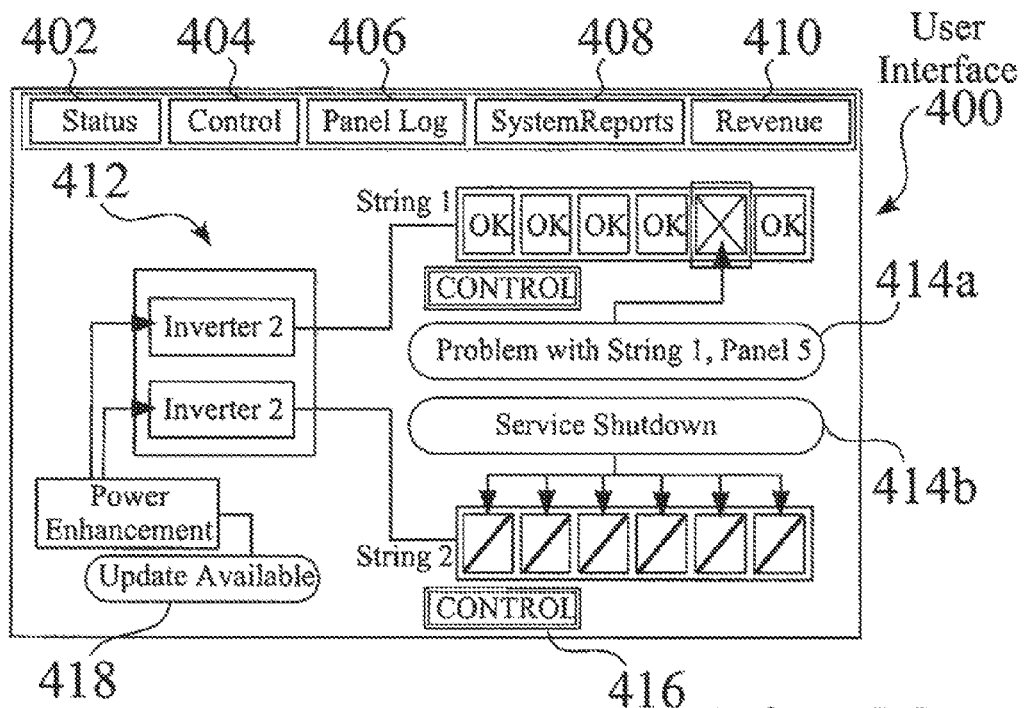
FIG. 28 is an exemplary user interface for monitoring and/or control of an enhanced power harvesting system comprising power modules having DMPPT modules.

FIG. 28 is an exemplary user interface 400, such as comprising a web page 157 (FIG. 14), for monitoring and/or control of an enhanced power harvesting system 40 comprising enhanced inverters 54, and power modules 10 having DMPPT modules 18. The exemplary user interface 400 seen in FIG. 28 may typically comprise any of system, array and/or component level status 402, control 404, logs 406 for one or more panels 10, system reports 408, and revenue tracking 410. For example, an exemplary system status screen 412 is seen in FIG. 28, such as to indicate current operating status of different strings 36 of solar panels 10.

As seen in FIG. 28, a first string 36 of panels comprises six panels 10, wherein panels 1-4 and 6 in the string are indicated 414a as being online and OK, while the fifth panel 10 in the first string is indicated 414a as being a problem and is currently taken offline. As also seen in FIG. 28, a second string 36 of panels comprises six panels 10, wherein panels 1-6 in the second string are indicated 414b as being shutdown for service, such as controlled 416 through the user interface 400.

The user interface 400 may typically be accessed through a wide variety of terminals, such as directly through an embedded server 153, locally through a connected terminal 156, or at another terminal 160, such as accessible through a network 158. In some embodiments, the system 40 may provide other means for alerts, status, and/or control, such as but not limited to network communication 155 to a wireless device 160, e.g. such as but not limited to a laptop computer, a cell phone, a pager, and/or a network enabled cellular phone or PDA.

As each of the panels 10 preferably comprises DMPPT functionality 18, wherein the DMPPTs provide monitoring at the panel level, the system 40 is readily informed, such as over the communication links 22 between the DMPPTs 18 and the inverters 54 or housing 50, of the operating status of each panel 10 in any size of array 34.

Furthermore, the DMPPTs 18 similarly provide troubleshooting and diagnostics at the panel level. For example, if there is a problem with one or more panels 10, such as not working, shut down locally by a controller 80, dirty, or shaded, the system 40 will be informed over the communication links 22 of any and all panel-level information, and can alert the user USR. All information from the panels 10 is typically logged into a database 154, where performance, history trends, and predications of future performance can be calculated. The database 154 may preferably be connectable through a network 158, such as the Internet, i.e. the World Wide Web, wherein viewing, and even control and/or maintenance, may be done through a web browser ala remote terminal 160.

As each enhanced panel 10 is connected to an associated DMPPT module 18, problems can be identified and pinpointed for both broken and sub-performing panels 10, wherein such panels 10 may readily be found and replaced, i.e. the system 40 identifies the exact panel(s) with a problem, thus significantly reducing the time required for repairs.

FIG. 29 shows an enhanced power harvesting system 40 located on the Earth E, wherein one or more panels 10 within a string 36 have different angles (0, 45, 90) or orientations (E, W, N, S). Conventional solar panels systems require solar panels having different angles of tilt to be serviced by different inverters. However, since the output of the DMPPT modules 18 at the panel level can be regulated, enhanced panels 10 having different tilt angles 422 can be fed into the same inverter, e.g. an enhanced inverter 54. The enhanced system 40 therefore allows panels to be mixed, such by varying tilt 422, from flat (0 degrees) through 90 degrees, and/or by varying directional orientation 424, by mixing East, West, South and/or North facing panels 10.

As well, since the output of the DMPPT modules 18 at the panel level can be regulated, strings 36 having different lengths of enhanced panels 10 may be fed into the same inverter, e.g. an enhanced inverter 54 or even a conventional inverter. For example, if one string 36 has an extra panel 10, or shorts a panel 10, the DMPPT modules can adjust the output of the remaining panels 10 in a string 36 to allow this "incorrect" string size to function in the system 40, without adverse affects.

Similarly, the use of DMPPT modules 40 allows different size panels or different manufacturers to co-exist in the same array 34. Therefore, instead of having to buy all of the panels from a single manufacturer to reduce mismatch problems, the DMPPT allows the use of various panels and even different wattages within the same system 40. Such versatility provides significant architectural freedom in panel placement and design, wherein solar panels equipped with an associated DMPPT module 10 allow unique layouts to accommodate different architectural features on any building or facility.

Furthermore, the use of DMPPT modules 40 addresses panel and string mismatch losses. At the present time, no two panels 10 are alike, and often are specified with a plus or minus 5 percent rating. While conventional solar panel strings 36 operate only as well as the weakest panel 10 in the string, the DMPPT modules 18 can adjust the output of the panels 10 to boost their output. Similarly, the DMPPT modules 18 for a string 34, such as controlled by the server over the communications links 22, can boost the power as needed to reduce or even eliminate string mismatch losses.

Block Diagram of Operation Software.

The software for the DMPPT modules 18 can be broken down into various sections as most are interrupt driven. When the modules 18 wake up in the morning, they each perform a routine check to ensure that everything is functioning properly. The modules 18 preferably check the status of a fire alarm flag, which is stored in EEPROM inside the microprocessor/controller 80 of the DMPPT Module. The microprocessor currently implemented for the controller 80 includes FLASH, EEPROM, and SRAM memories on the chip.

While the modules 18 watch the communications line 22 for activity, such as to see if the panel 18 needs to shutdown before power levels rise to a dangerous level. If necessary, the DMPPT Module 18 fires the crowbar circuit 96,98 to remain off line. Otherwise, it will proceed to the wait stage, until enough power is available for it to perform its functions.
Multiple Power Inputs for the Enhanced Inverter Units.

Since the inverter design has been modified so that the MPPT has been shifted to maximize harvest, the enhanced inverters, as well as the DMPPT modules may readily be adapted for different means of power generation, such as but not limited to fuel cells, wind power, Hydro, Batteries, Biomass, and Solar power. The inverters can operate at 50 Hz, 60 Hz, or 400 Hz to cover a vast range of applications. The system can also be designed for on-grid or off-grid applications.

While some embodiments of the structures and methods disclosed herein are implemented for the fabrication of solar panel system, the structures and methods may alternately be used for a wide variety of power generation and harvesting embodiments, such as for fuel cells or batteries, over a wide variety of processing and operating conditions.

As well, while some embodiments of the structures and methods disclosed herein are implemented with a server 153 within the modular inverter housing 50, other embodiments may comprise dedicated servers 55 within each of the enhanced inverters 54, which may also be in combination with a housing server 153.

Furthermore, while the exemplary DMPPT modules 18 disclosed herein are located at each of the panels, dedicated DMPPT modules can alternately be located at different points, such as ganged together locally near the panel strings 36. In present embodiments, however, the DMPPT modules 18 disclosed herein are located at each of the panels 10, such as to provide increased safety, since the crowbar circuitry 96,98 is located at the panel, and upon activation, no high voltage extends from the panels on the output connections 21.
Enhanced Coated Power Panels.

The efficiency of solar panels falls off rapidly as dirt and other impurities settles on the outer, e.g. upper, surface of the panels. The outer glass substrates 504 (FIG. 30) on the surface of solar panels 10, e.g. conventional solar panels 10 and/or solar panels having DMPPT modules 18, typically contain microscopic voids, fissures, and/or scratches 506, making them rough, wherein dust, dirt, scale, particulates, and other contaminants can readily adhere to the glass 504.

Figure 30:
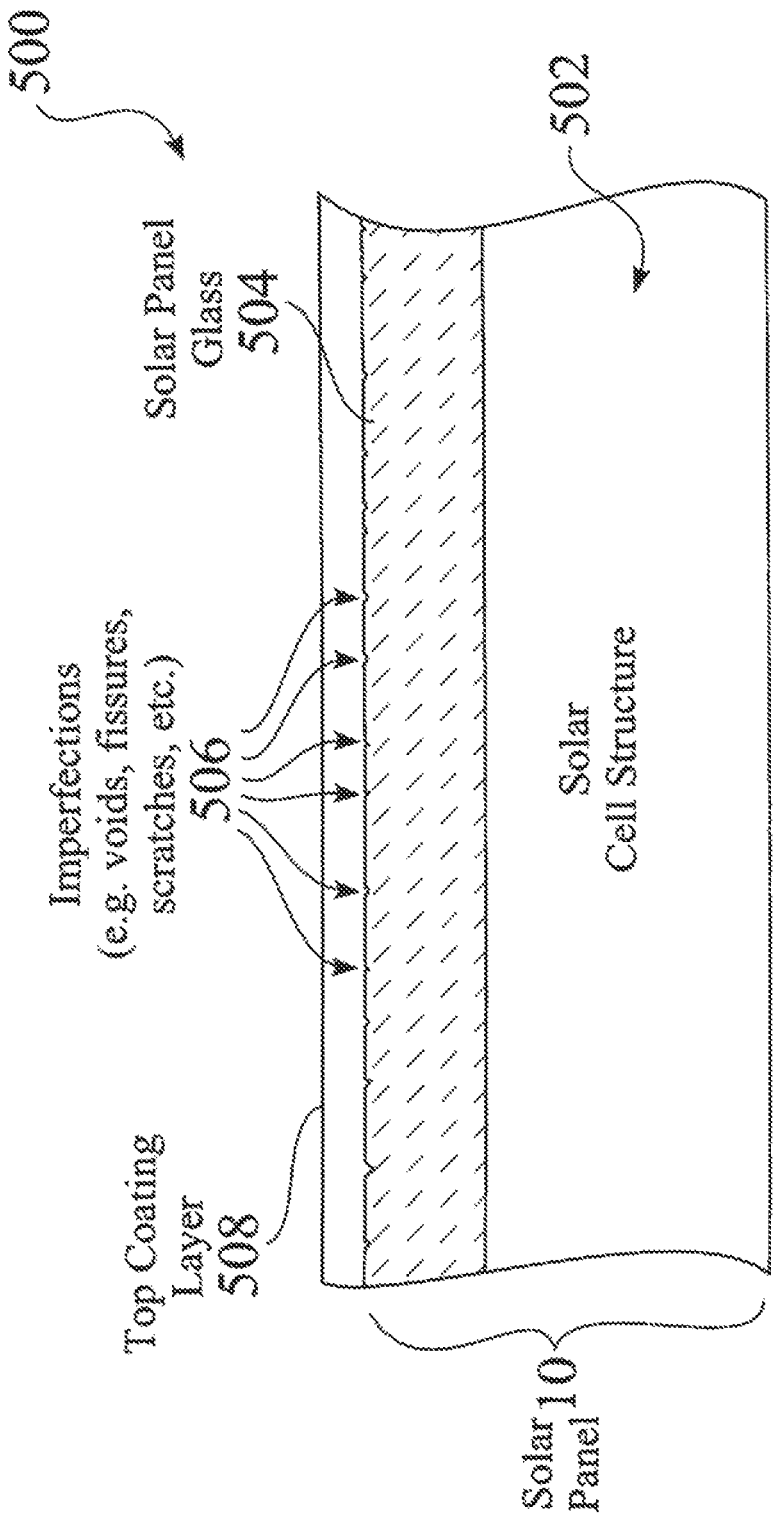
FIG. 30 is a partial cutaway view of an enhanced solar panel structure having a top coating layer.

FIG. 30 is a partial cutaway view of an enhanced solar panel structure 500 having a top coating layer 508. It is advantageous to provide such improvements to the outer optical structures 502,504 for solar panels 10, such as to provide enhanced cleaning, and/or to provide improved light adsorption. Coatings 508 can be applied to any of:
- used, i.e. existing, solar panels 10 (such as with pre-cleaning)
- new but conventional solar panels 10, e.g. in the field (such as with pre-treatment/cleaning); and/or
- new enhanced solar panels 10, with enhanced coatings 508 applied during production (before shipment).

In some embodiments, the coating materials 508 are described as nano-technology materials, as they provide enhanced cleaning and/or improved light adsorption on any of a macroscopic or microscopic level. For example, the coatings 508 may preferably fill in or reduce voids fissures, and/or scratches 506. As well, the coatings 508 may preferably prevent or reduce buildup of dust, dirt, scale, particulates, and/or other contaminants on the solar panel glass 504.

In some embodiments, the enhanced coatings may preferably comprise hydrophobic coatings 508, e.g. comprising silicon oxide, and/or hydrophilic coatings 508, e.g. comprising titanium oxide.

For example a thin layer, e.g. such as but not limited to about 5,000 Angstroms thick, of a hydrophobic coating 508, provides a surface to which dust and dirt has difficulty adhering. One such hydrophobic coating 508 currently used comprises a Teflon™ based coating 508, wherein incoming water, such as delivered 622,624, or by other means, e.g. rain, condensation, or fog, beads up on the glass 504, such as by reducing the surface contact between the liquid and the glass 504, and allowing the water to roll off, thereby accelerating the cleaning process.

The use of hydrophilic coatings 508, coupled with sunlight and moisture, may preferably react with deposits that land on the glass 504, such as to break down organic material to a point where it blows away in the wind, or washes off with water.

In some exemplary embodiments, the enhanced coatings may preferably comprise hydrophobic coatings 508, e.g. comprising silicon oxide, and/or hydrophilic coatings 508, e.g. comprising titanium oxide.

Other exemplary embodiments of the enhanced coatings 508 comprise both hydrophilic and hydrophobic components, such as to provide a coating material that provides any of reaction with and/or repelling incident water and/or contaminants.

Further exemplary embodiments of the enhanced coatings 508 may preferably comprise a component, e.g. an interference coating 508, that reduces the reflectivity of the glass 504, such as to allow more light to penetrate the glass and strike the solar cell structure 502, to produce more electricity.

Solar panels 10, e.g. such as conventional solar panels or solar panels which include DMPPT modules 18, may therefore be enhanced by any of a wide variety of coatings 508, such as to repel water, absorb light, and/or break down organic material. Such enhanced coatings 508 may preferably be used for any of reducing dirt buildup on solar panel glass layers 504, reducing cleaning time, and/or increasing the level of cleanliness achievable through cleaning procedures.
Rack Mounting Angles for Solar Panel Arrays having Fluid Delivery Systems.

Figure 31:
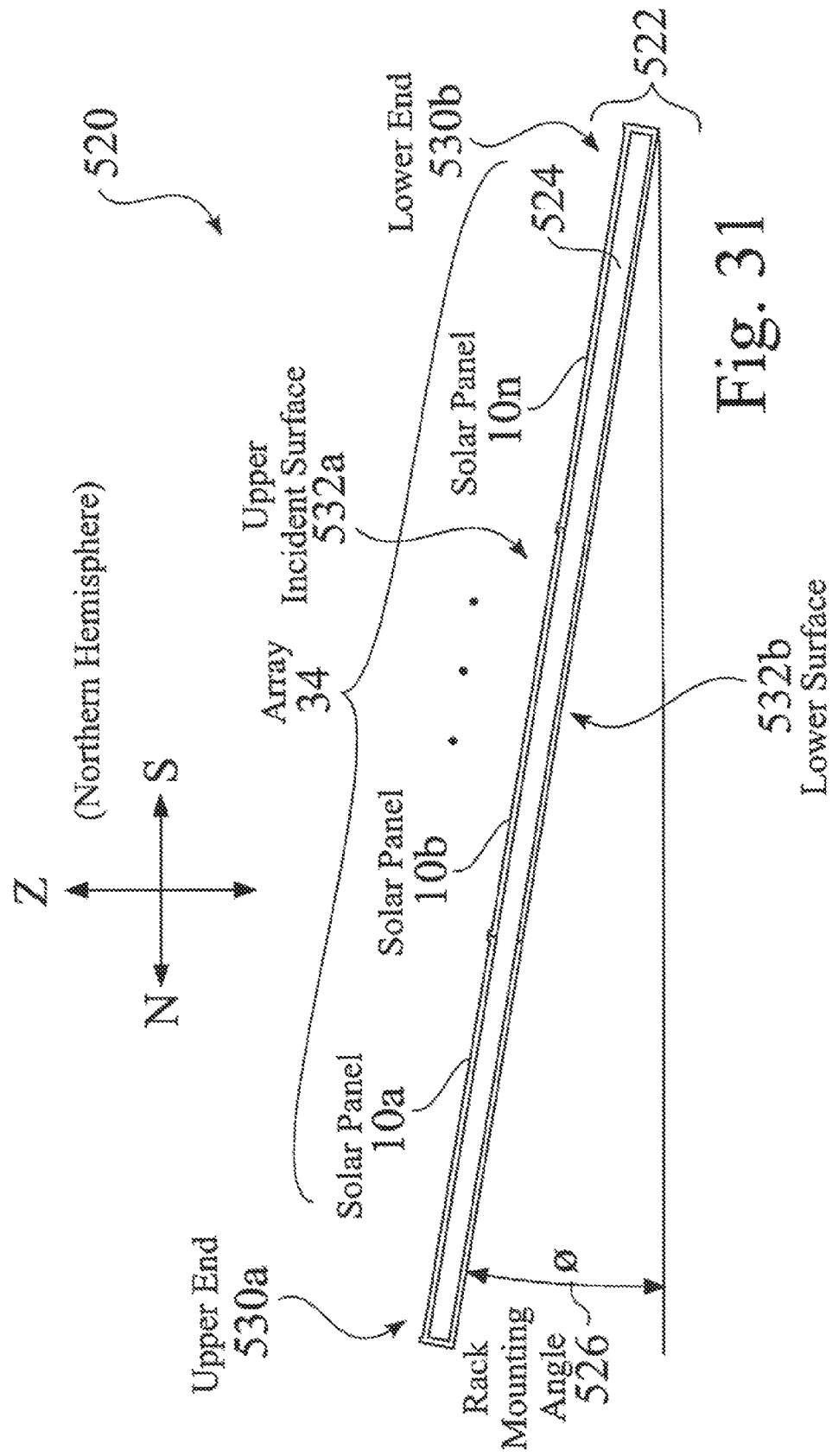
FIG. 31 is a simplified schematic view of an array of enhanced solar panels having a rack mounting angle.
Figure 32:
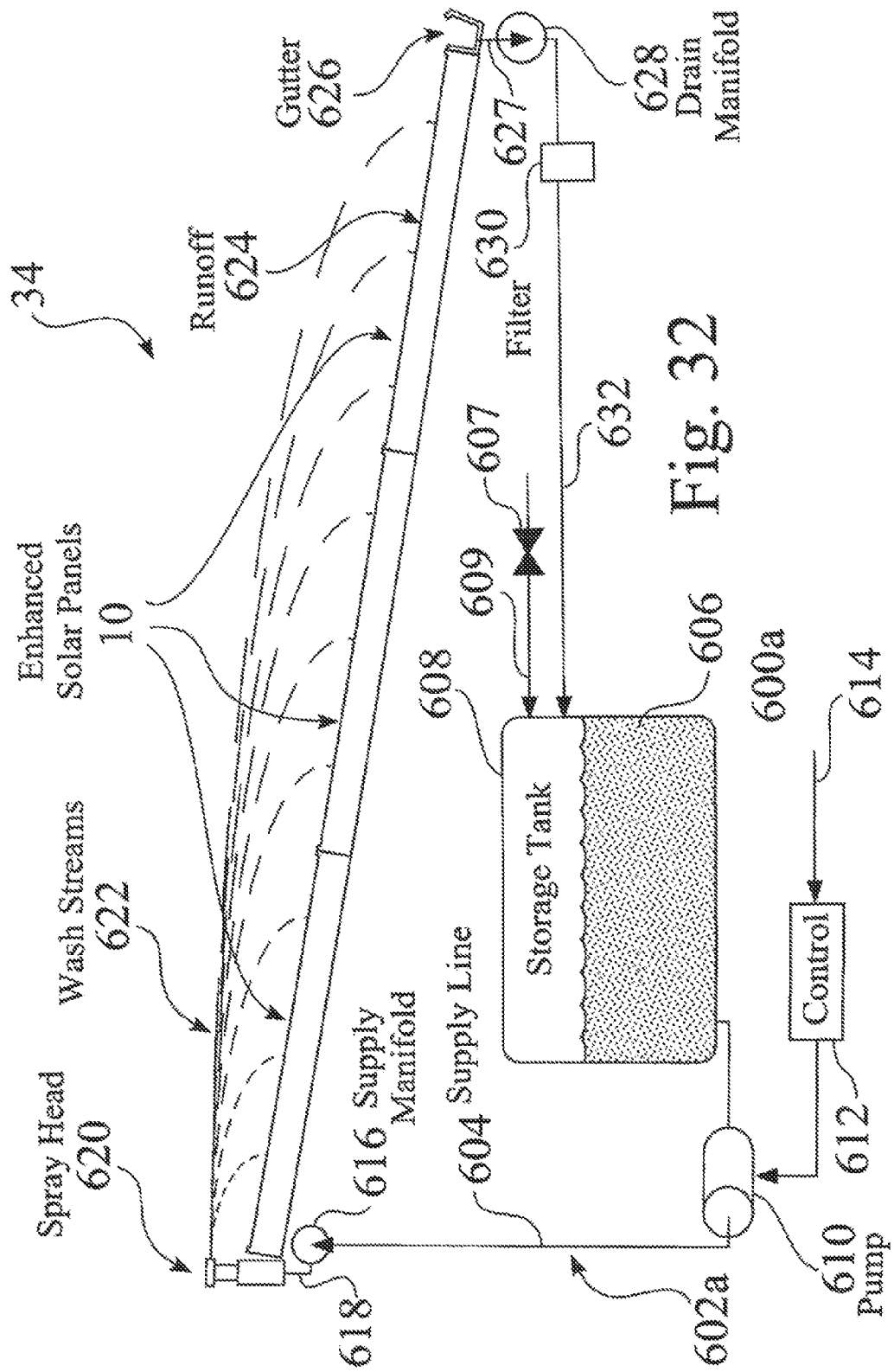
FIG. 32 is a simplified schematic view of a first exemplary embodiment of a fluid delivery system for array of enhanced solar panels.

FIG. 31 is a simplified schematic view 520 of an array 34 of solar panels 10, e.g. enhanced solar panels 10a-10n, such as assembled with one or more frame members 524, having a rack mounting angle ø 525. FIG. 32 is a simplified schematic view of a first exemplary embodiment of a fluid delivery system 600a for an array 34 of solar panels 10, wherein the array 34 comprises one or more strings 36, e.g. 36a-36n of solar panels 10.

Fluid delivery systems 600, e.g. 600a, may preferably provide any of cleaning and/or cooling for one or more solar panels 10, such as by spraying 622 or otherwise distributing 624 water, which may further comprise a cleaner, over the incident surfaces 504 of an array 34 of one or more panels 10.

As seen in FIG. 31, the exemplary panels have a rack mounting angle 526. Conventional solar panel arrays have commonly been mounted with a rack angle 526 greater than zero degrees, such as to provide an increase in power harvest. For example, many solar panel arrays located in the Northern hemisphere have a rack mounting angle of about 8-10 degrees.

A conventional array of solar panels that are installed flat on a flat roof can theoretically provide 100 percent coverage across the roof, while a conventional array of solar panels that are installed with an eight degree slope on such a roof provides about 90 percent coverage, because of the aisle typically required between racking systems, such as to avoid shading between racks.

Panel arrays that have substantially higher rack angles, e.g. 20 degrees, have a higher front to back height ratio, which typically requires a larger distance between the racking structural rows, thereby resulting in less room for panels, such as for a horizontal roof installation. e.g. about 70 percent coverage for a flat roof system.

In an enhanced power generation system 40 that includes a fluid delivery system 600, such as for cleaning and/or cooling, the rack angle 526 may preferably be chosen for fluid movement 624, e.g. water run off, as well as for power harvest.

For example, one current embodiment of an enhanced power generation system 40 that includes a fluid delivery system 600, installed in Menlo Park, Calif., has a rack mounting angle 526 of about 8 degrees toward the South, which serves to increase power harvest and also allows testing of a fluid delivery system 600.

The specific rack angle 526 for a solar panel installation may preferably be chosen to facilitate self-cleaning during rainfall, automated, i.e. robotic, cleaning 764 (FIG. 39), and/or automated cooling 744 (FIG. 38), such as to reduce or avoid maintenance and/or cleaning problems associated with flat mounted panels 10.

For example, for the specific solar panels 10 used for the aforementioned installation, and as recommended for many fluid delivery systems 600, a rack angle 526 of at least 10 degrees (toward the South in the Northern hemisphere or toward the North in the Southern hemisphere) may preferably provide greater fluid movement 624, e.g. water run off 624, such as to decrease residual build up of impurities along the surface and lower edges of the solar panels 10.

As the rack mounting angle 526 is increased, such as between 15-20 degrees toward the Equator, fluid runoff 624 is increased, which can promote fluid reclamation and avoid deposition of contaminants at the lower edges of solar panels 10. The increased rack angle 526 also typically allows for a higher total year round harvest of electricity for installations that can accommodate such configurations, since in the winter, the Sun is lower on the horizon, so the additional tilt 526 of the panels 10 allows more light to be harvested. Because the higher slope results in better cleaning there is a trade off between effective cleaning and the concentration of panels on the roof.

The first exemplary embodiment of a fluid delivery system 600*a* seen in FIG. 32 comprises a mechanism 602*a* for delivering a fluid 606, e.g. water, such as for cleaning and/or cooling of one or more solar panels 10. The storage tank 608 seen in FIG. 32 may initially be filled through an inlet 609, such as through activation of a valve 607. The fluid 606 may typically comprise water, and may also comprise a cleaning agent. The water may further be treated to remove any of contaminants or hardness, and may further be chemically treated, such as with but not limited to chlorine, bromide, algaecide, etc.

The exemplary delivery mechanism 602*a* seen in FIG. 32 comprises a pump 610 that is controllable 612, such as in response to any of one or more tracked parameters, a set point, or an external signal 614. Fluid 606 is controllably pumped 610 through a supply line 604 to a supply manifold 616, which is then controllably distributed to one or more distribution heads 620, e.g. spray heads or sprinkler heads 620. The fluid 606 is typically applied as one or more wash streams or mists 622, such as to rinse the solar panels 10 for cleaning and/or cooling. The fluid 606 travels downward 624 across the solar panels 10, such as due to the rack angle 526.

The exemplary fluid delivery system 600*a* seen in FIG. 32 also comprises a mechanism for recovering the fluid 606, such as comprising a gutter 626 connected 627 to a drain manifold 628, which returns 632 toward the storage tank 608. The return line 632 may preferably further comprise a filter 630, e.g. a leaf filter, such as for but not limited to removal of leaves, dust, and/or dirt.

Figure 33:
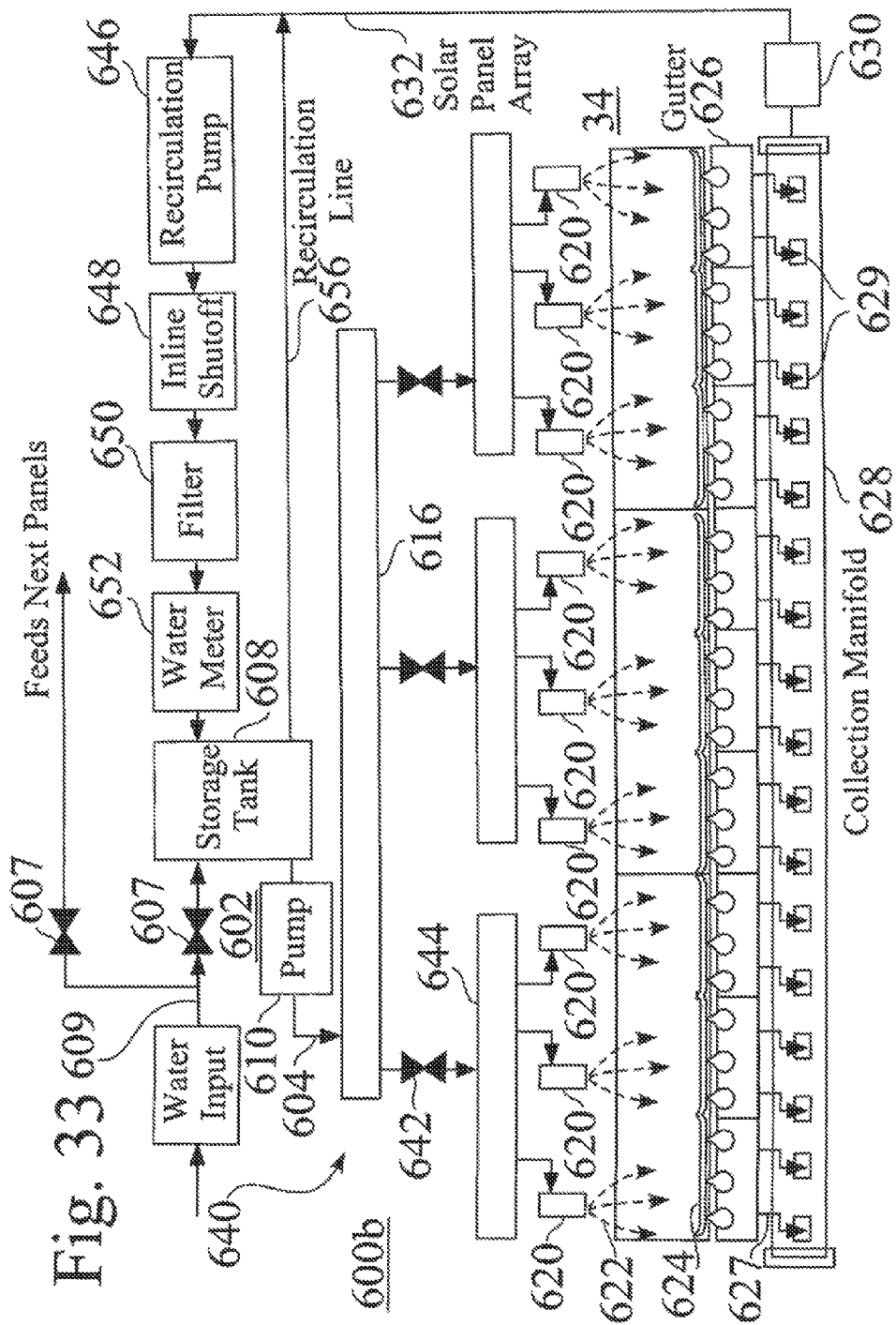
FIG. 33 is a detailed schematic diagram of a second exemplary embodiment of a fluid delivery system for array of enhanced solar panels.

FIG. 33 is a detailed schematic diagram 640 of a second exemplary embodiment of a fluid delivery system 600*b* for an array 34 of solar panels 10. As seen in FIG. 33, the water delivery mechanism 602 may further comprise one or more valves 642 and secondary manifolds 644, such as to controllably deliver fluid as needed, e.g. for cleaning and/or cooling, to one or more sections of solar panels 10, and/or to controllably isolate one or more sections of solar panels 10, such as for delivery system maintenance.

The collection gutter 626 may further comprise a protective screen to prevent leaves or objects other than the water, run off 624 from entering the system 600. The collection manifold 628 for the fluid delivery system 600*b* seen in FIG. 33 may comprise a PVC pipe 628, e.g. 4 inch diameter, having a series of defined holes 629, wherein periodically spaced drain pipes 627 extend into. The exemplary drain pipes 627 are mounted with bulkhead connections to the outer lower edge of a rain gutter 626 that is attached along the lower edge of the series of solar panels 10.

While the fluid delivery system 600*b* is described herein as using spray heads 620 as one example of cleaning and/or cooling, a wide variety of stationary or mobile systems may be used, such as stationary sprays, rotating stationary heads, or even a movable track to spray along the length, e.g. from top to bottom, moving sideways.

As also seen in FIG. 33, the return line 632 may also preferably comprise any of a recirculation pump 646, and inline shutoff 648, a filter 648, and/or a water meter 652.

In some embodiments 600, the filter 650 preferably removes or reduces levels of minerals, salts, and/or other contaminants from the fluid 606, e.g. water 606, such as depending on available water supplies. In one current embodiment of the fluid delivery system 600, the filter 650 comprises an ELYSATOR 15™ water conditioner, available through International Water Treatment of North America, such as to remove calcium and other minerals from the water 606, before the water 606 is returned to the storage tank 608.

One current embodiment of the storage tank 608 comprises a 300 gallon reservoir filled with tap water 606, which is pumped from the storage reservoir 608 to a four inch PVC water pipe 616 that runs along the length, e.g. 90 feet, of the racked array 34. Every thirty feet, a one inch pipe 644 is tapped off of the four inch pipe 616 through a solenoid operated valve 642. Each of the secondary manifolds 644 feeds three sprinkler heads 620 that wash the panels 10.

The water spray 622 from the spray heads 620 cascades 624 down the panels 10 and into the rain gutter 626, which empties into a collection manifold 628, e.g. a 4-10 inch irrigation pipe. The collected water 624 flows through the collection manifold 628 and through a primary filter, e.g. a leaf filter 630, which filters out large particles. The water is piped down 632 into the storage tank 608, and also is teed to a recirculation pump 646, e.g. a 30 watt pump 646, that feeds the secondary filter 650. The recirculation pump 646 may preferably continuously circulate the water 606 in and out of the storage tank 608, e.g. through a recirculation line 656, such as for continuous water filtration, i.e. polishing, by the secondary filter 650.

In one current embodiment of the solar power generation system having a fluid delivery system 600b as seen in FIG. 33, the distribution manifolds 644 are segmented into three 30 foot lengths, to accommodate three rows of panels 10, with a string of 11 panels in each row for a 33 panel test group. Each of the panels 10 has a monitoring box 18 attached that monitors voltage, current and temperature of the panel, and also allows the panel to be shut down in case of emergency or need of maintenance. This information is accessed from the panel through a wireless transmitting system, transmitted directly to a computer that displays all the vitals for each panel.

This 99 panel test system is divided up into three 33 panel sections, wherein each of the panels have been coated with nano-technology material 508, but were not initially washed, to start to gather dirt, which fell on these panels throughout the day and at night. When dew gathered, the dew wet the dirt, causing it to flow down the panels 10 and catching at the bottom of the panel against the aluminum edge were it sticks because there was not enough water volume in the dew to wash the dirt off the panel.

The installed system therefore provides some minimal washing of the dew itself, on its own, but the dirt gathered at the bottom because there was not sufficient water to completely flush it.

When such dirt settles across the bottom of a panel, such dirt may get thick enough to block out as much as 5 percent of the panel, which causes as much or more than a five percent decrease in power production from the entire string, because on a per panel basis, such an effected panel becomes a weak link.

For solar panel systems that are monitored on a per panel basis, i.e. not on a per cell basis, if the performance of one section of the panel 10, e.g. the lower edge, loses efficiency, e.g. such as by five percent, the efficiency of the entire panel 10 is reduced by five percent.

In the aforementioned system, all 99 panels were monitored, such as for performance testing. On the first 33 panel test section we are going to evaluate the effects of cooling the panels to generate additional electricity output. The cooling was provided by incrementally running water over the panels from early in the morning until late in the afternoon.

In some embodiments of the fluid delivery system 600, such as for installations having solar panels that are enhanced with a protective coating 508, compressed air may be used to blow loose dirt and dust from the panels 10, such as to minimize the use of water 606. As well, water may be used during the evening or at night, e.g. for periodic extra cleaning), such as to minimize evaporation during daylight hours.

Figure 34:
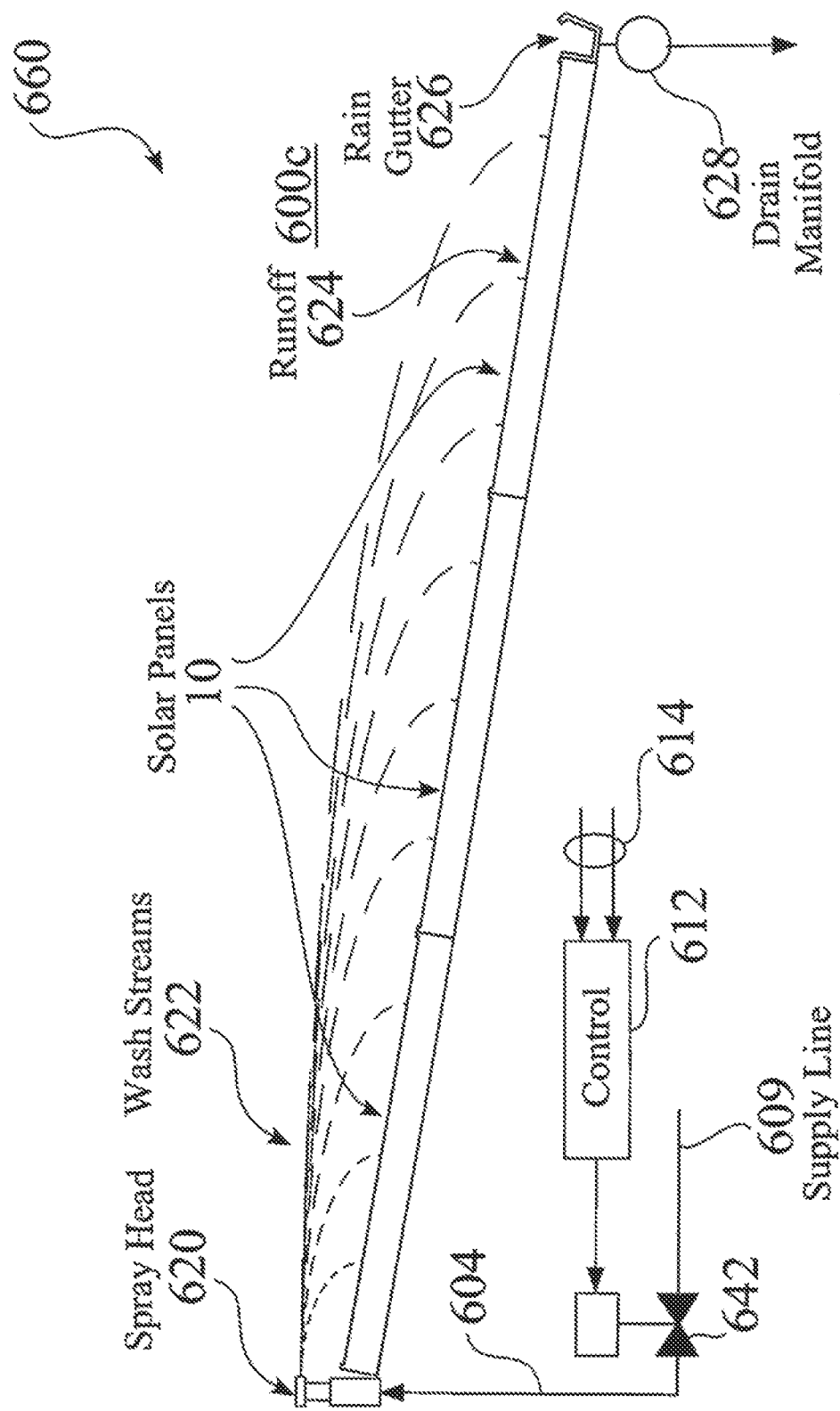
FIG. 34 is a simplified schematic view of a third exemplary embodiment of a fluid delivery system for array of enhanced solar panels.

FIG. 34 is a simplified schematic view 660 of a third exemplary embodiment of a fluid delivery system 600c for an array 34 of solar panels 10. In some system environments, such as where clean water is plentiful and cost effective, without either a need or desire for reclamation, a simplified fluid delivery system 600, e.g. 600c, may provide sufficient water for cleaning and/or cooling purposes. The fluid delivery system 600c seen in FIG. 34 comprises a fluid delivery mechanism 602, such as comprising a valve 642 that is responsive to control 612, typically in response to any of one or more tracked parameters, a set point, or an external signal 614. The fluid 606, e.g. water is sprayed 622 through spray heads 620, and runs off 624 the inclined solar panels 10 at the lower end, such as through a gutter 626 and a drain manifold 628.

The fluid delivery system 600, e.g. such as comprising a robotic watering system 600, is therefore typically installed along the top, i.e. upper end 530a (FIG. 31) of the racking system 34, and provides a slow cascade 624 of water 606 that runs down the face of the panels 10, such as at an optimized interval, or based upon a tracked parameter 614, to keep the power generation system 34 operating at maximum efficiency. Water 606 caught at the base of the racking 34 may preferably be recovered, e.g. such as through a manifold 628, filtered 650, and pumped back into the storage tank 608 for the next cleaning and/or cooling cycle.

In areas where the water contains calcium and other harsh chemicals that may be harmful to the panel, the water treatment 650 may also preferably comprise de-ionization. As well, an additional boost in electrical output may often be gained by cooling the panels 10 during the heat of the day, as the panels decrease output when exposed to higher temperatures.

Figure 35:
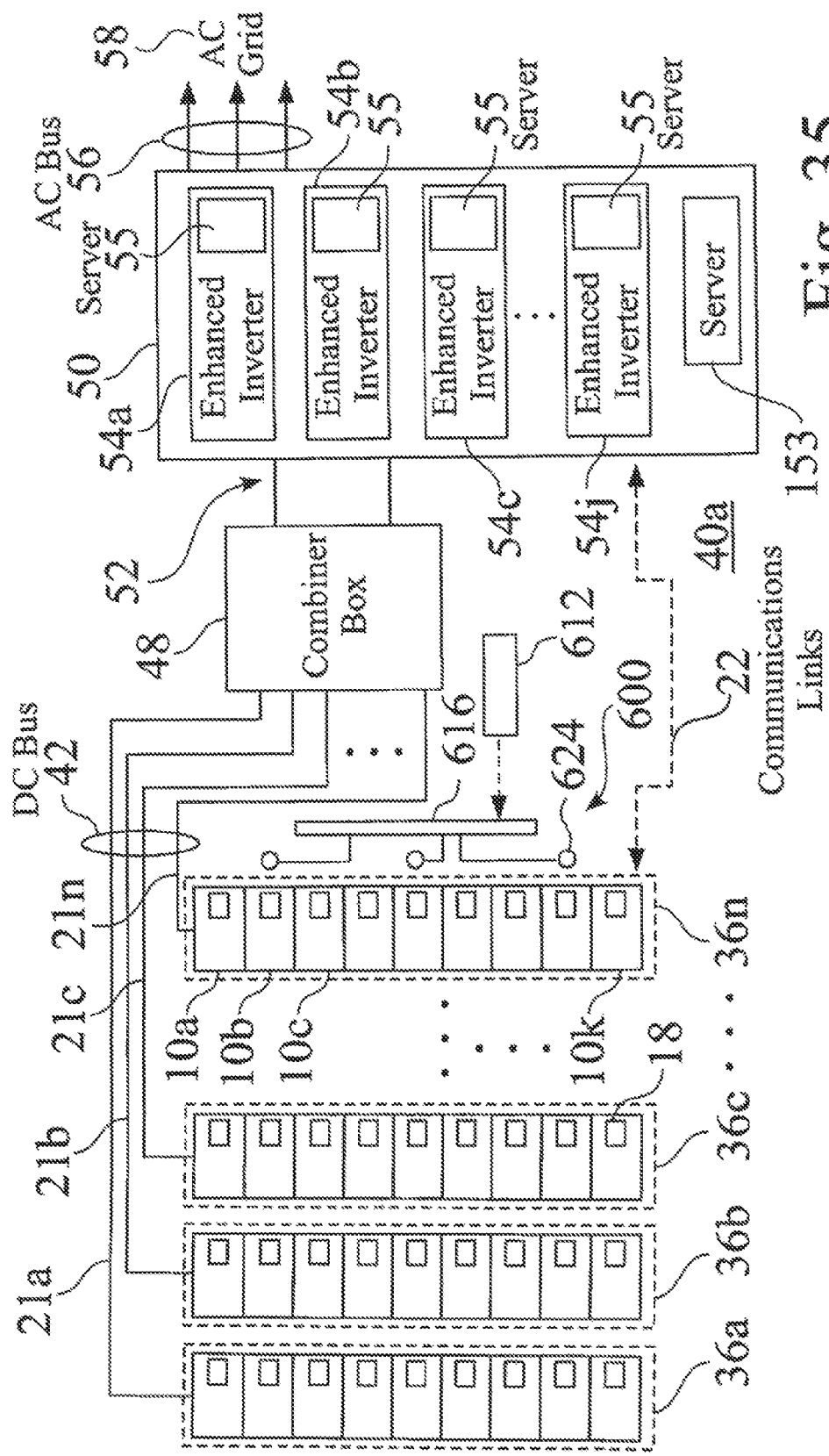
FIG. 35 is a schematic block diagram of an exemplary liquid distribution system integrated with an exemplary solar panel system having a plurality of strings of enhanced solar panels routed through a combiner box and controlled through a modular power module housing having one or more enhanced inverter modules.

FIG. 35 is a schematic block diagram of an exemplary fluid distribution system 600 integrated with an exemplary solar panel system having a plurality of strings 36, e.g. 36a-36n, of enhanced solar panels 10, such as having dedicated DMPPT modules 18, that are routed through a combiner box 48 and controlled through a modular power module housing 50 having one or more enhanced inverter modules 54. Since the distributed maximum power point tracking system, structure and process provides monitoring, control, and isolation of individual panels within a solar system, further enhancements can be made to provide enhanced system efficiency.

For example, for the enhanced power generation system shown in FIG. 35, each panel 10 preferably comprises a module 18 that can monitor any of voltage, current, and/or temperature, and also preferably comprises a mechanism by which the panels 10 may be individually shut down, such as for emergencies. The individually monitored panels 10 preferably allow the output of each panel to be tracked. In some embodiments, when the efficiency drops by as much as 5 percent, the fluid delivery system may controllably be activated 764 (FIG. 39) to clean the panels 10. The enhanced power generation system shown in FIG. 35 is fully automated, such that workers are not required to access the roof for cleaning, thereby saving labor, water and insurance costs, while ensuring full production out of each solar panel 10 year round.

Environmental Effects on Solar System Performance.

Figure 36:
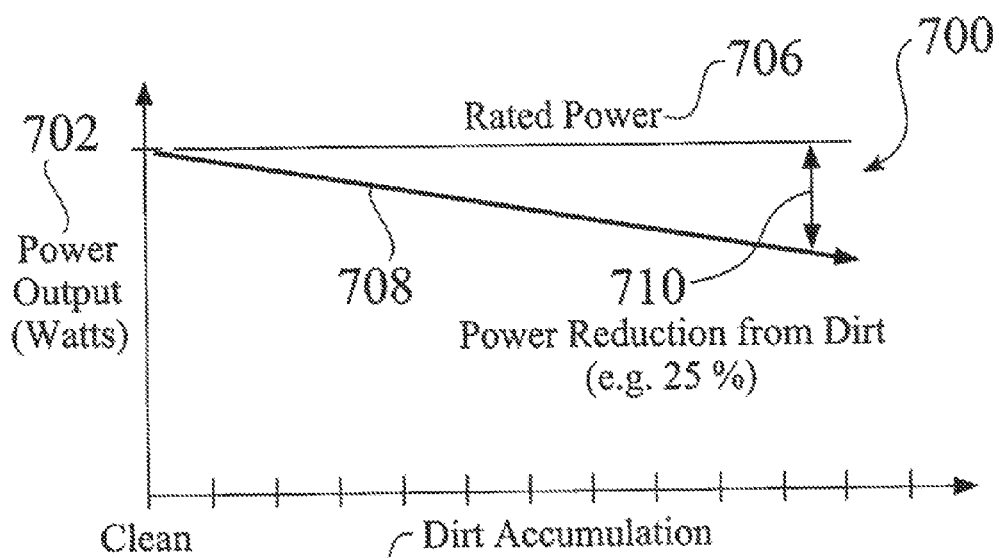
FIG. 36 is a chart that shows power reduction as a function of dirt accumulation for a solar panel structure.

FIG. 36 is a chart 700 that shows power reduction as a function of dirt accumulation 704 for a solar panel structure. Solar panels lose power therefore electrical output as a function of dirt accumulation. The standard wattage output for solar panels is tested at the factory with clean panels, such as to define a rated power 706, as tested at a controlled temperature, e.g. 25 degrees Celsius. In the field, however, as dirt accumulates on some or all of the surface of a panel 10, the actual power 708 decreases, i.e. is reduced 710, from its rated value, such as by as much or more than 5-6 percent of its rated value For example, especially for panels that are not enhanced with a coating 508 (FIG. 30), dirt and/or scale can build up along the bottom end 530b (FIG. 31) of solar panels 10, to the extent that the sunlight is reduced from reaching and being fully absorbed by the panels 10. This causes the entire panel to drop in voltage output by as much as from five to twenty five percent, depending on how severe the build-up is.

The use of a protective coating 508 on the incident surface 532a of the solar panels 10 allows the panels 10 to remain cleaner for a longer period of time, as the enhanced panels are resistant to a build up of dirt and/or scale, such that even before cleaning, the treated panels 10 have a higher electrical output than untreated panels. As well, the enhanced panels are more quickly and more thoroughly cleaned by the fluid delivery system, yielding higher power production for one or more of the solar panels 10.

Figure 37:
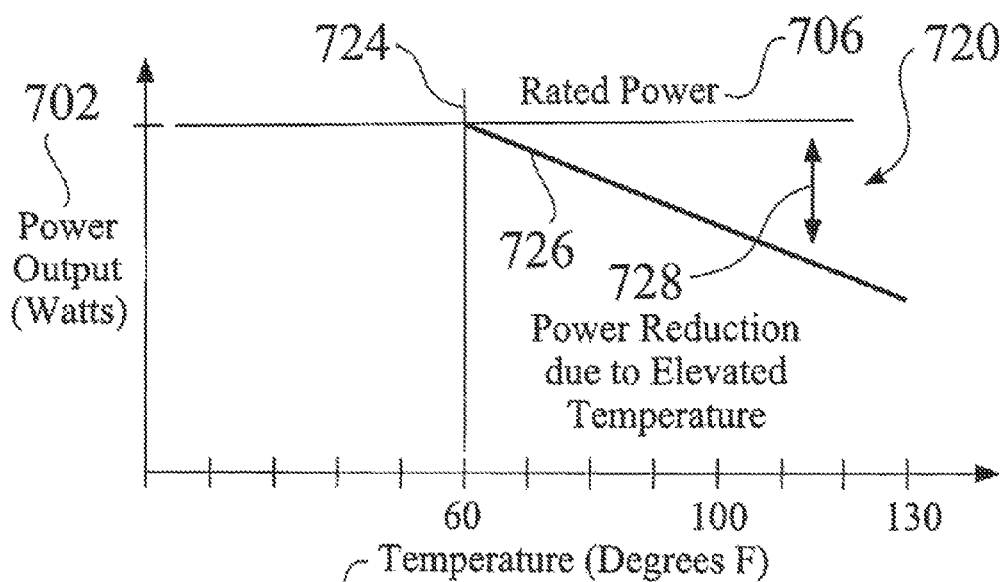
FIG. 37 is a chart that shows power output as a function of temperature for a solar panel structure.

FIG. 37 is a chart 720 that shows power output as a function of temperature 722 for a solar panel structure 10. Solar panels lose efficiency and therefore electrical output as a function of temperature. The standard wattage output for solar panels is tested at the factory at 25 degrees Celsius. For every Centigrade rise in temperature over a rated temperature, the panel's electrical output may typically decrease by ~0.5% of the rated output.

It is not uncommon, in warm weather, for the panel temperature to rise from about 25 degrees Celsius to about 83 degrees Celsius, as measured on the incident surface 532a of a solar panel 10. This 58 degree rise in temperature, based on an approximate 5 percent of rated output power, results in a total loss of approximately 58 watts on a 200 watt panel, e.g. a loss approaching 30 percent. This estimated loss is based on an absolutely clean panel 10. However, for common situations with a similar 83 degrees Celsius of heat on the panel, in addition to accumulated dirt, such an exemplary solar panel may lose an additional 25-30 watts, resulting in 110 watts of output power for a solar panel 10 that is nominally rated at 200 watts, because of the combined effects of heat and dirt. Therefore, depending on the environment, the fluid delivery system 600 may be used for any of cleaning and/or cooling of the panels 10.

Enhanced Operating Processes for Fluid Delivery Systems Integrated with Solar Panel Systems.

Figure 38:
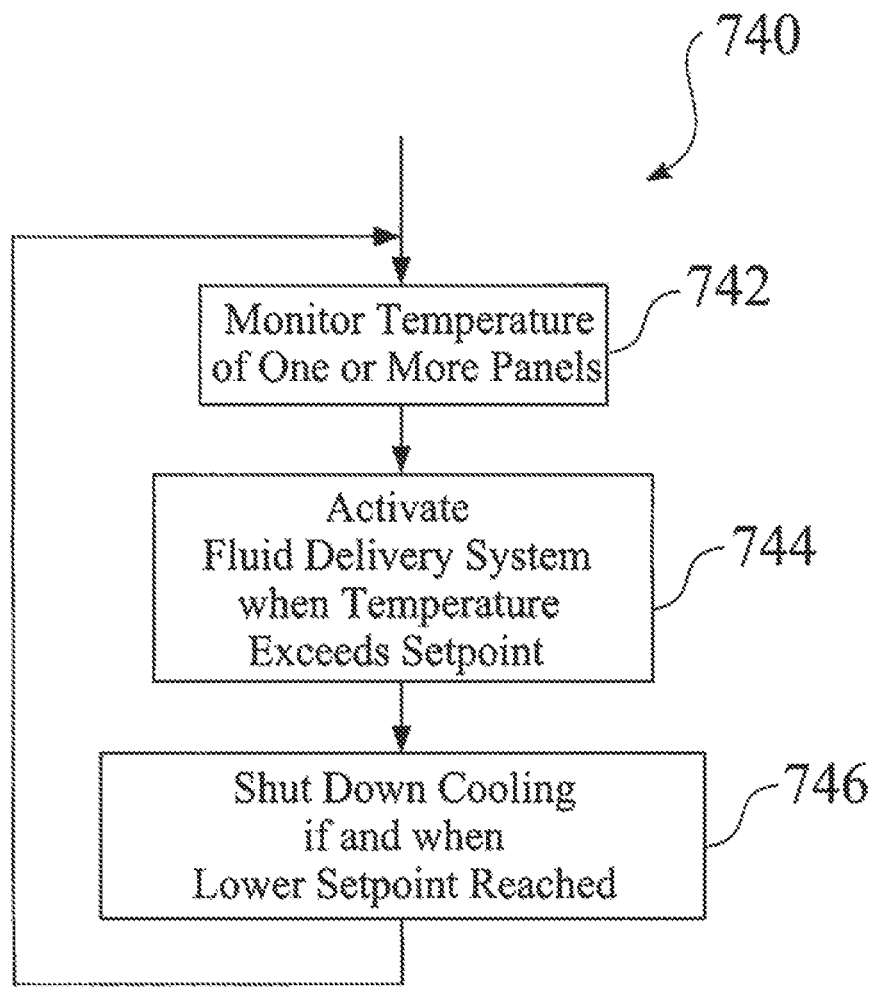
FIG. 38 shows a simplified process for activation of a solar system cooling system based upon temperature monitoring.

FIG. 38 shows a simplified process 740 for activation of a solar system cooling system based upon temperature monitoring. For example, while a solar panel system is operating, the temperature of one or more panels 10 may preferably be monitored 742. The fluid delivery system 600 may be controllably activated 744 when one or more of the tracked temperatures exceed a setpoint, e.g. 120 degrees F. The fluid delivery system 600 may operate for a set period of time upon activation 744, or may shut down 746 if and when a lower setpoint is reached, e.g. 70 degrees F., or within a certain threshold as compared to ambient temperature.

In system embodiments wherein one or more panels 10 are monitored, such as for systems including DMPPT modules 18, the temperature may preferably be monitored through the temperature sensor (e.g. thermometer, thermocouple, RTD, etc.) on each panel 10, and at the appropriate time and temperature, the system can controllably turn on the water for cooling. As an example, at a high setpoint, e.g. 90 degrees F., the control may trigger the system to turn on, and when the temperature drops to a low setpoint, e.g. 65 degrees F., the cleaning system 600 may preferably turn off.

Figure 39:
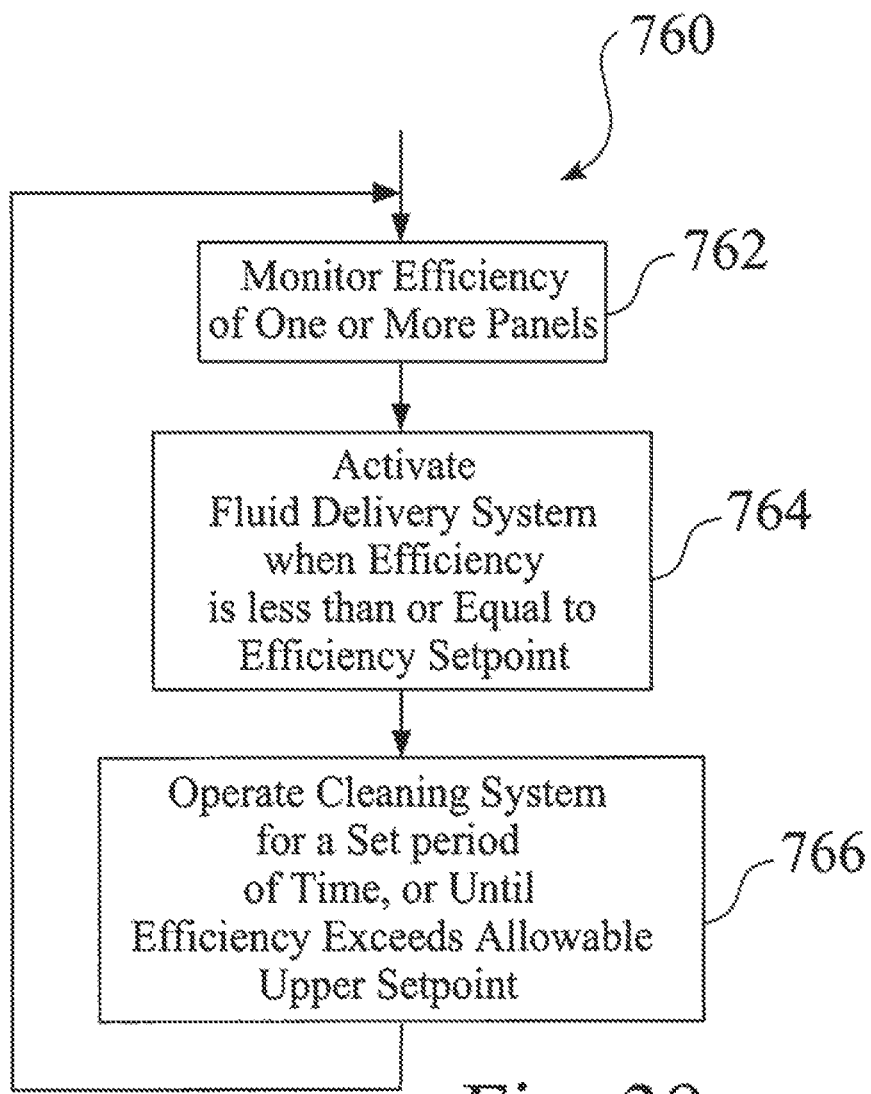
FIG. 39 shows a simplified process for activation of a solar cleaning system based upon efficiency monitoring.

FIG. 39 shows a simplified process 760 for activation of a solar cleaning system based upon efficiency monitoring. For example, while a solar panel system is operating, the efficiency of one or more panels 10 may preferably be monitored 762. The fluid delivery system 600 may be controllably activated 764 when one or more of the tracked efficiencies decreased below a setpoint, e.g. below 90 percent of rated power for a given temperature. The fluid delivery system 600 may operate for a set period of time upon activation 764, or may shut down 766 if and when a efficiency exceeds an allowable efficiency setpoint.

Solar Array Seal Structures.

Figure 40:
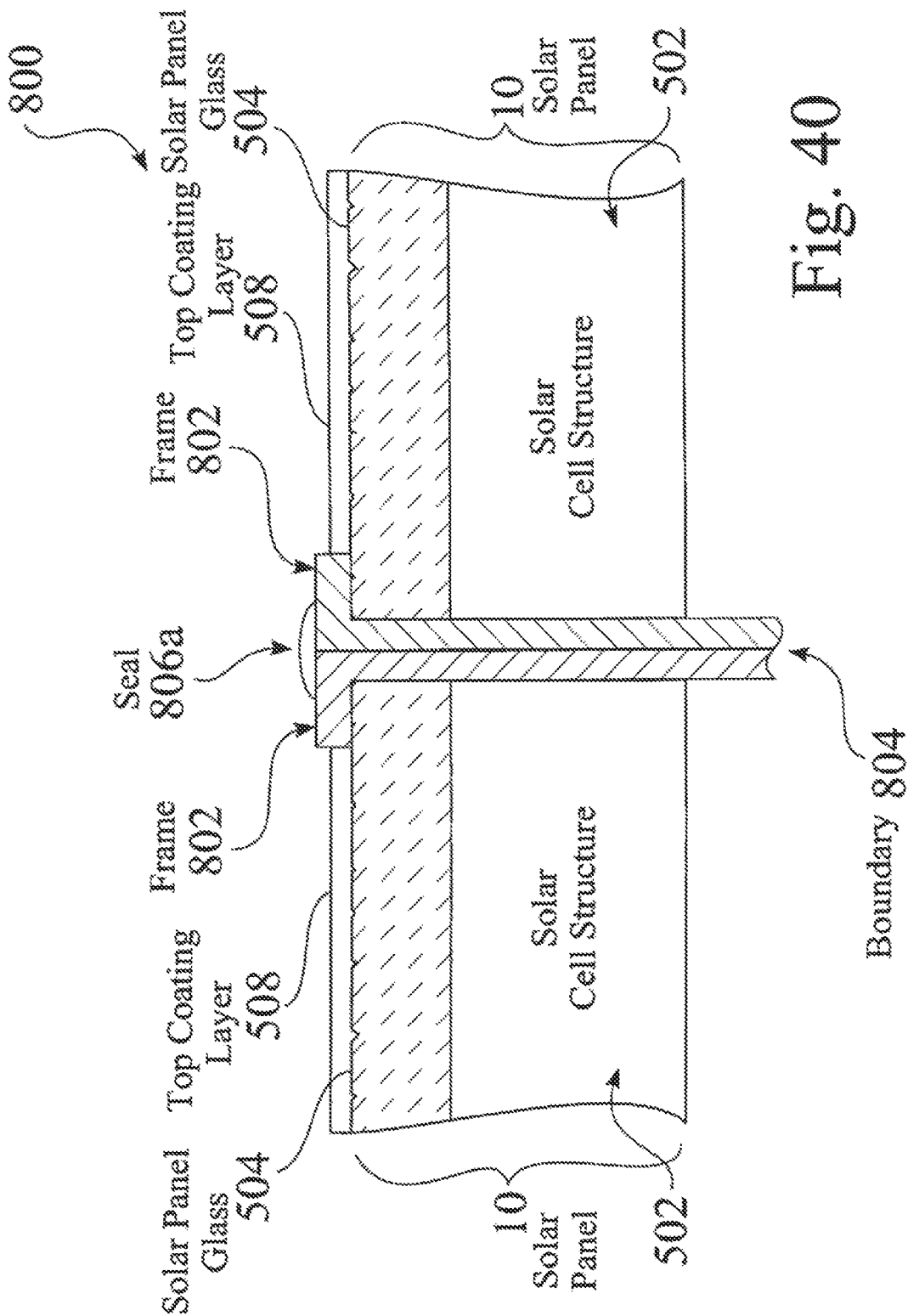
FIG. 40 is a partial cutaway view of a first exemplary seal structure between enhanced solar panels.
Figure 41:
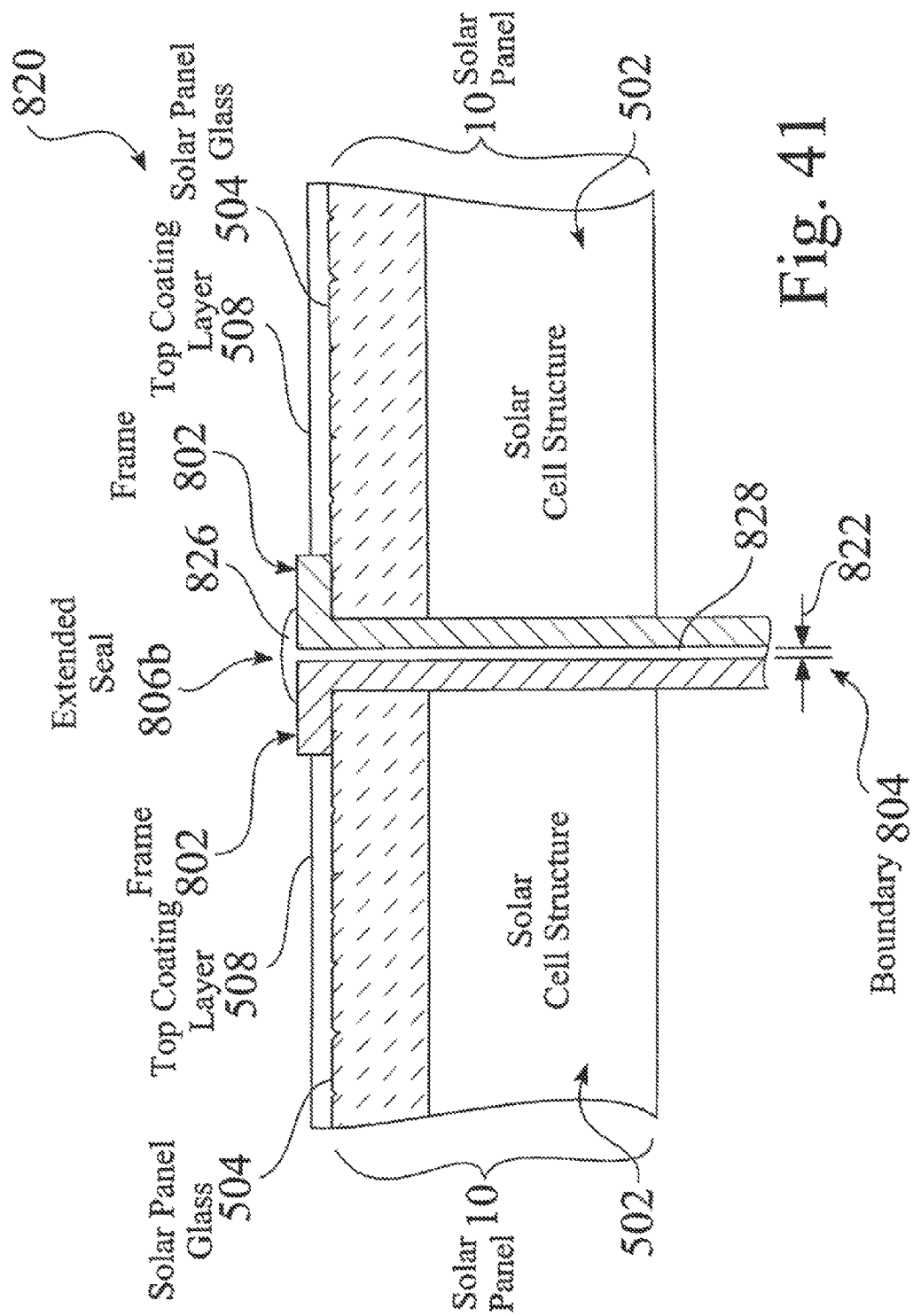
FIG. 41 is a partial cutaway view of a second exemplary seal structure between enhanced solar panels.
Figure 42:
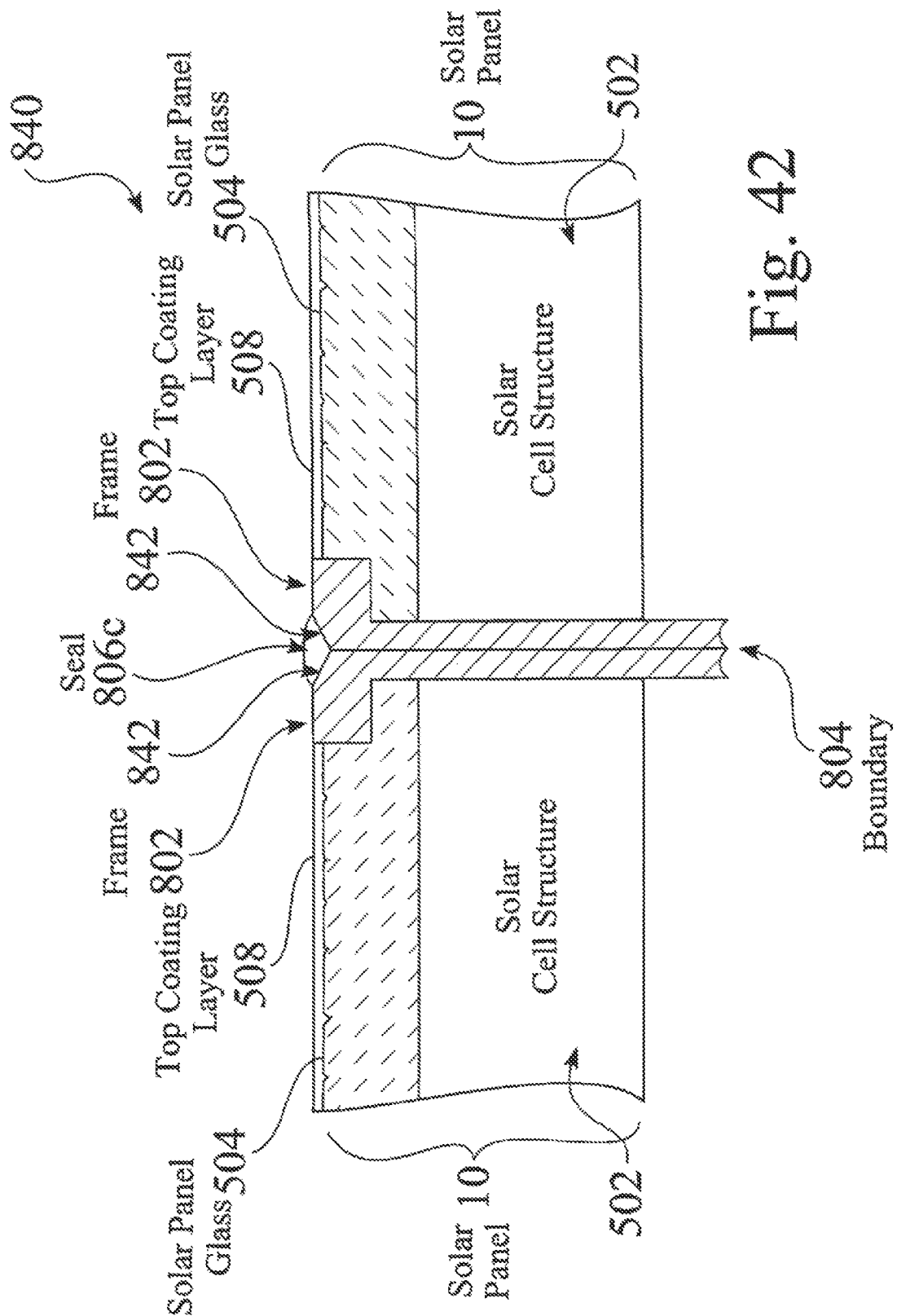
FIG. 42 is a partial cutaway view of a third exemplary seal structure between enhanced solar panels.

FIG. 40 is a partial cutaway view 800 of a first exemplary seal structure 806, e.g. 806a between enhanced solar panels 10. FIG. 41 is a partial cutaway view of a second exemplary seal structure 806b between enhanced solar panels 10. FIG. 42 is a partial cutaway view of a third exemplary seal structure 806c between enhanced solar panels 10.

As the fluid delivery system 600 is typically installed to provide water for cleaning and/or cooling, and as the water may preferably be recovered, stored and reused, arrays of solar panels 10 may preferably further comprise a sealer structure of sealant 806 at boundaries 804 between solar panels, e.g. such as between the bottom edge of one panels and the upper edge of an adjoining panel, and/or between the sides of adjoining panels 10.

The exemplary seal 806a seen in FIG. 40 may preferably comprise an applied silicone based sealant, such that water doesn't leak down and escape through the boundaries 804.

Similarly, the exemplary seal 806b seen in FIG. 41 may preferably comprise one or more structures, such as applied silicone based sealant, and/or suitable sealant strip material, e.g. having a thickness 822, to provide any of a top seal 826 and/or a lateral seal 828.

The exemplary seal 806c seen in FIG. 42 may preferably similarly comprise an applied silicone based sealant, such that water doesn't leak down and escape through the boundaries 804. As seen in FIG. 41, the enhanced solar panels 10 provide a frame 802 that is substantially flush to the combined height of the solar panel glass 504, which may also preferably have a coating layer 508, wherein the substantially flush interface may promote water runoff 624 and prevent any pooling along the bottom edge of a solar panel 10, e.g. such as to reduce build up of dirt and/or scale. The enhanced solar panels may therefore preferably include frames 802 that are flush to the glass substrate, at least for the upper and lower sides of the frame 802, such that dew, rain, and cooling and/or cleaning water can readily drain off toward the lower edge, wherein water is not accumulated upon the lower edge of each solar panel. In some embodiments, such frames are flush around the entire perimeter of the solar panel. The use of flush frames prevents any residual dirt and impurities from settling and drying along the lower edge of the panel, which could otherwise decrease the power output of the lower cells, and consequentially lower the entire output of the panel. As also seen in FIG. 41, the frames 802 may also include a recess, e.g. such as a bevel or radius 842, wherein a seal 806, e.g. 806c may be applied and still retain a substantially flush interface.

The material for the seals 806 may preferably be chosen for the expected temperature range and for other environmental conditions, e.g. exposure to Sunlight. Silicone sealant 608 is often rated for applications up to 300 degrees F.

In contrast to prior cleaning processes, as applied to conventional solar panels in the field, the enhanced cleaning system 600 provides several improvements, such as for one or more solar panels 10, in hardware configurations, and/or in system operation parameters. For example, such an individual panel monitoring system can immediately identify problem areas, such as related to dirt accumulation and/or elevated panel temperatures.

The fluid delivery system 600 and related structures and processes preferably provide several advantages for different environments, such as but not limited to:

cleaning solutions and/or protective layers for solar panel arrays;

application of cleaning solutions and/or protective layers, e.g. for any of retrofitting conventional panels on site, retrofitting new panels on site, and/or for new solar panels provided with enhanced layers;

delivery systems for use on a solar array; such as with water, treated water, and/or a cleaning solution, for any of cleaning, cooling or any combination thereof;

delivery/cleaning system spray distribution, reclamation, and/or filtering systems;

solar panel system layout or tilting for enhancement of delivery system, e.g. improved cleaning, flushing, cooling, and/or reclamation;

control parameters for a delivery system, e.g. such as linked to a DMPPT system, with time, power output, and/or temperature considerations; and/or improved solar panel frames and/or seals, e.g. such as to enhance cleaning, flushing, draining of any of a delivery system or for any resident moisture (dew, rain, etc.), such as to avoid buildup of dirt or scale, etc.

DMPPT Structure Details.

Figure 43:
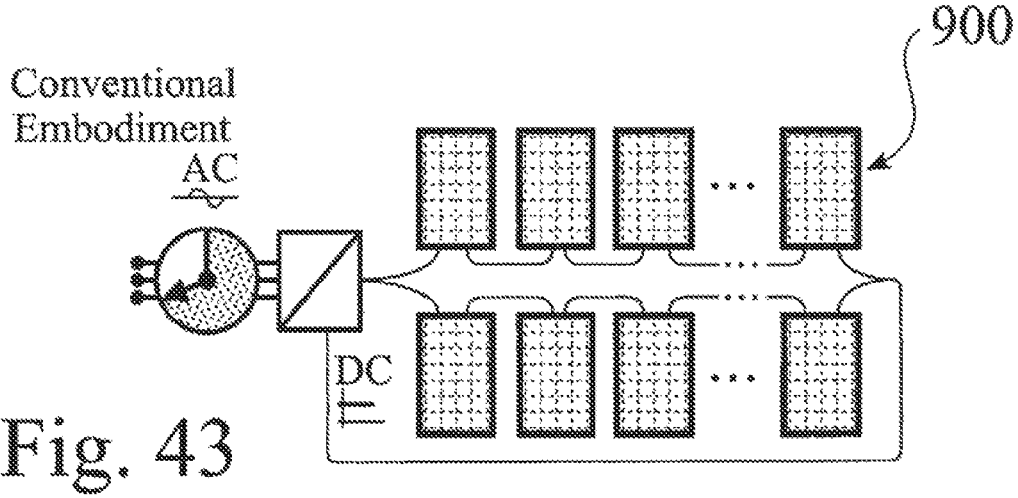
FIG. 43 is a schematic view of exemplary conventional solar panels connected in series.

FIG. 43 is a schematic block diagram 900 of a solar panel system having a plurality of conventional solar panels connected in a series form, connected to a simple (unmodified) inverter, to convert the DC voltage from the string to an AC waveform.

Figure 44:
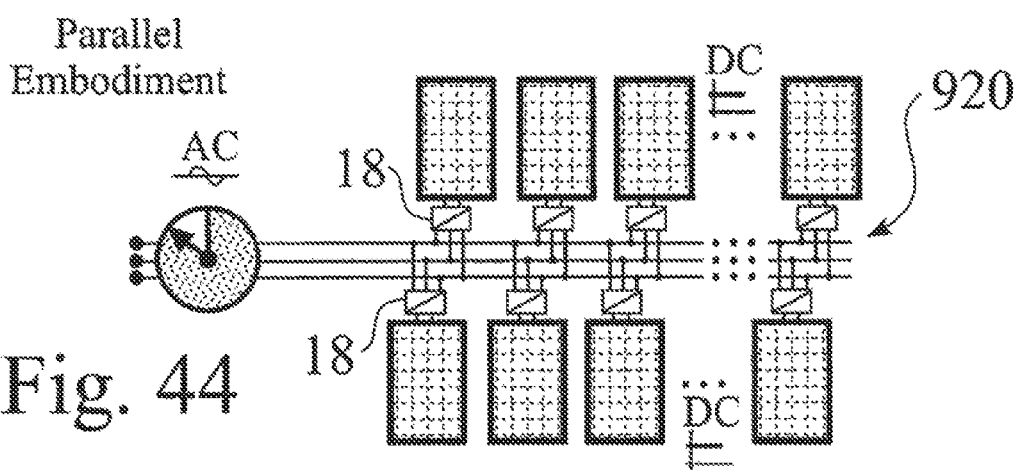
FIG. 44 is a schematic view of exemplary solar panels having DMPPT connected in parallel.

FIG. 44 is a schematic block diagram 920 of an alternate exemplary solar panel system 40 having an arrangement of enhanced solar panels connected in a parallel manner. The common bus that the panels are connected to can be in the form of a stabilized DC bus, or a stabilized AC bus of a single or three phase variety, of a chosen voltage level. The common bus may terminate at grid interconnection, a transformer, an inverter of the enhanced or unmodified form, or a battery charger or other DC power grid. The panel enhancements perform the task of optimizing the output of the solar panel and adding power to the common bus.

Figure 45:
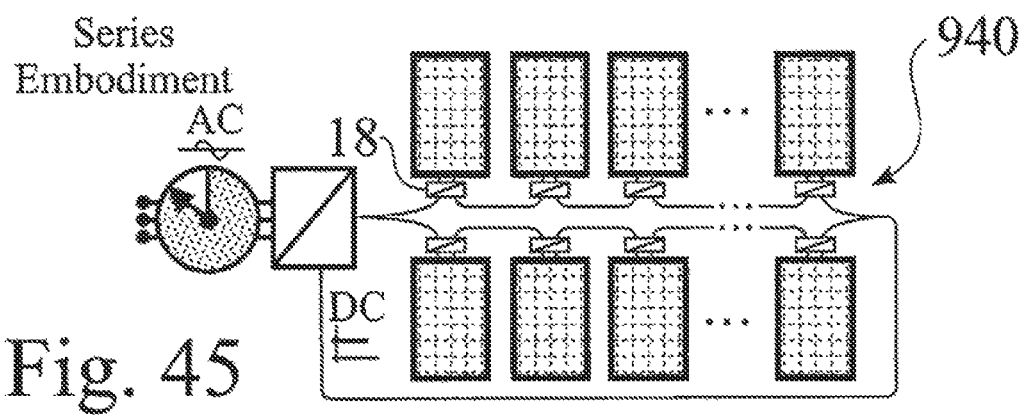
FIG. 45 is a schematic view of exemplary solar panels having DMPPT connected in series.

FIG. 45 is a schematic block diagram 940 of an exemplary solar panel system 40, e.g. 40a (FIG. 5) or 40b (FIG. 6), having a string of enhanced solar panels having DMPPT connected in series, and controlled through a modular power module housing having one or more enhanced inverter modules. The control loop algorithms that the DMPPT enhanced panels operate under to perform the optimization can take several forms, such as comprising, but not limited to any of:

stand alone operation;
string level loop closure;
combiner box level loop closure; and/or
enhanced inverter module level loop closure.

Additionally, the algorithms may preferably act to perform optimization to provide any of:

DC bus string voltage stabilization as a constant; or
Current stabilization as a constant, as may suit the conditions required for best total power output.

In an earlier installation of conventional solar panels, having a rated capacity of 400 KW, without individual monitoring provided by a distributed maximum power point tracking system, several outages resulted in significant loss in power output over extended periods of time. Monitoring of such a 400 KW system can save thousands of dollars in electricity bills as incidences of panel failure, which are conventionally only discovered by manually inspecting the panels.

In the aforementioned system, these outages were caused by, in one case, a panel being hit by a rock, in a second case by a bullet and in two cases, panels that failed, due to hot spots burning through the copper traces. As the system was initially installed without means for monitoring, there was no way of knowing how long these panels were out of commission, but they could have been down for six to eight months before detection. Not only did the system lose the performance of the afflicted panel, but also the weak-link effect brought down the performance of several of the connected strings, exacerbating the problem and loss of electricity.

The distributed maximum power point tracking system measures the voltage, current, and temperature of the panel and wirelessly transmits it to a web-based monitoring system. If any panel drops below a certain performance level, the software sends an alarm indicating a problem.

In addition, the distributed DMPPT modules 18 ensure that fire and maintenance crews remain safe when operating around solar systems, by allowing the panels 10 to be isolated using a remote system with a fail-safe.

Accordingly, although the invention has been described in detail with reference to a particular preferred embodiment, persons possessing ordinary skill in the art to which this invention pertains will appreciate that various modifications and enhancements may be made without departing from the spirit and scope of the disclosed exemplary embodiments.

The invention claimed is:

1. A process for maintaining operation of a solar panel system comprising a plurality of solar panels, comprising:

providing a delivery mechanism for distributing a liquid over an outer surface of at least a portion of the solar panels;

correspondingly tracking operating parameters comprising temperature, voltage, and power at each of the solar panels;

sending data signals to a server from each of the corresponding solar panels, wherein the data signals correspond to the tracked parameters;

the server receiving said data signals and using said tracked parameters to monitor efficiency and temperature of one or more of the solar panels;

sending a control signal from the server to the delivery mechanism when the monitored efficiency is less than or equal to an efficiency setpoint; and controllably operating the delivery mechanism in response to the control signal;

wherein the delivery mechanism is activated for cleaning of the solar panels;

independently of the step of sending a control signal from the server to the delivery mechanism when the monitored efficiency is less than or equal to an efficiency setpoint, sending a control signal from the server to the delivery mechanism when the monitored temperature exceeds a temperature setpoint;

controllably operating the delivery mechanism in response to the control signal;

wherein the delivery mechanism is activated for cooling of the solar panels.

2. The process of claim 1, wherein the liquid comprises water.

3. The process of claim 1, wherein the solar panels have an upper incident surface for receiving incoming light, and wherein any of a hydrophilic or hydrophobic layer is applied to the upper incident surface of one or more of the solar panels.

4. The process of claim 1, wherein the solar panels have an upper incident surface for receiving incoming light, and wherein one or more of the solar panels further comprise an interference layer over the upper incident surface to promote light penetration toward the incident surface.

5. The process of claim 2, wherein the liquid further comprises a cleaning solution.

* * * * *